(12) United States Patent
Allam

(10) Patent No.: US 6,436,784 B1
(45) Date of Patent: Aug. 20, 2002

(54) METHOD OF FORMING SEMICONDUCTOR STRUCTURE

(75) Inventor: Jeremy Allam, Cambridge (GB)

(73) Assignee: Hitachi Europe Limited, Maidenhead (GB)

( * ) Notice: Subject to any disclaimer, the term of this patent is extended or adjusted under 35 U.S.C. 154(b) by 0 days.

(21) Appl. No.: 09/708,071

(22) Filed: Nov. 8, 2000

Related U.S. Application Data

(63) Continuation of application No. 08/681,829, filed on Jul. 30, 1996.

(30) Foreign Application Priority Data

Aug. 3, 1995 (EP) .............................................. 95305436

(51) Int. Cl.⁷ .................. H01L 31/0328; H01L 31/107; H01L 21/18

(52) U.S. Cl. ......................... 438/380; 438/47; 257/186; 257/97

(58) Field of Search ........................... 438/47, 94, 380; 257/17, 97, 186

(56) References Cited

U.S. PATENT DOCUMENTS

| | | | |
|---|---|---|---|
| 4,799,087 A | 1/1989 | Matsuyama et al. | 357/4 |
| 5,753,933 A | 5/1998 | Morimoto | 257/22 |
| 5,856,685 A | 1/1999 | Nakayama | 257/22 |

FOREIGN PATENT DOCUMENTS

| | | |
|---|---|---|
| GB | 2 084 797 | 4/1982 |
| JP | 60-49681 | 3/1985 |

OTHER PUBLICATIONS

The Institute of Physics, 13$^{th}$ European Solid State Device Research Conference (ESSDERC), No. 69, Sep. 13–19, 1983, Canterbury, GB, pp. 15–28, N.T. Linh: Superlattices and electron devices.

Solid State Electronics, vol. 11, No. 10, Oct. 1968, Oxford, GB, pp. 917–932, C.Y. Duh et al.: Temperature Dependence of Hot Electron Drift Velocity in Silicon at High Electric Field.

Electronics Letters, vol. 16, No. 12, Jun. 5, 1980 Stevenage, GB, pp. 467–469; R. Chin et al.: Impact Ionization in Multilayered Heterojunction Structures.

Physical Review B, vol. 23, No. 8, Apr. 15, 1981; H. Shichijo et al.: Band–structure–dependent transport and impact ionization in GaAs, pp. 4197–4207.

Physical Review B, vol. 38, No. 14, Nov. 15, 1988; Massimo V. Fischetti et al.: Monte Carlo analysis of electron transport in small semiconductor devices including band–structure and space–charge effects, pp. 9721–9743.

Physical Review B, vol. 45, No. 8, Feb. 15, 1992; N. Sano et al.; Impact–ionization theory consistent with a realistic band structure of silicon, pp. 4171–4180.

J. Appl. Phys., vol. 72, No. 8, Oct. 15, 1992; J. Bude, et al.; Thresholds of impact ionization in semiconductors, pp. 3554–3561.

J. Appl. Phys., vol. 74, No. 7, Apr. 1, 1994; Y. Kamakura, et al.; Impact ionization model for full band Mote Carlo simulation, pp. 3500–3507.

(List continued on next page.)

Primary Examiner—Jerome Jackson, Jr.
(74) Attorney, Agent, or Firm—Kenyon & Kenyon

(57) ABSTRACT

Semiconductor structures and a method of forming semiconductor structures The avalanche breakdown characteristics, such as breakdown voltage and impact ionisation coefficient, of a semiconductor structure can be controlled by controlling the Brilluin-zone-averaged energy bandgap ($<E_c>$) of the material forming the structure. Consequently, the avalanche breakdown characteristics of a device may be tailored independently of the bandgap $E_g$. The Brillouin-zone-averaged energy bandgap ($<E_c>$) may be controlled by controlling the composition of the semiconductor used or by straining its lattice.

48 Claims, 25 Drawing Sheets

OTHER PUBLICATIONS

IEEE Transactions on Electron Devices, vol. 42, No. 9, Sep. 1995; D. R. Greenberg, et al.; Impact Ionization and Transport in the InAlAs/n+–InP HFET, pp. 1574–1581.

IEEE Transactions on Electron Devices, vol. 42, No. 8, Aug. 1995; T. Enoki, et al.; Design and Characteristics of InGaAs/InP Composite–Channel HFET's pp. 1413–1418.

IEEE Transactions on Electron Devices, vol. 42, No. 9, Sep. 1995; L. Vendrame, et al.; Influence of Impact–Ionization–Induced Base Current Reversal on Bipolar Transistor Parameters, pp. 1636–1646.

Int. J. Electronics, 1993, vol. 74, No. 6; J.S. Yuan; Avalanche breakdown effects on AlGaAs/GaAs HBT performance, pp. 909–916.

J. Vac. Science Technology B., vol. 10, No. 2, Mar./Apr. 1992; C.W. Farley, et al.; Performance tradeons in AlInAs/GaInAs single– and double–heterojunction NpN heterojunction bipolar transistors, pp. 1023–1025.

IEEE Transactions on Electron Devices, vol. 40, No. 1, Jan. 1993; H. Chau, et al; Breakdown–Speed Considerations in InP/InGaAs Single– and Double Heterostructure Bipolar Transistors, pp. 2–8.

IEEE Transactions on Electron Devices, vol. 17, No. 3, Mar. 1996; C. Nguyen; AlInAs/GaInAs/InP Double Heterojunction Bipolar Transistor with a Novel Base–Collector Design for Power Applications pp. 133.

American Institute of Physics, Applied Physics Letter, vol. 61, No. 9, Aug. 31, 1992; C.R. Abernathy, et al.; Improved performance of carbon–doped GaAs base heterojunction bipolar transistors through the use of InGaP, pp. 1092–1093.

Electronics Letters, $14^{th}$ Oct. 1993, vol. 29, No. 21; J.I. Song et al.; Characterization of transistors with different collector designs, pp. 1880–1881.

American Institute of Physics, Applied Physics Letter 39(5), Sep. 1, 1981, O.K. Kim, et al. A high GaIn In0.53Ga0.47As/InP avalanche photodiode with no tunnel–ing leakage current, pp. 402–404.

American Institute of Physics, Applied Physics Letter, Sep. 29, 1986, H. Temkin, et al.; Ge0.6Si0.4 rib waveguide avalanche photodetectors for 1.3um operation, pp. 809–811.

RCA Laboratories, Princeton, New Jersey, Apr. 21, 1957, H. Kroemer; Quasi–Electric and QuasiMagnetic Fields In Nonuniform Semiconductors, pp. 332–343.

Electronics Letters, $5^{th}$ Jun., 1980 vol. 16. No. 12, R. Chin, et al. Impact Ionization in Multilayered Heterojunction Structures; pp. 467–469.

American Institute of Physics, Applied Physics Letter, 1982, F. Capasso et al.; Enhancement of electron impact ionization in a superlattice: A new avalanche photodiode with a large ionization rate ratio; pp. 38–40.

IEEE Electron Device Letters, vol. EDL–4. No. 6. Jun., 1983; G.E. Bulman et al.: Experimental Determination Of Impact Ionization Coefficients in (100) GaAs, pp. 181–185.

Institute of Physics Conference Service No. 120; Chapter 10, Paper presentation at International Symposium GaAs and Related Compounds, Seattle, 1991, IOP Publishing Ltd. And individual contributors, 1992; P. Aristin et al. Evaluation of new multiple quantum well avalanche photodiode structures: The MQW, the doped barrier and doped quantum well, pp. 523–428.

Electronics Letters, $13^{th}$ Feb. 1992, vol. 28, No. 4, A. Salokatve et al.; Multiplication Noise in GaAs/AlGaAs Multiquantum Well Avalanche Photodiodes With Different Well Widths, pp. 416–417.

Optoelectronics—Devices and Technologies, vol. 10, No. 1, Mar., 1995, K. Taguchi et al.; InAlGaAs Quaternary Well Superlattice4 Avalanche Pohtodiodes With Large Gain–Bandwidth and Low Dark Current; pp. 97–107.

IEEE Electron Device Letters, vol. EDL 3, No. 3, Mar., 1982; G.P. Williams et al.; The Graded Bandgap Multilayer Avalanche Photodiode: A New Low–Noise Detector; pp. 71–73.

American Institute of Physics, Applied Physics Letter, vol. 34 (1995) Pt. 2, No.8B, M. Tsuji, et al.; Band Offset Dependance on Impact Ionization Rates In InAlGaAs Staircase Avalanche Photodiodes pp. 1048–1050.

American Institute of Physics, Applied Physics Letter, Mar. 25, 1996; K. Sawada et al.; Photocurrent Multiplication in Hydrogenerated Amorphous Silicon Staircase Photodiode Films, pp. 1835–1837.

American Institute of Physics, Applied Physics Letter, vol. 35 (1996) Part 1. No. 2B; S. Sugawa, et al. Amorphous Avalanche Photodiode with Large Conduction Band Edge Discontinuity, pp. 1014–1017.

IEEE Transactions on Electron Devices, vol. ED–30, No. 7, Jul., 1983, by J. De Jaeger, High Efficiency GaInAs/InP Heterojunction IMPATT Diodes, pp. 790–797.

Electronics Letters, $13^{th}$ Sep., 1984, vol. 20, No. 19, Large–Signal Switching Transients In Index–Guided Semiconductor Lasers, pp. 802–805.

Microwave Journal, Jun., 1993; Michael John Bailey; Heterojunction IMPATT Diodes: Using New Material Technology In a Classic Device; pp. 76–87.

IEEE Electron Device Letters, Nov., 1992, by Michael John Bailey, Heterojunction IMPATT Diodes, pp. 1829–1835.

American Institutes of Physics, Applied Physics Letter, vol. 71, No. 9, May 1, 1992, M.J. Kearney, et al.; Velocity Modulation in GaAs/AlxGa1–xAs impact avalanche transit–time diodes; pp. 4612–4615.

Semiconductor Science Technology 8, IOP Publishing, Ltd. 1993; Heterojunction impact avalanche transit–time diodes grown by molecular beam epitaxy, pp. 561–565.

Applied Physics A Solids and Surfaces, Springer–Verlage, 1994, G.N. Dash et al; Studies on the Prospects of GaInAs and GaInAsP for Double–Drift Region Heterostructure IIM-PATTS, pp. 211–217.

Journal of the IETE, vol. 40, Nos. 5&6, Sep.–Dec. 1994, by K Chandramohan, et al.; A Superlattice Avalanche Region IMPATT Diode, pp. 261–265.

Microwave and Optical Technology Letters, vol. 10,No. 1, Sep., 1995, by C.C. Meng, et al.; 100–Ghz CW GaAs/AlGaAs Multiquantum–Well Impatt Oscillators, pp. 4–6.

Electronics Letters, $26^{th}$ May, 1994, vol. 30, No. 11; J.P.R. David et al: Avalanche breakdown in (AlxGa1x)0.52In0.48P pin junctions, pp. 907–909.

Physical Review B, vol. 7, No. 12, Jun. 15, 1973; A. Baldereschi; Mean–Value Point in the Brillouin Zone; pp. 5213–5215.

Physical Review B, vol. 8, No. 12, Dec. 15, 1973; D.J. Chadi et al.; Special Points in the Brillouin Zone; pp. 5747–5753.

Physical Review, vol. 1116, No. 4, Nov. 15, 1959, L. Kleinman et al.; Crystal Potential and Energy Bands of Semiconductors. I. Self–Consistent Calculations for Diamond, pp. 880–885.

Physical Review, vol. 141, No. 2, Jan. 1966, Structures and Pseudopotential Form Factors for Fourteen Semiconductors of the Diamond and Zinc–blende Structures; M.L. Cohen, et al.; pp. 789–796.

Physical Review B, vol. 14, No. 2, Jul. 15, 1976, J.R. Chelikowsky, Nonlocal Pseudopotential calculations for the electronic structure of eleven diamond and zinc–blende semiconductors, pp. 556–582.

Physical Review B, vol. 43, No. 11, Apr. 15, 1994, M.P. Surh, Quasiparticle energies for cubic BN, BP, Bas, pp. 9126–9132.

Physical Review B, vol. 48, No. 16, Oct. 15, 1993, A. Rubio et al., Quasiparticle band structure of AlN and GaN; pp. 11810–11816.

Physical Review B, vol. 43, No. 17, Jun. 15, 1991, X. Zhu et al.; Quasiparticle band structure of thirteen semiconductors and insulators; pp. 14142–14156.

Physical Review B, vol. 50, No. 15, Oct. 15, 1994, O. Zakharov; Quasiparticle band structures of six II–VI compounds: ZnS, ZnSe, ZnTe, CdS, CdSe, and CdTe; pp. 10780–10787.

Applied Physical Letter, 1995 American Institute of Physics, Feb. 27, 1995, C. Canali, et al.; Measurement of the electron ionization coefficient at low electric fields in InGaAs–based heterojunction bipolar transisotrs, pp. 1095–1097.

J. Vacuum Science Technology, vol. 21, No. 1, May/Jun., 1982, A. Chen, et al.; CPA band calculation for (Hg, Cd) Te, pp. 138–141.

Applied Physical Letter, 1992 American Institute of Physics, Aug. 25, 1992; J.P.R. David et al.; Enhanced breakdown voltages in strained InGaAs/GaAs structures, pp. 2042–2044.

Applied Physical Letter, 1995 American Institute of Physics, May 22, 1995; J.P.R. David et al.; Avalanche breakdown in A1xGA1–xAs alloys and A10.3Ga0.7As/GaAs multilayers, pp. 2876–2878.

Physical Review B, vol. 35, No. 12, Apr. 15, 1987; M. Cardona et al.; Acoustic deformation potentials and heterostructure band offsets in semiconductors; pp. 6182–6195.

Physical Review, vol. 134, No. 3A, May 4, 1964; C.A. Lee; Ionization Rates of Holes and Electrons in Silicaon; pp. A761–A773.

Physical Review, vol. 99, No. 4, Aug. 15, 1995; S.L. Miller; Avalanche Breakdown in Germanium; pp. 1234–1241.

Bell Telephone Laboratories, Inc., Murray Hill, New Jersey, (Received Jul. 12, 1965); R.A. Logan et al.; Charge Multiplication in GaP p–n Junctions; pp. 3945–3946.

Applied Physical Letter, American Physical Review, Aug. 15, 1979, C.A. Armiento et al,; Ionization coefficients of electrons and holes in InP; pp. 333–335.

Applied Physical Letter, American Physical Review, Feb. 1, 1980, by T.P. Pearsall; Impact Ionization rates for electrons and holes in Ga0.4In0.53As; pp. 218–220.

IEEE Journey of Quantum Electronics, vol. QE–21 No. 9, Sep., 1985; by F. Osaka; Impact Ionization Coefficients of Electrons and Holes in (100)–Oriented GA1–xInxAsyP1–y; pp. 1326–1338.

Semiconductor Science Technology 5 (1990) IOP Publishing, Ltd.; J. Urquhart et al.; Impact Ionization Coefficients in In0.53Ga0.47As; pp. 789–791.

Applied Physical Letter, American Physical Review, Aug. 9, 1984 F. Capasso et al. Impact ionization rates for electrons and holes in A10.48In0.52As; pp. 968–970.

Applied Physical Letter, vol. 28, No. 7. American Institute of Physics, 1976; T.P. Pearsall et al.; Impact ionization rates for electrons and roles in GaAs1–xSbx alloys, pp. 403–405.

Applied Physical Letter, vol. 57, No. 3, American Institute of Physics, 1990; May 4, 1990; H. Kuwatsuka et al.; Measurement of the impact ionization rates A10.06Ga0.94sSb, pp. 249–251.

Solid State Electronics, 1976, vol. 21; H. David Law; Interband Scattering Effects On Secondary Ionization Coefficients in GaAs, pp. 331–340.

F. Capasso; Physics of Avalanche Photodiodes; ACADEMIC, San Diego, 1985.

Sze S.M.; Physics of semiconductor Devices $2^{nd}$ Edition; p. 104; WILEY, 1981.

F. Capasso; Semiconductors and Semimetals; W.T. Tasang, Academic, New York 22D, 1986.

S.M. Sze; Physics of Semiconductor devices Ch. 3; Wiley, New York, 1981.

F. Capasso; US Patent 4,383,269, 1983.

Inst. Phys. Conf., Ser 63, 473 (1992); F. Capasso, et al.

Electronics Letters 28, 32 (1992); M. Toivonen, et al.

Physics of Semiconductor devices; Wiley, New York, 1981, Ch. 10; S.M. Sze.

Emis Data Review 7; S. Adachi; Inspec, 1993.

Proc. $22^{ND}$ Int. Conf. Phys. Semidond., 727 (1995); A.D. Prins, et al.

Phys. Review B34, 5390 (1986); M.S. Hybersten, et al.

Electronics Letters, vol. 16, p. 648 (1980); Chin, Holonyak & Stillman.

Physics of Semiconductor Devices $2^{nd}$ Edition, Wiley, 1981; S.M. Sze.

METHOD OF FORMING SEMICONDUCTOR STRUCTURE

This application is a continuation of U.S. application Ser. No. 08/681,829, filed Jul. 30, 1996.

FIELD OF THE INVENTION

The present invention relates to a method of forming a semiconductor structure.

BACKGROUND

I. General

Pair-production by impact ionisation is one of the most important processes affecting the performance of semiconductor electronic devices. The secondary carriers lead to current multiplication which is used to increase the signal in avalanche photodiodes and phototransistors. However, avalanche breakdown imposes an upper limit on the bias that can be applied to semiconductor pn junctions, for example in diodes and transistors, which limits the power available from such devices.

In many cases it is desirable to control the likelihood of impact ionisation and avalanche breakdown by means of a suitable choice of semiconductor material, and/or by engineering the electric field profile by means of suitable doping with p- or n-type impurities. Additionally, the conduction band and valence band-structure may be tailored by means of compositional variation (i.e. alloying) or by growth of heterojunctions comprising layered materials of different band-structure. Lattice mismatched systems may be grown and the resulting strain used to modify the material properties.

The design of semiconductor structures with controlled ionisation or avalanche breakdown properties requires an understanding of the effects of the material properties on the ionisation coefficients. In particular, the energy band-structure is known to have a significant effect on impact ionisation (F. Capasso, *Physics of Avalanche Photodiodes*, Academic, San Diego, 1985). Many attempts have been made to design and engineer structures with artificially enhanced or suppressed ionisation coefficients, but these have been rather unsuccessful and considerable controversy remains concerning the validity of the experimental results.

The failure of these previous attempts has been due to an incorrect understanding of the effect of the band-structure on the ionisation rates and, hence, a use of incorrect or inaccurate prescriptions for the design of devices. As an example, we refer to the prescriptions given in Sze S. M. *Physics of Semiconductor Devices* 2nd Edition (Wiley, 1981) at page 104 for the breakdown voltage $V_b$ in abrupt p-n junctions and linearly graded junctions.

These are reproduced below.

Abrupt junction:

$$V_b = 60(E_g/1.1)^{3/2} (N_B/10^{16})^{-3/4} \quad (1)$$

Linearly graded junction:

$$V_b = 60(E_g/1.1)^{6/5} (a/3 \times 10^{20})^{-2/5} \quad (2)$$

The parameters $E_g$, $N_B$ and a are the bandgap the background doping density and the doping gradient respectively. These prescriptions were based on the experimentally measured ionisation coefficients of Ge, Si, GaAs and GaP. A similar prescription has been calculated which applies to p-i-n diodes with a 1 μm thick i-layer:

$$V_b = 30(E_g/1.1) \quad (3)$$

Although, the apparent linear dependence of $V_b$ on the band-gap $E_g$ holds approximately for these materials, it has not been known whether the relation holds for other materials, or how accurate the expression is. Nevertheless, these prescriptions have been widely used and applied to many materials. Furthermore, the basic assumption contained in these formulae, viz. that it is the energy bandgap $E_g$ that primarily determines the ionisation coefficients, is the assumption common to apparently all the previous attempts to control and engineer ionisation coefficients.

Other simple theories of impact ionisation have expressed ionisation coefficients in terms of ionisation threshold energies, phonon energies, and the electron-phonon scattering mean-free path, with the latter two variables treated as parameters which are varied to fit experimental data for the ionisation coefficients [for a detailed review, see F. Capasso, in *Semiconductors and Semimetals* (ed. W. T. Tsang, Academic, New York) 22D (1986) 1]. Hence these theories have no predictive power in respect of the ionisation characteristics of different materials.

Recently, considerable progress has been made in the first-principles numerical calculation of ionisation coefficients, incorporating the effects of the full bandstructure on the carrier kinematics [Shichijo and Hess, Phys. Rev. B 23, p.4197, 1981], scattering dynamics [M. V. Fischetti and S. E. Laux, Phys. Rev. B38, 9721 (1988)] and impact ionisation cross-section [N. Sano and A. Yoshii, Phys. Rev. B45 (1992) 4171; J. Bude and K. Hess, J. Appl. Phys. 72 (1992) 3554, Y. Kamakura, H. Mizuno, M. Yamaji, M. Morifuji, K. Taniguchi, C. Hamaguchi, T. Kunikiyo, M. Takenaka, J. Appl. Phys. 75 (1994) 3500]. However, few materials have been studied to date. Due to the numerical complexity, no simple relation between the ionisation coefficients or breakdown voltage and energy bandstructure has been expected. Selection of semiconductor materials with desired breakdown properties has therefore been made based on empirical knowledge of the ionisation rates in each material.

Optimisation of semiconductor device performance may impose apparently contradictory requirements on the properties of the constituent materials. For example, high speed operation of a field-effect transistor (FET) requires a material with high transient electron velocity (implying a low electron effective mass and hence narrow bandgap), whereas high power operation requires a high breakdown voltage (previously thought to imply a material with wide bandgap). Similarly, a photodetector for use in the near infra-red wavelength region conventionally requires a material with a narrow direct bandgap, whereas the requirements of low dark current suggest the use of a material with a wide bandgap to reduce both primary generation of dark current and its subsequent multiplication by impact ionisation. Some of these trade-offs have in the past been addressed by using composite structures, in which layers of different material composition perform different functions.

The effect of impact ionisation and breakdown, and hence the ionisation properties desired, are different for different classes of device. Here we summarise design optimisation problems in respect of these properties in Field-Effect Transistors (FETs), bipolar transistors, avalanche photodiodes (APDs) and Impact Ionisation Avalanche Transit Time (IMPATT) diodes.

II. Specific Semiconductor Device Design Problems

FETs:

High-speed FET operation requires a material in which carriers have a high effective velocity, and whose transport can be efficiently modulated by the gate. This generally implies a material with a narrow energy bandgap. However, high-power operation requires a high avalanche breakdown voltage which previously has been identified with a wide bandgap.

Known ultra-short gate length FETs have cut-off frequencies well above 100 GHz. Many microwave and millimetre-wave applications in optical communications, for example laser drivers and photoreceiver amplifiers, and radio, for example oscillators and low-noise amplifiers, require high-speed devices capable of handling large currents and voltages.

The highest operation frequencies have been obtained in AlInAs/GaInAs high electron mobility transistors (HEMTs). However, the narrow bandgap of InGaAs and the consequent high probability of impact ionisation and Zener tunnelling leads to several problems, including low source-drain breakdown voltage and the presence of "kink" phenomena.

The output power of FETs with GaAs and InGaAs channels is limited by avalanche breakdown. In order to increase the power, heterojunction FETs with doped InP channels have been fabricated. [D. R. Greenberg, J. A. del Alamo & R. Bhat IEEE Trans. Electron Devices, ED 42 1574(1995)]. The smaller ionisation probability of InP, compared with GaAs or InGaAs, leads to increased breakdown voltage and hence voltage swing. A complete absence of ionisation in the channel has been achieved hitherto, with consequently low gate current and low output conductance. However, the cut-off frequency was reduced due to the lower mobility of InP and to the doping in the channel.

To achieve high-frequency and high-power operation of FETs, devices with composite InGaAs/InP channels have been proposed and demonstrated [T. Enoki, K. Arai, A. Kohzen and Y. Ishii, IEEE Trans. Electron Dev. 42, 1413 (1995)]. Electrons are confined to the high-mobility InGaAs in the low-field regions of the channel, and hence exhibit a high transient velocity. However, when the field is sufficiently high, the carriers undergo real-space transfer into the adjoining InP sub-channel, which exhibits high saturated velocity and high breakdown voltage. Hence the output power is not limited by breakdown in the InGaAs. In this configuration, the scope for independent optimisation of the low-field transport and high-field breakdown is somewhat limited by the requirement that real-space transfer into the InP layer should occur prior to the onset of impact ionisation in the InGaAs channel.

Bipolar Transistors:

The output power of bipolar transistors is limited by the breakdown voltage of the base-collector junction, and the operating frequency by the base-collector transit time. As bipolar transistors are reduced in size, high doping is required in the base and collector to reduce parasitic resistances and base punch-through. The increased field in the base-collector junction leads to impact ionisation and hence base current reversal and "snap-back" phenomena [L. Vendrame, E. Zabotto, A. Dalfabbro, A. Zanini, G. Verzellesi, E. Zanoni, A. Chantre and P. Pavan, IEEE Trans. Electron Dev. 42, 1639 (1995)]. Further, heterojunction bipolar transistors HBTs) operating in avalanche mode exhibit higher collector-base junction capacitance, lower Early voltage, higher device noise, lower power efficiency, lower cut-off frequency, reduced device switching speed, and degraded maximum frequency of oscillation [J. S. Yuan, Int. J. Electronics 74, 909 (1993)]. Hence it is necessary to find materials for the collector in which the ionisation probability is reduced, while the saturation velocity remains high or is even increased.

HBTs with wide-bandgap emitters offer improved characteristics such as higher emitter efficiency due to reduced hole injection from the base, decreased base resistance, etc., which lead to improved gain and bandwidth [see S. M. Sze, *Physics of Semiconductor devices*, (Wiley, N.Y., 1981), Ch. 3]. In conventional AlGaAs/GaAs, AlInAs/GaInAs or InP/GaInAs devices, impact ionisation in the GaAs or GaInAs collector limits the output power. The situation is improved using double heterostructure devices in which the collector is fabricated from a material with lower ionisation coefficients. AlInAs/GaInAs/InP devices with InP collectors exhibited breakdown voltage≈3 times higher than devices with an InGaAs collector, although with $f_t$ reduced by about 30% [C. W. Farley, J. A. Higgens, W. J. Ho, B. T. McDermott and M. F. Chang, J. Vac. Sci, Technol. B 10, 1023 (1992)]. The energy barrier at the InGaAs/InP interface requires the use of intermediate grading layers to maintain the high-speed operation [H. F. Chau, D. Pavlidis, J. Hu and K. Tomizawa, IEEE Trans. Electron Dev. 40, 2 (1993)]. More sophisticated designs incorporate an InGaAs/AlInAs chirped superlattice and a doping dipole at the base-collector junction, allowing efficient injection into the InP collector, and exhibit high output power at microwave frequencies [C. Nguyen, T. Y. Liu, M. Chen, H. C. Sun and D. Rensch, IEEE Electron Dev. Lett. 17, 133 (1996)].

GaAs-based HBTs with InGaP collectors exhibit higher breakdown voltage compared to GaAs or AlGaAs collectors [C. R. Abernathy, F. Ren, P. W. Wisk, S. J. Pearton and R. Esagui, Appl. Phys. Lett. 61, 1092 (1992)]. Thin highly-doped GaAs or GaInP layers in the collector were required to maintain the current saturation characteristics [J. I. Song, C. Caneau, W. P. Hong and K. B. Chough, Electron. Lett. 29, 1881 (1993)].

APDs:

Impact ionisation is the direct cause of avalanche multiplication and hence photocurrent gain in APDs. Hence, sufficiently high ionisation coefficients are required so that avalanche breakdown occurs at sufficiently low fields (e.g. before breakdown due to Zener tunnelling). The penalty for large photocurrent multiplication is excess noise due to the stochastic nature of the ionisation process. The carrier avalanche leads to a finite build-up time of the photocurrent response, and to a sensitive dependence on the applied bias. The noise factor, build-up time and gain stability are all optimised when there is a large difference between the ionisation coefficients of electrons ($\alpha$) and holes ($\beta$). For a full discussion, see Capasso [ibid]. Low-noise operation also requires a low dark current (e.g. due to band-to-band tunnelling).

The selection of materials for APDs is constrained by the desired optical wavelength for detection, which is a function of bandgap. Unfortunately, the common direct band-gap III–V materials such as GaAs, InP and InGaAs have equal (within a factor≈2) electron and hole ionisation rates, and hence high excess noise. Narrow bandgap materials such as InGaAs, which are sensitive in the technologically-important near-infrared region, suffer from large leakage currents at high fields due to band-to-band tunnelling. Only silicon exhibits unambiguously a large difference between electron and hole ionisation rates, but its absorption coefficient at visible/infrared wavelengths is small due to its indirect bandgap.

SAM APDs

In the Separate Absorption and Multiplication (SAM) APD, one layer such as InGaAs, absorbs incoming light, while carrier multiplication occurs in an adjacent high-field layer composed of a material such as InP [O. K. Kim, S. R. Forrest, W. A. Bonner and R. G Smith, Appl. Phys. Lett. 39, 402 (1981)].

Careful control of the doping is required so that the field at the heterointerface between the layers is sufficient to ensure collection of the carriers but not high enough to allow tunnelling in the InGaAs. The abrupt heterointerface causes pile-up of photogenerated holes; this deleterious effect can be ameliorated by compositional grading of the heterointerface. SAM APD's with a Si multiplication region and SiGe superlattice region absorbing light at 1.3 $\mu$m have also been demonstrated. The low absorption coefficient necessitated a waveguide geometry to increase the absorption length without drastically increasing the transit time [H. Temkin, A. Anredsyan, N. A. Olsson, T. P. Pearsall & J. C. Bean, Appl. Phys. Lett. 49, 809 (1996)].

Bandgap Engineering for Enhanced Ionisation Rates in APDs

Since no material has been found which exhibits large multiplication, low dark current, high absorption coefficient over a range of optical wavelengths, is and significantly differing electron and hole ionisation coefficients, many attempts have been made to design and engineer APDs with modified (usually enhanced) ionisation rates. The assumption common to these attempts is that the energy bandgap $E_g$ primarily determines the ionisation coefficients. Control is attempted by varying either the bandgap itself, or the bandstructure (e.g. effective mass, spin-orbit splitting, etc.) in a restricted region of the Brillouin zone such as the region immediately in the vicinity of the local conduction-band minimum defining the band-gap, or the heterojunction discontinuities appropriate to a restricted region of the Brillouin zone such as the region in the vicinity of the bandgap. Previously-investigated structures include the graded-gap APD, multiple quantum well or superlattice APD and the staircase photomultiplier [for a review, see F. Capasso, ibid].

Graded-gap APD:

Kroemer [H. Kroemer, RCA Rev. 18, 332 (1957)] showed that electrons and holes in a compositionally-graded semiconductor experience quasi-electric fields whose force pushes the carriers in the same direction towards regions of lower bandgap. Capasso [F. Capasso, U.S. Pat. No. 4,383, 269 (1983)] described a $p^+$-i-$n^+$ APD in which the i-region consists of a graded-gap semiconductor. An applied electric field accelerates the electrons and holes in opposite directions. Hence electrons and holes experience different electric fields, and therefore different ionisation coefficients. Experiments on graded-gap AlGaAs structures suggested some enhancement of ($\alpha/\beta$) compared to GaAs [F. Capasso, W. T. Tsang, A. L. Hutchinson, and P. W. Foy, Inst. Phys. Conf. Ser 63, 473 (1992)]. Ionisation occurs at lower fields in the narrow-gap regions of the graded-gap APD than in the wide-gap regions, leading to more gradual breakdown and hence more stable gain.

Multiple Quantum Well APD:

Chin et al. [R. Chin, N. Holonyak and G. E. Stillman, Electron. Lett. 16, 467 (1980)] predicted that ionisation rates could be enhanced in semiconductor multiple quantum wells (MQWs) or superlattices. Carriers crossing a heterojunction from a wide-gap to a narrow-gap material increase their kinetic energy by an amount equal to the potential discontinuity. The high energy tail of the carrier distribution, and hence the number of carriers at energies where ionisation occurs, is increased. At a heterojunction in which the potential discontinuities for electrons and holes are significantly different, one carrier type can be selectively enhanced leading to an increase in the ionisation coefficient ratio. Hence the noise, response time and gain stability can be improved. The spatial localisation of the ionisation event within a short distance of the heterojunctions also further decreases the multiplication noise.

Capasso et al. [F. Capasso, W. T. Tsang, A. L. Hutchinson and G. F. Williams, Appl. Phys. Lett. 40, 38 (1982)] reported ($\alpha/\beta$)$\approx$8 in 500 Å AlGaAs/500 Å GaAs MQW APD FIG. 4c), compared to ($\alpha/\beta$)$\approx$2 in bulk GaAs. It should be noted that these measurements, and the measurements of enhanced ($\alpha/\beta$) in graded-gap APDs mentioned above, were performed before the definitive experimental study of ionisation coefficients in GaAs by Bulman et al.[G. E. Bulman, V. M. Robbins, K. F. Brennan, K. Hess and G. E. Stillman, IEEE Electron. Dev. Lett. EDL-4, 181 (1983)], which pointed out the role of electroabsorption of recombination radiation in contaminating measurements of ionisation coefficients. More recent measurements [P. Aristin, A. Torabi, A. K. Garrison, H. M. Harris and C. J. Summers, Inst. Phys. Conf. Ser. 120, 523 (1991); A. Salokatve, M. Toivonen and M. Hovinen, Electron. Lett. 28, 416 (1992)] have found no difference between ionisation coefficients in the GaAs wells of the MQW, and bulk GaAs. In contrast, InAlAs/InGaAs superlattice APDs have exhibited clear evidence of ($\alpha/\beta$) enhancement, and exhibit gain-bandwidth products >100 GHz [K. Taguchi, K. Makita, I. Watanabe, M. Tsuji and S. Suguo, Optoelectronics—Devices and Technol. 10, 97 (1995)].

Staircase Photomultiplier:

The performance of the MQW APD is expected to be optimised for electron multiplication when the valence-band discontinuity is minimised, and the conduction-band is larger than the bandgap ($\Delta E_c > E_g$). However in such a case, compositional grading of the well-barrier exit heterojunction is required to prevent electron trapping in the quantum wells. These considerations led to the proposal of the staircase APD [G. F. Williams, F. Capasso and W. T. Tsang, IEEE Electron. Dev. Lett. EDL-3, 71 (1982)]. Due to the single carrier-type multiplication and the spatial localisation of the impact ionisation, the device acts as a solid state analogue of the photomultiplier. Material systems which have been identified as satisfying (or almost satisfying) the condition $\Delta E_c > E_g$ include $AlAs_{0.03}Sb_{0.97}$/GaSb and HgTe/CdTe [F. Capasso, in *Semiconductors and Semimetals* (ed. W. T. Tsang, Academic, New York) 22D (1986) 1].

Staircase APD's which incorporate multiple graded layers but do not satisfy the condition $\Delta E_c > E_g$, have been fabricated using GaAs/$Al_{0.45}Ga_{0.55}$As with doping dipoles at the heterojunction interfaces to increase the effective band offset [M. Toivonen, A. Salokatve, M. Hovinen, AND M. Pessa, Electron. Lett. 28, 32 (1992)], and also using InAlGaAs with $\Delta E_c$ up to 0.5 eV [M. Tsuji, K. Makita, I. Watanabe and K. Taguchi, Jap. J. Appl. Phys. 34, L1048 (1995)].

In both cases, ($\alpha/\beta$) was increased from $\approx$2 in the bulk materials to $\approx$5. Staircase APDS fabricated from amorphous hydrogenated SiC/Si [K. Sawada, S. Akata, T. Takeuchi and T. Ando, Appl. Phys. Lett. 68, 1835 (1996)], and amorphous hydrogenated SiC/SiGe multilayer APDs in which the conduction-band discontinuity exceeds the bandgap [S. Sugawa, A. Kozuka, T. Atoji, H. Tokunaga, H. Shinizu and K. Ohmi, Jap. J. Appl. Phys. 35, 1014 (1996)], have been reported.

IMPATTs:

IMPATT diodes depend on the time delay caused by avalanche build-up of secondary carriers and their subsequent drift, which can yield a negative resistance in the diode characteristic at microwave frequencies. Such devices offer the highest power sources of microwave and millimeter-wave radiation [for detailed discussion and references, see S. M. Sze, *Physics of Semiconductor devices*, (Wiley, N.Y., 1981), Ch. 10]. The power-frequency limit of the IMPATT diode depends on the saturated carrier velocity $v_s$ and the avalanche breakdown voltage $V_b$. The frequency is also limited by the avalanche build-up time and hence depends on the ratio of electron to hole ionisation coefficients. Output efficiency is maximised when a high carrier velocity can be maintained at low fields. In contrast to the case for APDs, the minimum noise in an IMPATT diode is achieved when electron and hole coefficients are similar in magnitude, so that GaAs ($\alpha/\beta \approx 2$) offers lower noise than Si ($\alpha/\beta \approx 10$) [Sze, ibid].

Various junction structures are utilised, including Read, double-rift and Misawa diodes. With a few exceptions, IMPATT diodes have been restricted to Si, GaAs or InP, although IMPATT devices using different materials for the avalanche and drift regions have been reported. Higher power and lower noise were claimed for AlGaAs/GaAs heterojunction IMPATTs [J. C. Dejaeger, R. Kozlowski and G. Salmer, IEEE. Trans. Electron. Dev. 30, 790 (1983); Electron. Lett. 20, 803 (1984); M. J. Bailey, Microwave J. 36, 76 (1993); IEEE Trans. Electron. Dev. 39, 1829 (1992); M. J. Kearney, N. R. Couch, R. S. Smith and I. S. Stephens, J. Appl. Phys. 71, 4612 (1992)]. However other studies conclude there is little advantage for this material system [M. J. Kearney, N. R. Couch, J. Stephens and R. S. Smith, Semicond. Sci. Technol. 8, 560 (1993)]. Improved performance was also predicted for GaAs/InGaAs/GaAs IMPATTs [G. N. Dash and S. P. Pati, Appl. Phys. A, 58, 211 (1994)].

IMPATTs with superlattice avalanche regions have been proposed [C. C. Meng and H. R. Fetterman, Solid-State Electron. 36, 435 (1993); K. K. Chandramojhan, R. U. Khan and B. B. Pal, J. Inst. Electr. Telecom. Eng. 40, 261 (1994)], and some performance enhancement claimed [C. C. Meng, S. W. Siao, H. R. Fetterman, D. C. Streit, T. R. Block and Y. Saito, Micro. and Opt. Tech. Lett. 10, 4 (1995)].

Hence, in summary, materials for FET channels, HBT collectors, and IMPATT devices require high breakdown voltage and high saturated carrier velocity. APDs and IMPATTs require control of the ratio of the electron to hole ionisation coefficients ($\alpha/\beta$). Thus, from the foregoing, it will be seen that there are a number of different conflicting design requirements for the impact ionisation and breakdown characteristics for semiconductor devices, which can only partially be resolved by conventional design techniques. These problems and constraints may at least in part be ameliorated by the present invention.

SUMMARY OF THE INVENTION

According to the present invention, there is provided a method of forming a semiconductor structure comprising forming a semiconductor structure such that the Brillouin-zone-averaged energy bandgap ($\langle E_c \rangle$) of at least a portion of the structure is controlled on the basis of a desired avalanche breakdown characteristic therefor. The present invention applies particularly to materials having relatively large bandgaps ($E_g > 1$ eV), including (but not limited to) GaAs, InP, GaP, AlAs, AlSb and AlP.

It has been found that for most practical purposes the following relationship holds:

$$\frac{1}{8}(E_\Gamma + 4.E_L + 3.E_X) = \langle E_c \rangle \quad (4)$$

where $E_\Gamma$ is the conduction band-edge at the $\Gamma$ symmetry point of the Brillouin zone, measured relative to the valence band maximum at $\Gamma$, $E_X$ is the conduction band-edge energy at the X symmetry point of the Brillouin zone, measured relative to the valence band maximum at $\Gamma$, $E_L$ is the conduction band-edge energy at the L symmetry point of the Brillouin zone, measured relative to the valence band maximum at $\Gamma$.

The portion of the structure may be formed according to the invention by:

(a) selecting from "known" materials, such GaAs, InP, on the basis of their $\langle E_c \rangle$ values which are fixed;

(b) forming an alloy with a predetermined value of $\langle E_c \rangle$ and if required also a predetermined value of $E_g$ or lattice constant;

(c) forming of a strained layer or strained layer superlattice such that a predetermined value for $\langle E_c \rangle$ is established by the strain;

(d) forming a compositionally graded region in which the variation of $\langle E_c \rangle$ with position (x) leads to an additional effective field $d\langle E_c \rangle/dx$, to enhance or suppress ionisation/breakdown depending on whether it is aligned parallel or anti-parallel to the applied electric field;

(e) forming a superlattice pseudoalloy; or (f) forming a multilayer heterojunction system to create a superlattice or multiple quantum well, in which ionisation may be enhanced by means of the energy gained at the heterojunction in crossing from a region of high $\langle E_c \rangle$ to a region of low $\langle E_c \rangle$.

A device according to the invention may be formed using any combination of the methods (a) to (f) listed above.

Forming a compositionally graded region allows the possibility of engineering both $\langle E_c \rangle$ and $E_g$ such that either $E_g$ is constant and $\langle E_c \rangle$ is graded or $\langle E_c \rangle$ is constant and $E_g$ is graded.

It is known that strain in the lattice of a semiconductor also affects the band-structure. Thus, the avalanche breakdown characteristics can be tailored by growing mismatched lattice layer in the formation of a semiconductor structure. The control of $E_X$ and $E_L$ may also be achieved by varying the composition of the semiconductor material. Consequently, by the use of suitable lattice strains and material compositions, $\langle E_c \rangle$ and $E_g$ can both be tailored to the requirement of a particular device. Thus, it can be seen that the avalanche breakdown voltage or the ionisation coefficient for a junction can be varied somewhat independently of the energy bandgap $E_g$.

Grading $\langle E_c \rangle$ or forming the structure with discontinuities in $\langle E_c \rangle$ enables X and L electrons to be accelerated as well as the $\Gamma$ electrons.

Conveniently, the Brillouin-zone-averaged energy bandgap of a p-i-n diode can be selected according to the following relationship:

$$\langle E_c \rangle = \frac{(V_b + m)}{n} \quad (5)$$

where $V_b$ is a predetermined breakdown voltage, and m and n constants. In the case of a p-i-n diode having a 1 $\mu$m wide i region, m is approximately 45.8 and n is approximately 46.3. Other relationships between breakdown voltage $V_b$ and $<E_c>$ can be calculated for other doping profiles, e.g. abrupt or graded.

The present invention also provides a semiconductor device having a region wherein the energy gap is substantially constant and the Brillouin-zone-averaged energy bandgap varies spatially and a semiconductor device having a region wherein the energy gap varies spatially and the Brillouin-zone-averaged energy bandgap is substantially constant.

BRIEF DESCRIPTION OF THE DRAWINGS

Embodiments of the present invention will now be described, by way of example, with reference to the accompanying drawings, in which:

FIG. 34($b$) illustrates how the quantum barriers can be made higher in the device of FIG. 32 in order to minimise Zener tunneling;

FIG. 34($c$) illustrates spatial modulation in the layer thicknesses in order to allow charge carriers to pass out of the wells;

DETAILED DESCRIPTION

I. Analysis

In investigating the dependence of impact ionisation on bandstructure for a range of materials, we encounter problems in determining both $V_b$ and the bandgaps. Ionisation coefficients for many materials are not well established, with significant discrepancies amongst the published values. For direct, narrow-bandgap materials ($E_g \leq 0.8$ eV), interband tunnelling can cause breakdown at fields lower than that required for impact ionisation. In wide bandgap materials, localised premature breakdown at "microplasmas" or edges of the device can occur. In any case, extraction of accurate ionisation coefficients from measurements on a semiconductor device depend upon a reliable determination of the electric field profile within the device. We will utilise recent work by Davide et al [J. P. R. David, M. Hopkinson and M. A. Pate, Electron. Lett. 30, 909 (1994)], in which $V_b$ was directly measured in 1 μm p-i-n diodes fabricated in two alloy systems: $Al_xGa_{1-x}As$ and $(Al_xGa_{1-x})_{0.52}In_{0.4}P$. To account for variations in the doping levels and i-region width, the internal field distribution of the devices was measured, and the breakdown voltages were normalised to that for a GaAs device with the same structure. The results are shown in Table I. Both alloy systems are lattice-matched to GaAs, and exhibit a direct-indirect bandgap transition within the range of composition studied.

The bandstructure parameters such as energies at symmetry points in the Brillouin zone, are not well known in all cases. However, the room-temperature conduction-band energies have been measured experimentally for $Al_xGa_{1-x}As$ and $(Al_xGa_{1-x})_{0.52}In_{0.48}P$, and are shown in Table I. The results for $Al_xGa_{1-x}As$ have been summarised by Adachi [S. Adachi, EMIS Data Review 7, (INSPEC, 1993)]. Recently, Prins et al [A. D. Prins, J. L. Sly, A. T. Meney, D. J. Dunstan, E. P. O'Reilly and A. R. Adams, Proc. $22^{nd}$ Int. Conf. Phys. Semicond., 727 (1995)], have measured $E_\Gamma$ and $E_x$ for $(Al_xGa_{1-x})_{0.52}In_{0.48}P$. Values for $E_L$ have been obtained by interpolating between the constituent binary alloys.

Figure 1A:
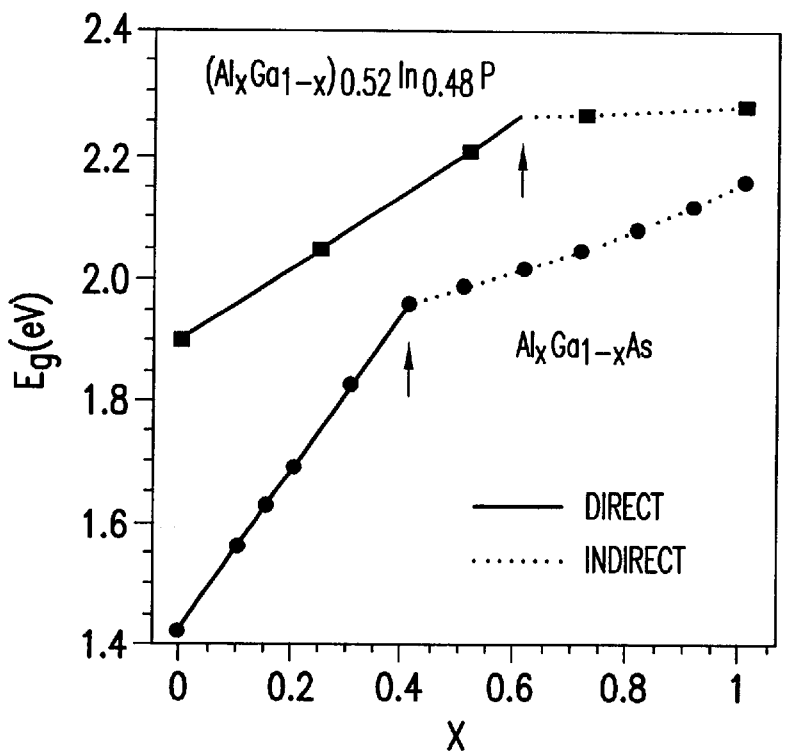
FIG. 1(a) is a graph of the band gap energy $E_g$ as a function of alloy composition in $Al_xGa_{1-x}As$ and $(Al_xGa_{1-x})_{0.52}In_{0.48}P$, based on the data of Table I.
Figure 1B:
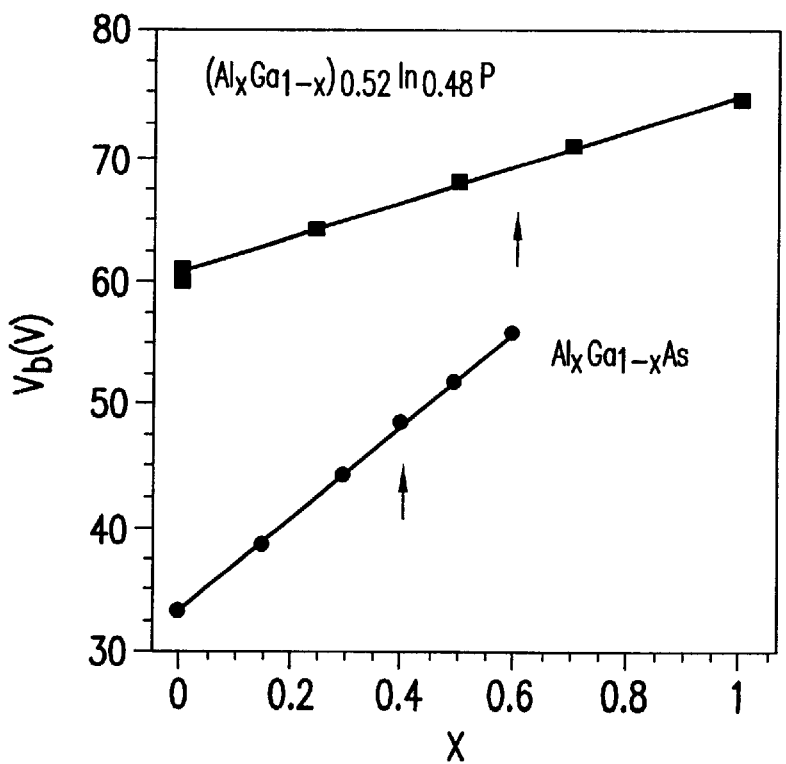
FIG. 1(b) is a graph of the measured breakdown voltage $V_b$ as a function of composition (x)

We first investigate the dependence of $V_b$ on $E_g$. FIG. 1($a$) shows its composition dependence in the two alloy systems. The arrows mark the transition from direct to indirect bandgap regimes. However, as shown by David et al [J. P. R. David, M. Hopkinson and M. A. Pate, Electron. Lett. 30, 909 (1994)] and reproduced in FIG. 1($b$), $V_b$ increases linearly with the composition x in both $Al_xGa_{1-x}As$ and $(Al_xGa_{1-x})_{0.52}In_{0.48}P$. The absence of deviation from linearity at the direct-indirect transition immediately demonstrates that $E_g$ is not the important parameter in determining $V_b$. Furthermore, it is seen that for alloys with the same value of $E_g$ such as $Al_{0.35}Ga_{0.65}As$ and $Ga_{0.52}In_{0.48}P$, $V_b$ is ≈20% higher in the latter material. Hence the dependence of $V_b$ on the bandstructure involves some other parameter than $E_g$.

Average Energy Gaps and Special k-points

Figure 2A:
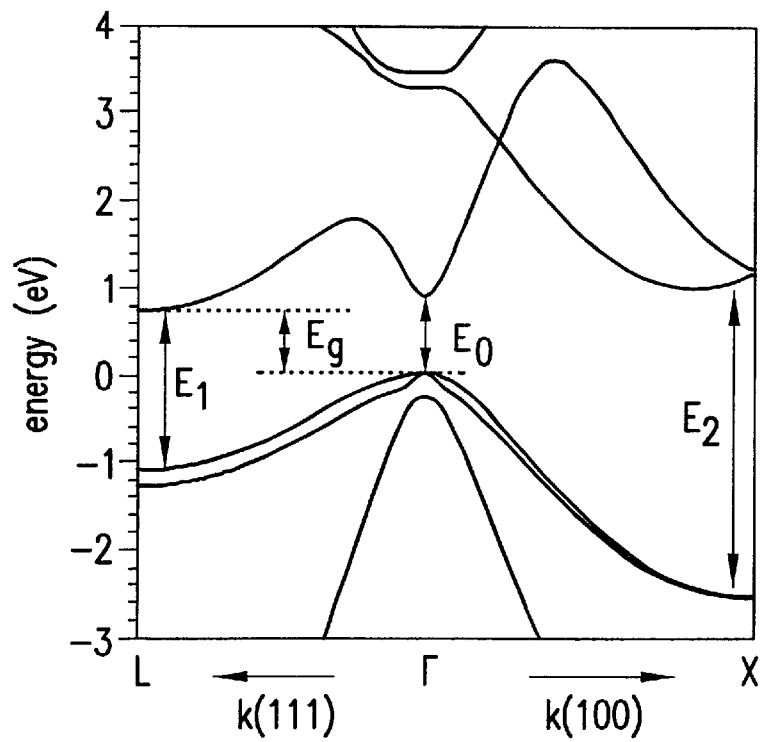
FIG. 2(a) is a diagram of the energy gaps in a semiconductor, illustrating the gap $E_g$ and direct optical transitions $E_0$, $E_1$ and $E_2$ in Ge.
Figure 2B:
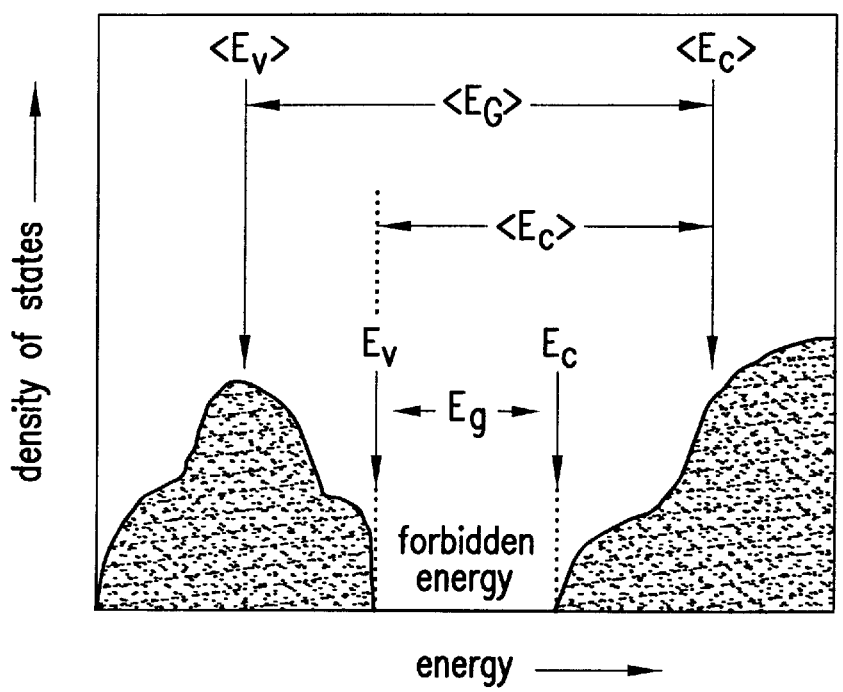
FIG. 2(b) is a diagram of the density of energy states, showing average gaps $<E_G>$ and $<E_c>$.

The value of the energy gap is dependent on both the magnitude and direction of the wavevector k. FIG. 2($a$) shows the energy bandstructure of Ge in the first Brillouin zone of momentum space. The smallest value of the energy gap ($E_g$) determines the threshold for interband optical absorption and many aspects of electronic transport at low fields, while the direct gaps $E_0$, $E_1$ and $E_2$ dominate the optical spectra. For wide-bandgap semiconductors (as defined hereinbefore), carriers at the high energies required for impact ionisation undergo rapid scattering with phonons, randomising the momentum. Hence we might expect that ionisation threshold energies are associated not with $E_g$ but instead with some average value of the energy gap. The average direct gap between valence and conduction bands ($<E_G>$ in FIG. 2($b$)), also known as the bond energy gap or Penn gap, arises from the gap between bonding and anti-bonding energy levels. A single-isotropic-gap Penn model is able to reproduce many of the features of the bond strength and dielectric response of semiconductors [J. C. Phillips, "Bonds and bands in semiconductors", Academic Press, New York, 1973].

During pair-creation by impact ionisation, the initiating carrier exchanges momentum with a valence electron, i.e. transitions are indirect in k-space. Semiconductors with the zincblende crystal structure are characterised by having a single valence-band maximum at Γ and local conduction-band minima at Γ, X and L. We can therefore also consider an average indirect bandgap between the valence-band maximum and the average conduction band energy, shown as $<E_c>$ in FIG. 2($b$).

Figure 3A:
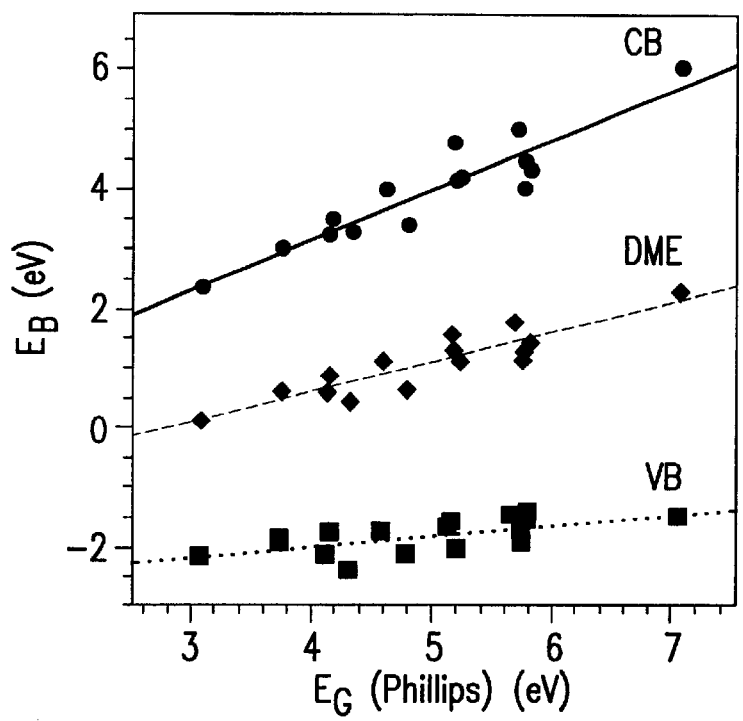
FIG. 3(a) is a graph of band energy $E_B$ for the valance band ($V_B$), conduction band ($C_B$) and midgap DME) energies at the Baldereshi point (LMTO calculation) plotted against the values of the Penn gap.

The average energy gaps $<E_G>$ and $<E_c>$ may be calculated by integration over the entire Brillouin zone, which is an intensive calculation. However, good approximations may be achieved by considering a small number of "special points" in the Brillouin zone. The best single-point representation of the Brillouin zone is known the Baldereschi mean-value point [A. Baldereschi, Phys. Rev. B7, 5212 (1973)].

$$(E) = E_B = E(0.6223, 0.293, 0) \qquad (6)$$

where the k-coordinates are in units of ($2\pi/a_0$). Cardona and Christense [M. Cardona and N. E. Christensen, Phys. Rev. B. 35, 6182 (1987)] have shown that the Penn gap is associated with the valence-conduction band separation at the Baldereschi special point. FIG. 3($a$) shows their calculated valence- and conduction-band energies at the Baldereshi point ($E_B$) plotted against the values of the Penn gap given by Phillips ($E_G$) for group IV, III–V and II–VI semiconductors, after correcting for shifts of the energy bandgaps associated with the local density functional calculation. The dielectric midgap energy (DME) is found to be a useful parameter in studies of both the electron-phonon interaction and bandgap discontinuities at heterojunctions, see Cardona et al, supra.

A more accurate special-point representation is that of Chadi and Cohen [D. J Chadi and M. L. Cohen, Phys. Rev. B8 (1973) 5747].

$$(E) = E_{CC} = \frac{3}{4}E(0.75, 0.25, 0.25) + \frac{1}{4}E(0.25, 0.25, 0.25) \quad (7)$$

However, for our purposes the most convenient representation is due to Kleinman and Phillips [L. Kleinman and J. C. Phillips, Phys. Rev. 116 (1959) 880].

$$(E) \approx E_{KP} = \frac{1}{8}[E(0, 0, 0) + 3 \cdot E(1, 0, 0) + 4 \cdot E(0.5, 0.5, 0.5)] = \quad (8)$$

$$\frac{1}{8}[E_\Gamma + 3 \cdot E_X + 4 \cdot E_L]$$

Figure 3B:
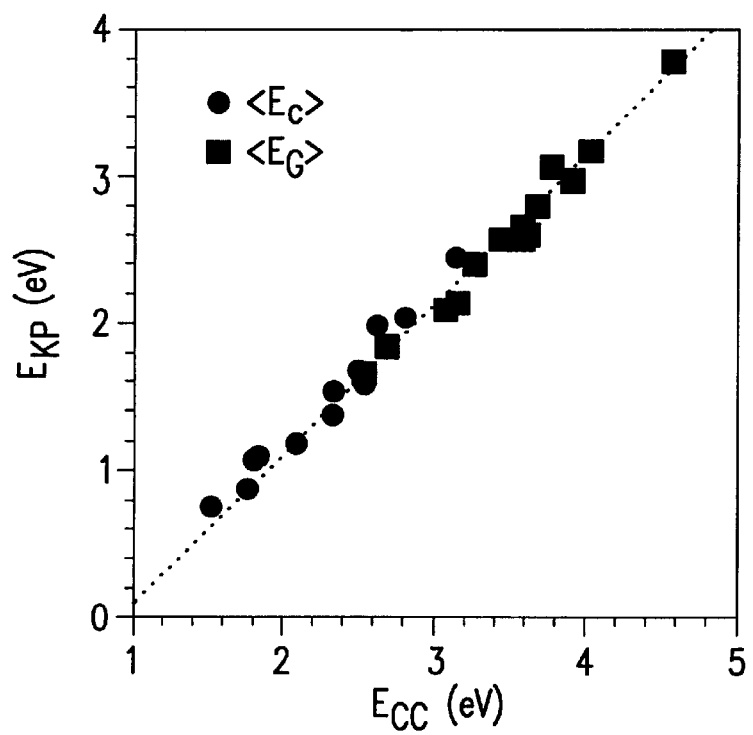
FIG. 3(b) is a graph of conduction band energy $E_c$ and direct bandgap $E_g$ at the Chadi-Cohen special point $E_{CC}$, as compared with the Kleinmann-Phillips average $E_{KP}$ (empirical pseudopotential calculation)

Although slightly less accurate than the Chadi-Cohen representation, it has the advantage that the special points are at the Γ, X and L symmetry points of the Brillouin zone, for which experimental data for the energies is directly available. We have verified the relationship between $E_{CC}$ and $E_{KP}$ by performing an empirical pseudopotential calculation for 14 cubic semiconductors using the parameters of Cohen and Bergstrasse [M. Cohen and T. K. Bergstrasser, Phys. Rev. 141, 789 (1965)]. FIG. 3b compares the <$E_c$> and <$E_G$>, calculated using the special point of Kleinman-Phillips and Chadi-Cohen. As expected, the two methods yield energies which are related by straight line of unity slope.

Determination of Reliable Bandstructure Data

Study of the dependence of avalanche breakdown and average energies for a wide range of materials demands a reliable and consistent set of bandstructure data. The most accurate semiconductor bandstructures have been determined from empirical variation of the crystal pseudopotential to fit known critical point energies,[J. R. Chelikowsky and M. L. Cohen, Phys. Rev . B14, 556 (1986).] but are only as reliable as the experimental energies. For several materials which have been less thoroughly studied, there is insufficient experimental data to allow determination of the empirical pseudopotential. Recently, ab-initio theoretical calculations of the bandstructures have been performed, which predict energies in good agreement with experiments. Such calculations provide an invaluable guide to the interpretation of experimental bandstructure measurements and to the properties of materials for which little experimental information is available.

Figure 4A:
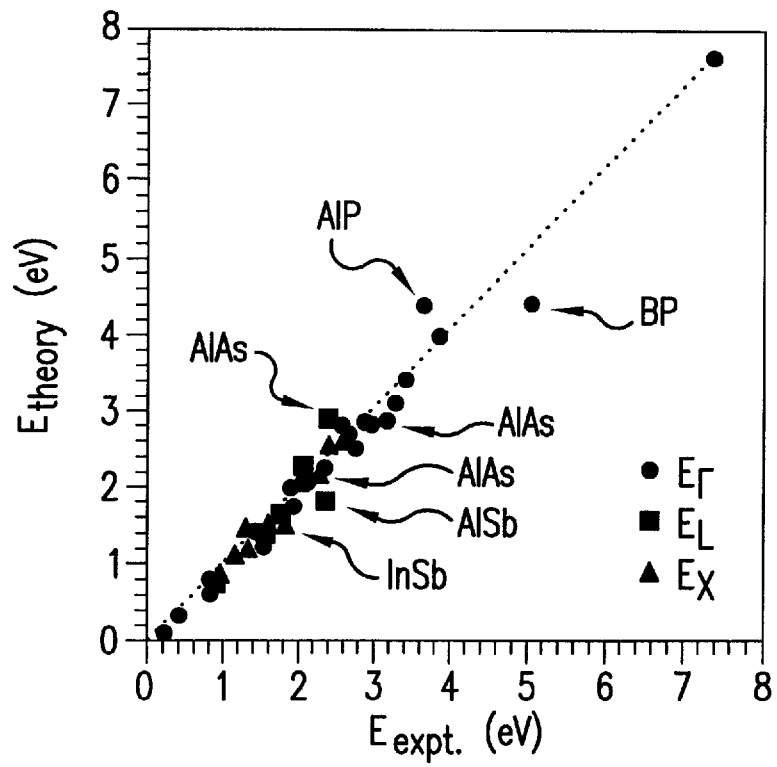
FIG. 4(a) is a graph of the theoretical indirect energy gaps calculated for a range of semiconductors compared with their experimental values.
Figure 4B:
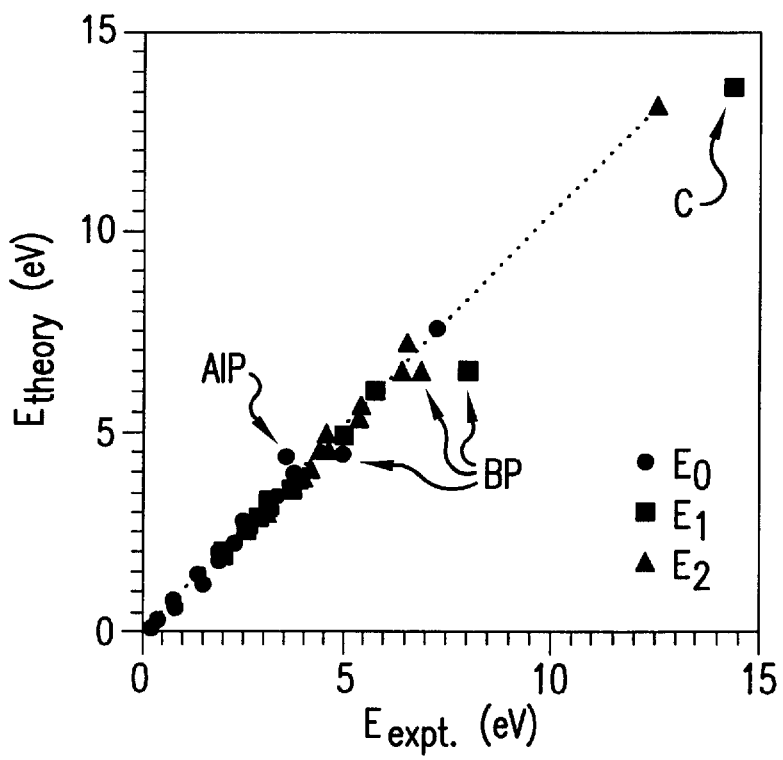
FIG. 4(b) corresponds to FIG. 4(a) but for direct energy gaps.

Louie and coworkers have performed model dielectric quasiparticle calculations for a large number of semiconductor compounds with the diamond or zincblende crystal structure; C, Si and Ge; BN, BP and BAs; AlN and GaN; binary III–V compounds containing Al, Ca, In, P, As and Sb, and some ternary alloys; and binary II–VI compounds containing Zn, Cs, S, Se and Te. For further details reference is directed to M .S. Hybersten and S. G. Louie, Phys. Rev. B34, 5390 (1986); M. P. Surh, S. G. Louie and M. L. Cohen, Phys. Rev. B43, 9126 (1991); A. Rubio, J. L. Corkill, M. L. Cohen, E. L. Shirley and S. G. Louie, Phys. Rev. B48, 11810 (1993); X. Zhu and S. G. Louie, Phys. Rev. B43, 14142 (1991) and O. Zakharov, A. Rubio, M. L. Cohen and S. G. Louie, Phys. Rev. B50, 10780 (1994). The energy gaps are shown in Table II (indirect gaps) and Table III (direct gaps), for absolute zero temperature. FIG. 4 shows a comparison of the theoretical energies with experimental values, as collated by Louie and coworkers. FIG. 4(a) shows the data for indirect energy gaps and FIG. 4(b) shows data for direct gaps. The arrows indicate significant discrepancies probably associated with the experiments. A linear fit to remaining points (dashed line) accounts for systematic errors in the calculation. Significant discrepancies occur for BP, for which little experimental data is available, and for Al-containing compounds, in which surface oxidation can strongly influence the value of the bandgaps measured by optical techniques. The difference between theory and experiment for the remaining points is less than 0.3 eV(typically 0.1 eV). A linear fit removes a small systematic error associated with the theoretical calculation, and improves the agreement for the bandgap of narrow-gap materials such as InAs and InSb (see Tables II and III). In order to obtain the most reliable set of bandgaps and average energies, the experimental values have been used where the agreement between experiment and theory is good; elsewhere the theoretical values are taken. The remaining errors are sufficiently small to allow examination of the scaling of the avalanche breakdown voltage with the average energy gaps.

Universal Dependence of $V_b$ on <$E_c$>

Having determined a reliable and consistent set of bandstructure parameters, and having established that the Kleinman-Phillips method represents a suitable calculation of average energies, we can now examine the dependence of avalanche breakdown on the band structure. Table IV shows the values of $E_g$, $E_\Gamma$, <$E_c$> and <$E_G$> for semiconductors for which experimental measurements of the ionisation coefficients have been performed: Si, Ge, GaP, InP, GaAs, $Ga_{0.47}In_{0.53}As$, $Al_{0.48}In_{0.52}As$, $Al_xGa_{1-x}As_ySb_{1-y}$, $Al_xGa_{1-x}As$ and $(Al_xGa_{1-x})_{0.52}In_{0.48}P$. The energy gaps for the alloys were obtained by linear interpolation between the constituent binary compounds (i.e. no account of compositional or positional disorder was made) The avalanche breakdown voltage $V_b$ was calculated for a 1 µm p-i-n diode, or was measured directly in the case of $Al_xGa_{1-x}AS$ and $(Al_xGa_{1-x})_{0.52}In_{0.48}P$ [J. P. R. David, M. Hopkinson and M. A. Pate, Electron. Lett. 30, 909 (1994)].

Figure 5A:
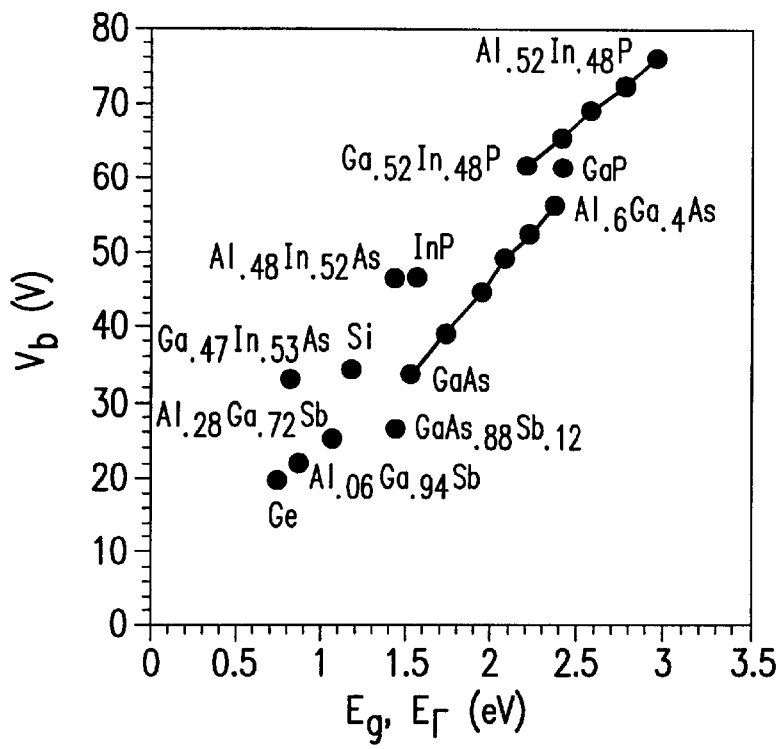
FIG. 5(a) is a graph of $V_b$ as a function of bandgap $E_g$.
Figure 5B:
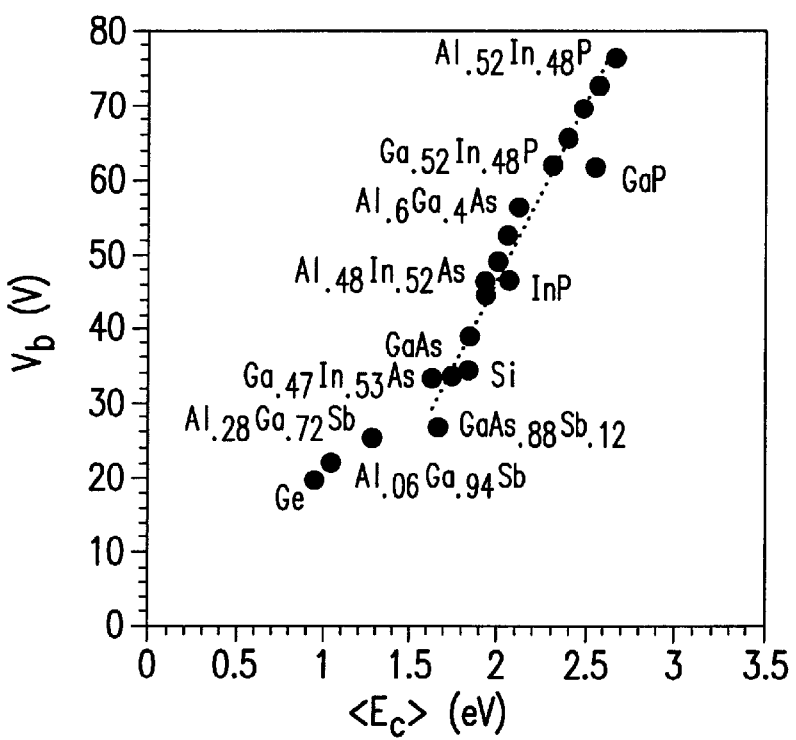
FIG. 5(b) is a corresponding graph of the breakdown voltage $V_b$ as function of the average energy $<E_c>$.

FIG. 5(a) shows the dependence of $V_b$ on $E_g$ ($E_\Gamma$ in the case of $Al_xGa_{1-x}As$ and $(Al_xGa_{1-x})_{0.52}In_{0.48}P$). Although a general trend of $V_b$ increasing with $E_g$ is followed, deviations of up to 30% are observed compared to equation (3). Hence the formula of Sze and Gibbons (equations (1) to (3) do not provide a reliable estimate of $V_b$. In marked contrast, as shown in FIG. 5(b) there is a simple linear relationship between $V_b$ and the average conduction-band energy <$E_c$> which is obeyed by all the wide bandgap ($E_g$>1 eV, <$E_c$>>1.5 eV) semiconductors with the possible exception of GaP. The relation is described by:

$$V_b = 45.8 \ast (\langle E_c \rangle - 1.01) \quad (9)$$

or $$\frac{V_b}{V_b(GaAs)} = 2.41 \frac{\langle E_c \rangle}{\langle E_c \rangle (GaAs)} - 1.37 \quad (10)$$

where the parameters have been normalised to those of GaAs. Deviations from linearity are well within the uncertainties associated with <$E_c$> and $V_b$. The apparent discrepancy for GaP may relate to an experimental artefact; we might expect a breakdown voltage of ≈78 V rather than the (1965) reported value of ≈61 V, based on extrapolation of the values for InP and $Ga_{0.52}In_{0.48}P$.

Figure 6A:
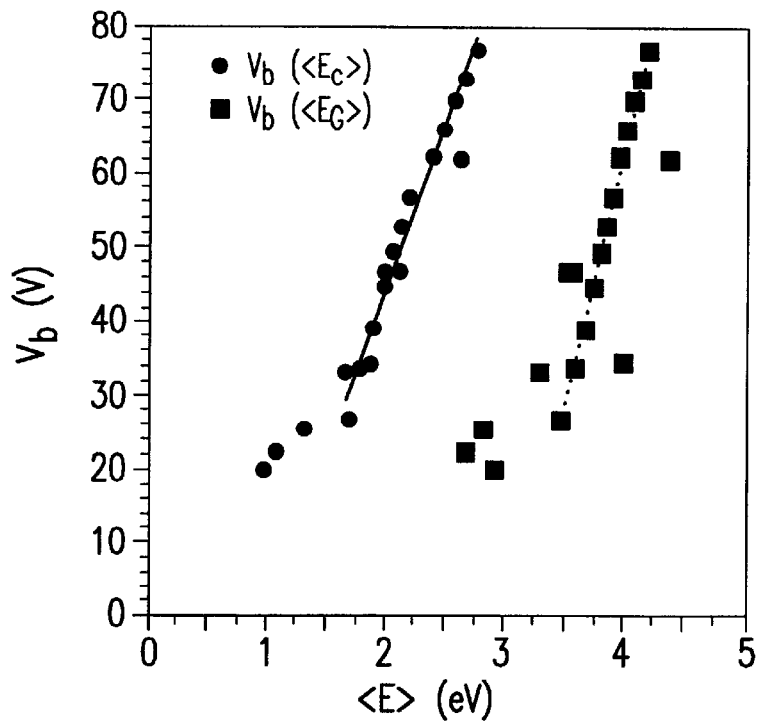
FIG. 6(a) is a graph illustrating the dependence of $V_b$ on average energy gaps $<E_c>$ for indirect and $<E_G>$ for direct transition in k space.

FIG. 6(a) compares the dependence of $V_b$ on <$E_c$> and <$E_G$>. Although there is slightly more spread in the $V_b$ ($<E_G>$) data, it cannot be conclusively decided whether $V_b$ depends primarily on $<E_c>$ or $<E_G>$, or indeed some combination due to the presence of both direct and in direct transitions of k-space. $<E_c>$ and $<E_G>$ are closely related due to the similarity of the valence bands for zincblende semiconductors. Hence this work reveals an unexpected direct relationship between $V_b$ and the Penn gap $<E_G>$.

Figure 6B:
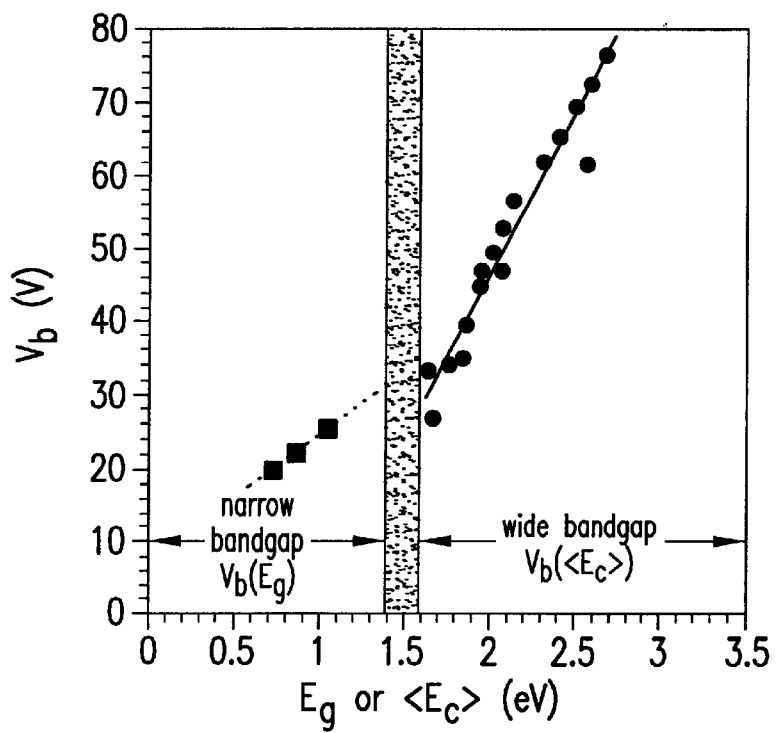
FIG. 6(b) is a graph of the breakdown voltage $V_b$ as a function of Eg for narrow bandgap materials and as a function of $<E_c>$ for wide bandgaps materials.

As shown in FIG. 6(b), narrow gap materials, including Ge, GaSb, and presumably InAs and InSb, do not obey the scaling relation (9). Indeed it is clear that the relation must fail since it predicts $V_b \leq 0$ for $<E_c> \leq 1.0$ eV. It is known that impact ionisation in narrow-gap materials such as InAs occurs predominantly in the $\Gamma$ valley; the field required for avalanche breakdown is lower than that required for intervalley transfer since the bandgap $E_g$ is small compared to the intervalley separations. Hence a description of the effective ionisation threshold energy in terms of an average conduction band energy is no longer appropriate. $Ga_{0.47}In_{0.53}As$ represents a material which is close to the boundary between narrow and wide bandgap materials. At low fields, ionisation occurs predominantly in the $\Gamma$ valley, whilst at high fields, iomsation occurs throughout the Brillouin zone. This behaviour is the origin of the different field-dependence at low- and high-fields, observed in the theoretically calculated [J. Bude and K. Hess, J. Appl. Phys. 72 (1992) 3554] and experimentally-measured [C. Canali, C. Forzan, A. Neviani, L. Vendrame E. Zanoni, R. A. Hamm, R. J. Malik, F. Capasso and S. Chanrasekhar, Appl. Phys. Lett. 66, 1095 (1995)] ionisation coefficient in $Ga_{0.47}In_{0.53}As$.

Figure 7A:
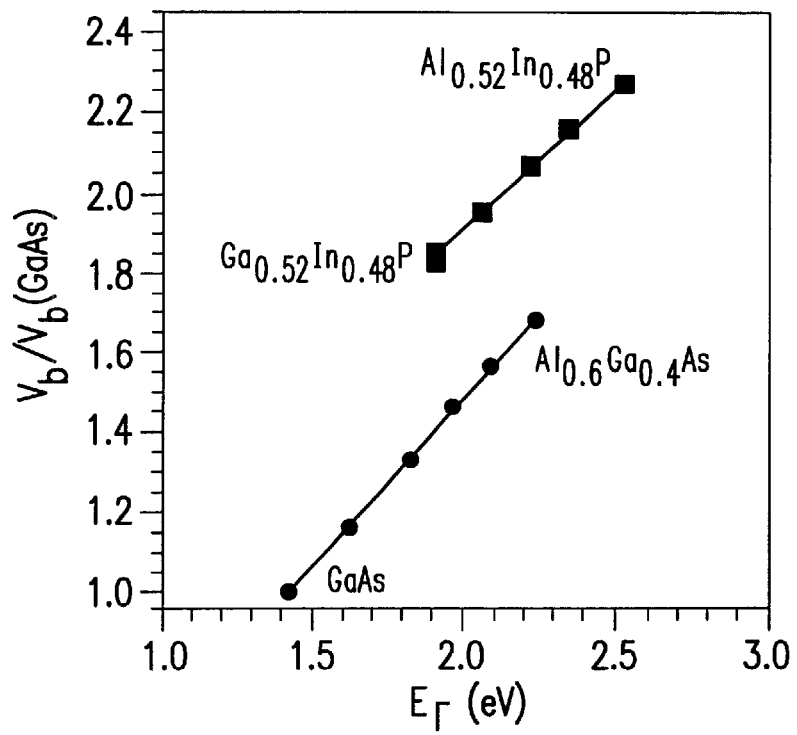
FIG. 7(a) is a graph of $V_b$ for $Al_xGa_{1-x}$ and $(Al_xGa_{1-x})_{0.52}In_{0.48}P$ as a function of direct bandgap $E_\Gamma$ for room temperature measurements.

Further evidence for the relationship of equation (9) can be obtained by comparison of the measured room-temperature breakdown voltages and the measured room-temperature energy gaps (see Table I). FIGS. 7(a) and (b) show $V_b$ plotted against $E_\Gamma$ and $<E_c>$ respectively. The dependence on $<E_c>$ rather than $E_g$ is clearly confirmed.

As an example of the use of our prescription, we compare the breakdown voltage in GaAs and InP. Despite having a smaller bandgap, the breakdown voltage in InP is $\approx 30\%$ higher than in GaAs, as a result of the larger value of $<E_c>$. Furthermore, we can predict the breakdown voltage in materials such as AlAs, AlSb and AlP etc., for which no results have been reported to our knowledge as shown in Table V. Very high breakdown voltages (>100 V) are expected in materials such as (Al, Ga) N, B(P, As) and (Zn, Cd) (S, Se) with $<E_c>$ as high as 3 eV or more.

Some comment on the Sze and Gibbons formulae (1)–(3) can be made. These expressions were obtained by fitting to experimental data for Ge, GaAs, Si and GaP. GaAs and Si have rather similar bandgaps and breakdown voltages. According to our analysis, Ge does not fit the trend obeyed by wide gap materials, and the data for GaP is erroneous. Hence the Sze and Gibbons expressions appear to be without reliable basis.

Physical Interpretation

Figure 7B:
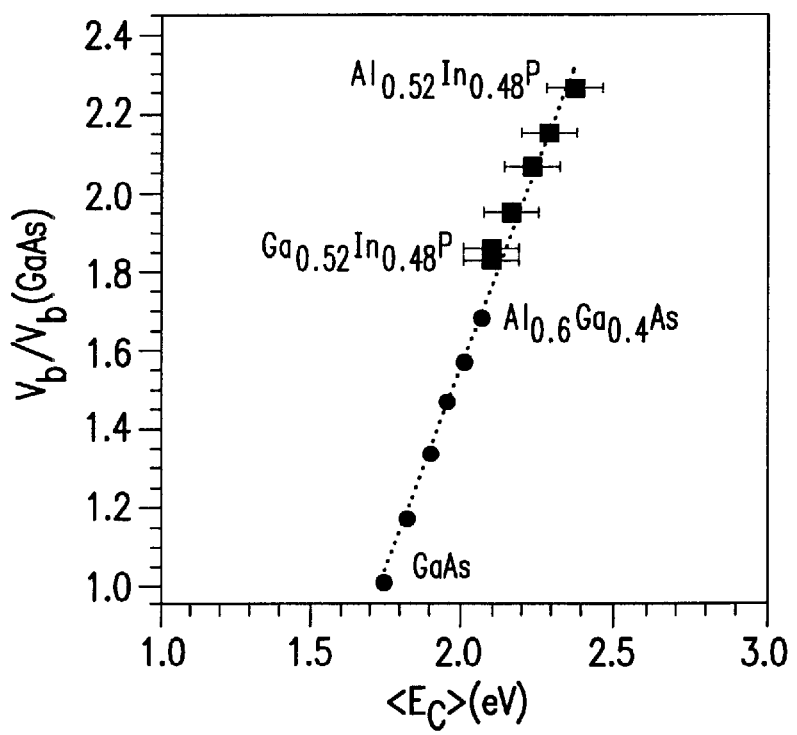
FIG. 7(b) corresponds to FIG. 7(a), but as a function of $<E_c>$.
Figure 8A:
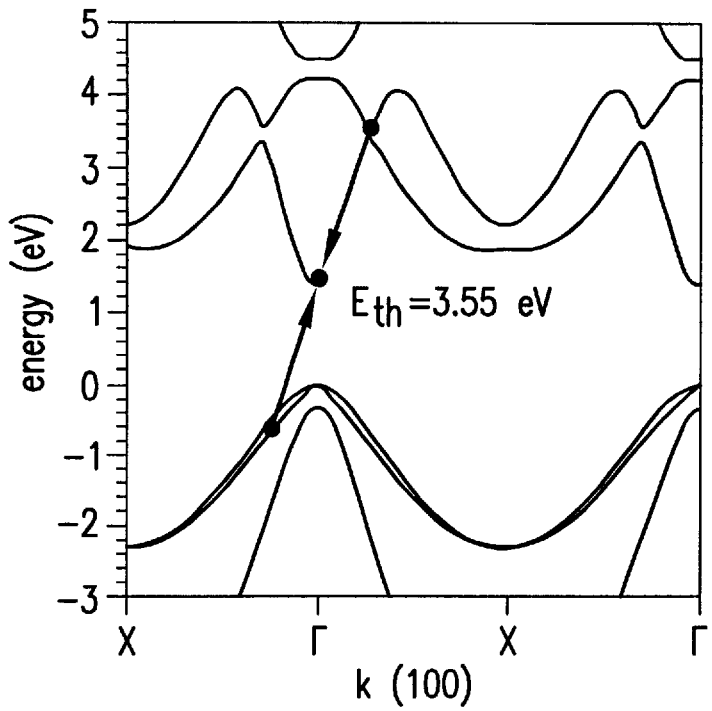
FIG. 8(a) is an energy diagram illustrating threshold energies for electron-initiated impacted ionisation processes along the (100) axis in respect of the final electron states in the $\Gamma$ valley.
Figure 8B:
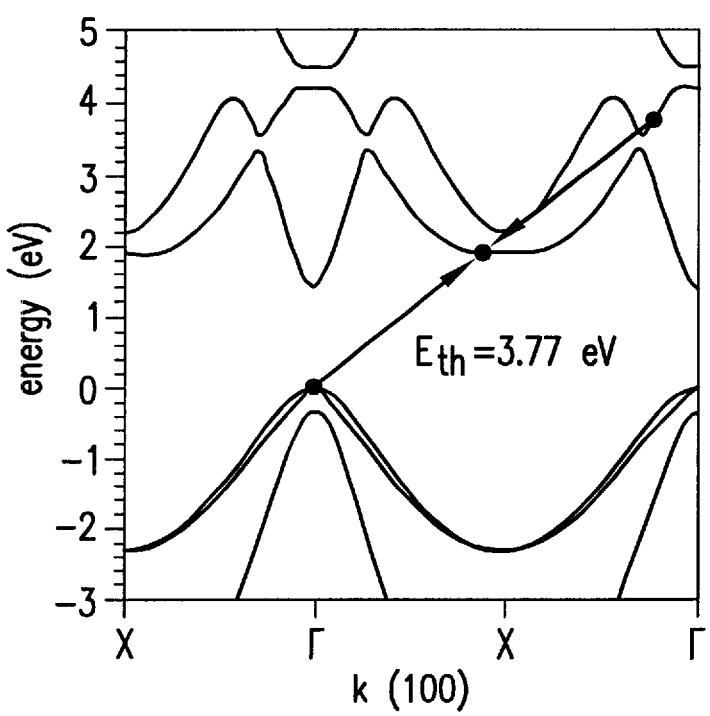
FIG. 8(b) is a graph corresponding to FIG. 7(a) for final electron states in the X valley.
Figure 9A:
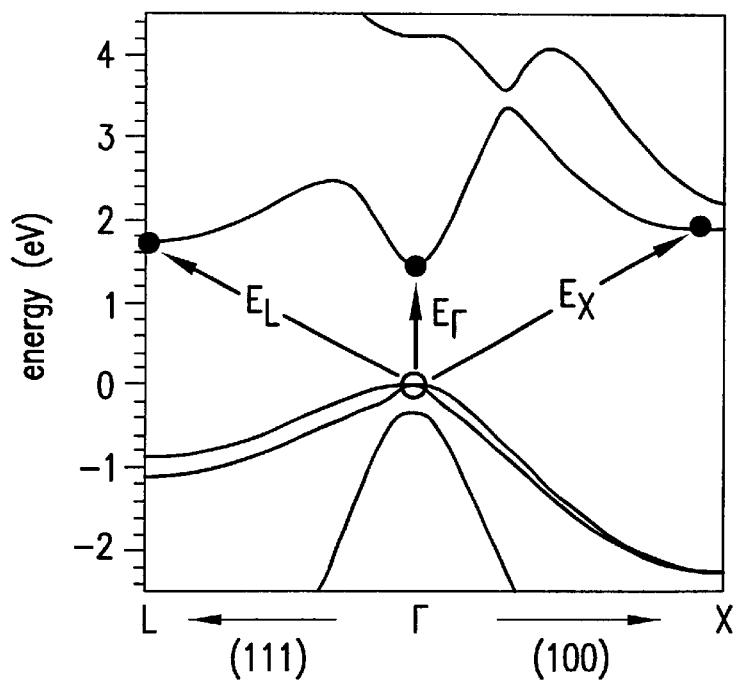
FIG. 9(a) is an energy diagram of the barriers associated with pair-production for final states in the $\Gamma$, X and L minima.
Figure 9B:
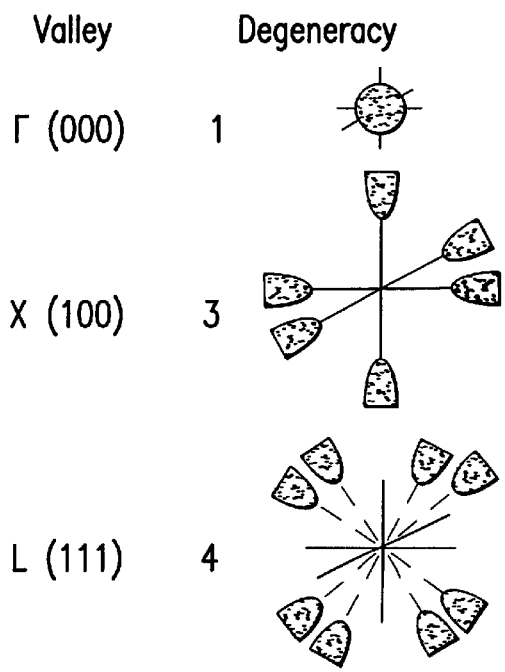
FIG. 9(b) illustrates the degeneracy of conduction-band values in a tetrahedrally-coordinated semiconductor.

We interpret the existence of equation (9) as evidence for the distribution between conduction-band minima of final electron states of the pair-production process. FIG. 7 shows the calculated thresholds for electron initiated processes with all wavevectors directed along (100). For a similar initial state (when umklapped into the first Brillouin zone), the process produces final states of different symmetry, either in the $\Gamma$ or the X valleys. Since the excess energy of the final electron states (relative to the minimum potential energy of the appropriate valley) is small, the final states have well-defined symmetry and are described by effective-mass properties of the minimum. Hence the effective energy barrier for impact ionisation can be expected to scale with the bandgap energy from the valence band maximum to the $\Gamma$, X or L conduction band minima as shown in FIG. 8. Due to the high scattering rates experienced by carriers which initiate impact ionisation, their momentum is randomised and hence initial states corresponding to pair-production with final electron states in the different conduction-band minima are widely available. If the intervalley separations are small compared to the bandgap, the distribution of final electron states between $\Gamma$, X and L valleys is determined primarily by the density of states, which is given to lowest order by the degeneracy of the valleys, as illustrated in FIG. 9. The energy barrier for pair-production is thus largely determined by $<E_C>$.

Conclusions

The relationship between $V_b$ and $<E_c>$ reveals a previously unexpected direct connection between the most important parameter of high field breakdown and the most basic physical properties of the crystal for wide bandgap semiconductors. Thus $<E_c>$ can be used as a guide in the choice of materials for use in electronic devices with optimised breakdown characteristics. This can be seen from equation (9) which can be stated generally as:

$$V_b = n<E_c> - m \qquad (11)$$

where m and n are constants.

Figure 10A:
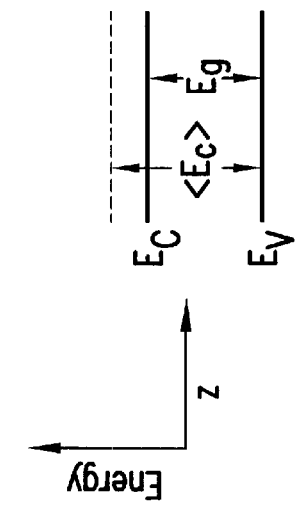
FIG. 10 illustrates how energy levels may be engineered in accordance with the invention, wherein in FIG. 10(a) material has a relatively narrow bandgap $E_g$ and a relatively small value of $<E_c>$, in FIG. 10(b) the material has a relatively narrow bandgap $E_g$ and a relatively large $<E_c>$, and in FIG. 10(c) a relative wide bandgap $E_g$ and a relatively large $<E_c>$.
Figure 10B:
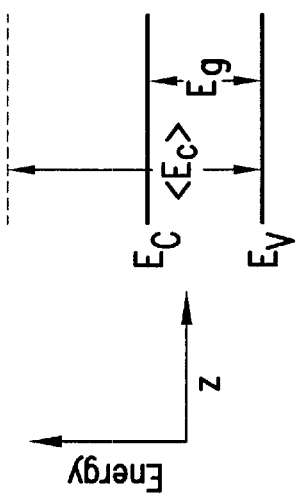
Figure 10C:
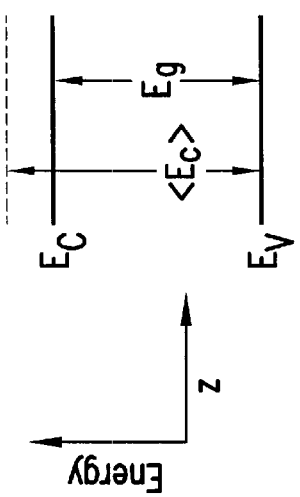

We are therefore able to somewhat independently adjust within the same material the breakdown voltage and some other property of the bands (typically the bandgap) affecting, for example, the low-field transport properties, optical absorption, etc. FIG. 10 illustrates materials with (a) narrow bandgap and low $<E_c>$, (b) narrow bandgap and high $<E_c>$ and (c) wide bandgap and high $<E_c>$. Control of the breakdown properties is achieved by selection of appropriate semiconductor compounds, design of semiconductor alloys or strained layers, or "band-structure" engineering.

II. Device Structures—Design Concepts

We have shown hereinbefore that the concept of "bandgap engineering" of impact ionisation coefficients, by means of changing the bandstructure or potential discontinuity at the Brillouin-zone centre, fails for common materials such as GaAs. This is because both initial- and final-state carriers are scattered throughout the zone. In order to modify the ionisation coefficients, we must engineer the entire Brillouin zone. We replace the concept of "bandgap engineering" with "bandstructure engineering". Here we show applications of this concept to graded-gap, superlattice, multiple quantum well and other structures.

(a) Selection of Materials

The values of $E_g$ and $<E_c>$ as shown in Table II can be used as criteria for selecting materials for fabricating semiconductor devices. For example, for high-speed, high-power transistors, the FET channel or bipolar base-collector junction should be fabricated from a material with high transient velocity (i.e. low effective mass and high intervalley separation, implying low $E_g$) and high breakdown voltage (implying high $<E_c>$). However $E_g$ should be sufficiently large that Zener breakdown does not occur at lower field than avalanche breakdown (typically $E_g > \approx 0.8$ eV). This also constrains the choice of material to the wide-bandgap semiconductors, as defined hitherto, which obey the scaling relation described by equation (9).

Figure 11A:
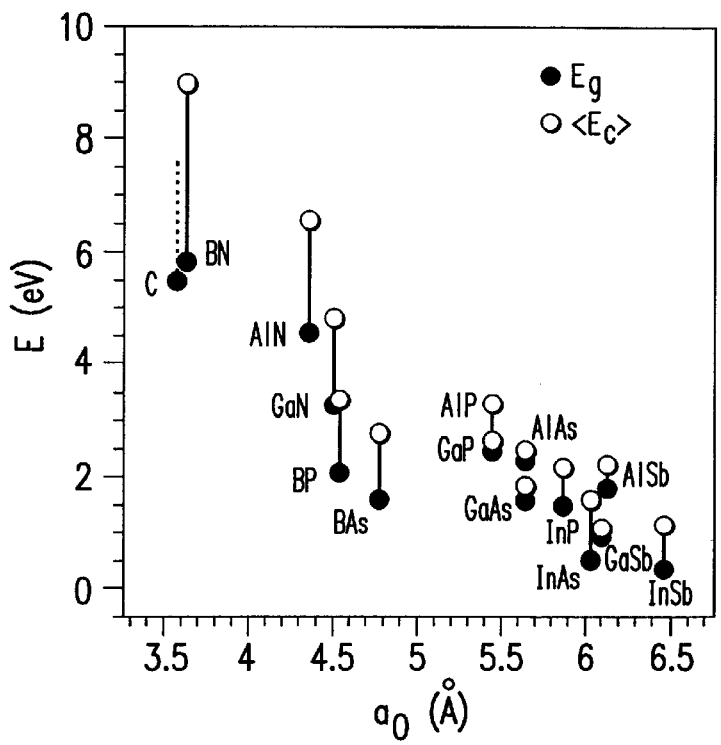
FIG. 11(a) illustrates the minimum energy gap $E_g$ and the corresponding value of $<E_c>$ for a number of III–V compounds.
Figure 11B:
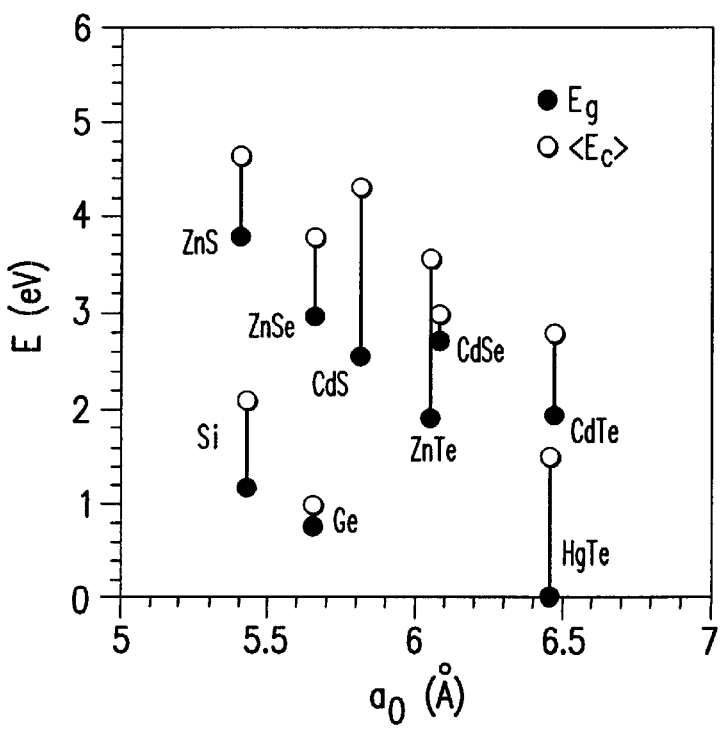
FIG. 11(b) corresponds to the diagram of FIG. 11(a), for a number of group IV elements and III–VI compounds.

FIG. 11 shows the values of $E_g$ and $<E_c>$ plotted against the value of the lattice constant. FIG. 11a is a plot for III–V compounds and FIG. 11b is for Group IV elements and II–VI compounds. The additional data for HgTe in FIG. 11b is from A. B. Chen and A. Sher, J. Vac. Sci. Technol. 21, 138 (1982). The energy gaps depend both on the volume of the crystal unit cell and on the chemical composition, decreasing with metallicity and increasing with ionicity. These trends are apparent in both $E_g$ and $<E_c>$. The vertical lines connect $E_g$ and $<E_c>$ for each material.

Wide-gap materials including Nitrides, ZnS, ZnSe, etc. also have large values of $<E_c>$ and hence large breakdown voltages, and hence are suitable for high temperature, high power electronics. The largest value of $<E_c>-E_g$ relative to $E_g$ is exhibited by In-cation and N-anion compounds; hence InN (not shown) may be an attractive material for this purpose.

Thus, the data is Table II and FIG. 11 gives the device designer basic information to enable a specific device to be constructed in accordance with the invention, with $<E_c>$ and $E_g$ being selected according to the desired operating parameters for the device.

(b) Design of Semiconductor Alloys

Also, instead of using individual materials, alloys can be used. For example, a compound with small $E_g$ ($\approx 0.8$ eV) and large $<E_c>$ (>2 eV) does not exist. However such a material can be created by designing appropriate lattice-matched or strained alloys. As an example, GaAs and InAs have bandgaps differing by more than 1 eV, but quite similar values of $<E_c>$. Hence the alloy $In_{0.53}Ga_{0.47}As$ lattice matched to InP has a bandgap ($\approx 0.8$ eV) lower than that of GaAs (and hence has higher transient velocity), but has rather similar ionisation coefficients.

Another attractive material system is $Hg_xCd_{1-x}Te$, which can be grown with bandgaps between 0 eV and $\approx 1.8$ eV. For a composition x$\approx$0.6, the bandgap $E_g$ is $\approx$0.8 eV and $<E_c>$ is estimated as $\approx$2.5 eV.

Table VI shows data for several III–V ternary alloys, lattice-matched to the substrate materials GaAs, InP, InAs and GaSb. The values of $<E_c>$ are determined by linear interpolation between binary constituents. The estimated breakdown voltage for a 1 $\mu$m p-i-n diode is calculated from equation (9) (discussed in more detail hereinafter). Values in parenthesis are for narrow-bandgap materials for which equation (9) is not expected to be valid. A wide range of $V_b$ can be obtained on each substrate material. The highest values of $V_b$ are obtained in materials containing AlP or AlSb.

(c) Use of Strained Layers

Furthermore, the growth of strained pseudomorphic $In_xGa_{1-x}As$ on GaAs substrates results in compressive strain which increases the bandgaps. $E_g$ is still smaller than in GaAs, resulting in confinement in the InGaAs (e.g. in GaAs/InGaAs pseudomorphic HEMTs); however $<E_c>$ is larger resulting in increased breakdown voltage compared to GaAs. This was observed in GaAs/InGaAs superlattices [J. P. R. David, M. J. Morley, A. R. Wolstenholme, R. Grey, M. A. Pate, G. Hill, G. J. Rees and P. N. Robson, Appl. Phys. Lett. 61, 2042 (1992)], although it was attributed to a different physical mechanism.

The above approach involves taking a narrow bandgap material and compressing it, causing an increase in $E_g$ but also an increase in $<E_c>$ due to the positive value of the Brillouin-zone-averaged pressure coefficient. An opposite approach is to take a wide-bandgap, high-$<E_c>$ material and apply tensile strain. The rate of decrease with pressure of the bandgap is about 4 times that of $<E_c>$. Examples include $In_{0.5}Ga_{0.5}P$ on InP, or GaN on GaAs. The large lattice mismatch constrains the strained layer thickness to very small values, to avoid generation of dislocations.

(d) Graded-gap Structures:

As previously discussed, graded gap materials have been used in devices such as APDs with minority carriers e.g. electrons generated in a wide band-gap absorption region being injected into the graded material, with an enhanced ionisation probability (relative to the hole probability at the same applied bias) due to carrier acceleration by the graded layer. In a typical case, carrier generation occurs in a narrow-gap layer, and carrier multiplication in a wide-gap graded layer. Hence a large potential barrier to the injection of carriers exists at the heterojunction, as in the case of the SAM APD. This can cause low efficiency and slow response due to carrier pile-up, as previously discussed.

In accordance with the present invention structures may be fabricated in which $E_g$ and $<E_c>$ are independently controlled by compositional grading.

Figure 12A:
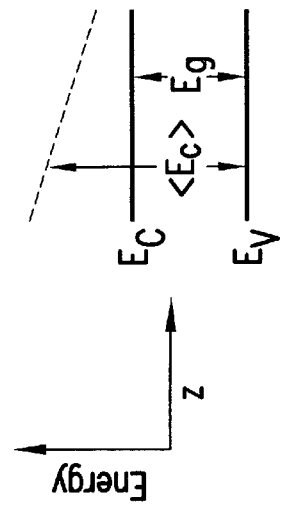
FIG. 12 illustrates various band-edge profiles for compositionally graded structures possible according to the present invention.
Figure 12B:
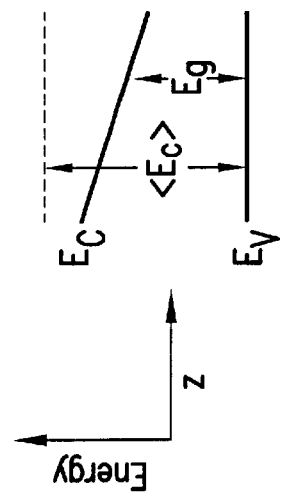
Figure 12C:
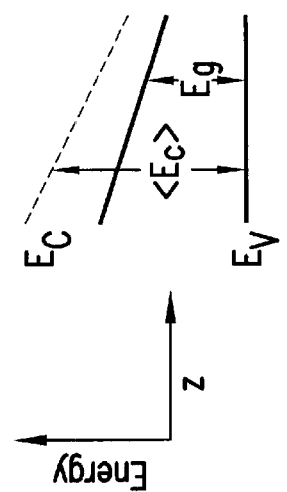

Examples of how $E_g$ and $<E_c>$ can be independently controlled across the depth 2 of a semiconductor device is shown schematically in FIG. 12. FIG. 12a shows the band-edge profile where $E_g$ is constant and $<E_c>$ is graded. FIG. 12b shows the band-edge profile where $<E_c>$ is constant and $E_g$ is graded. FIG. 12c shows the band-edge profile where both $E_g$ and $<E_c>$ are graded.

Figure 13A:
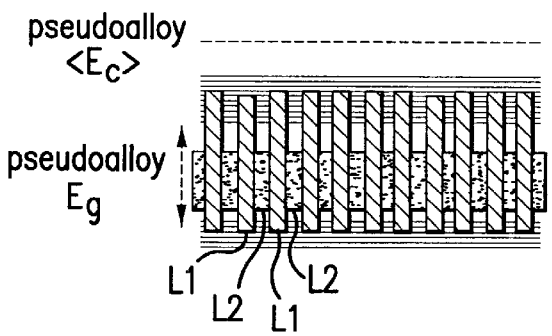
FIG. 13(a) illustrates the band structure of a pseudoalloy with layer thicknesses ≈1 nm.
Figure 13B:
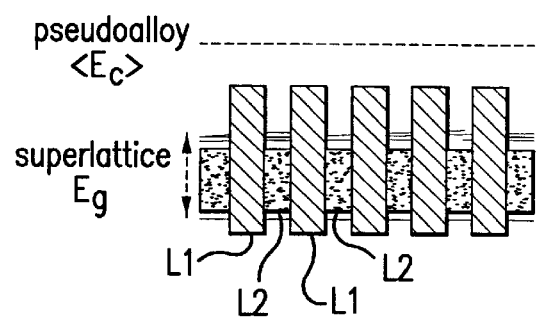
FIG. 13(b) illustrates the band structure of a pseudoalloy with layer thicknesses 1≈10 nm.
Figure 13C:
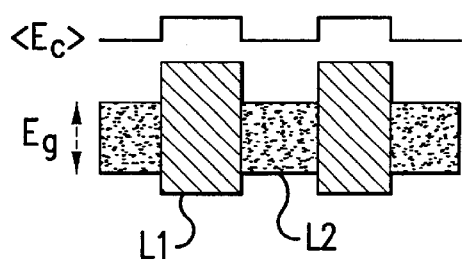
FIG. 13(c) shows the band structure of a pseudoalloy with layer thickness >10 nm.
Figure 14A:
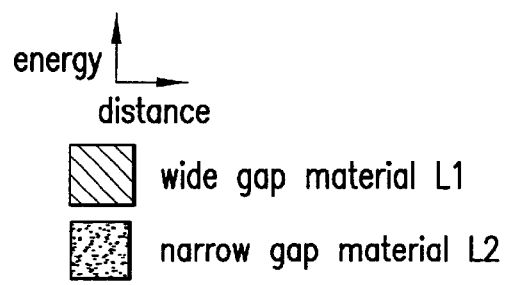
FIGS. 14(a)–(d) illustrates the band structures of quantum well structured with different values of $<E_c>$ and $E_g$ selectible quasi-independently for separate control of light absorption and breakdown.
Figure 14A:
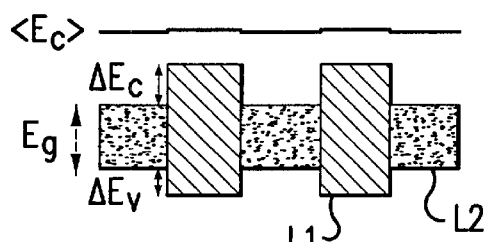
Figure 14B:
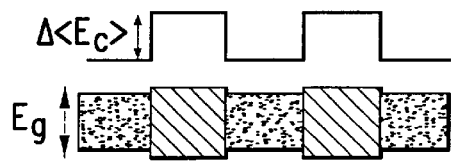
Figure 14C:
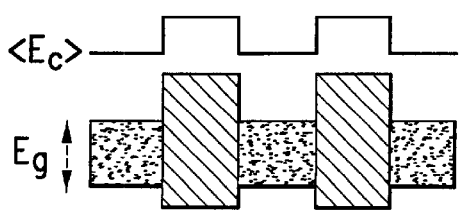
Figure 14D:
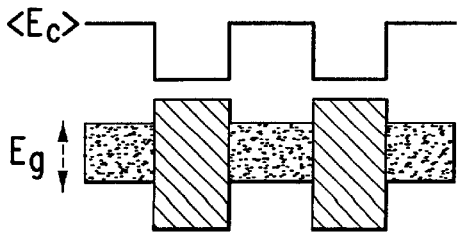

(e) "Pseudo-alloy" Superlattices:

Superlattices in which the layer widths are sufficiently small compared to electron penetration lengths in the barriers (typically a few monolayers, or $\approx$1 nm) behave in some respects as pseudoalloys, as far as optical absorption and low-field transport are concerned. An example of a superlattice pseudo-alloy is shown in FIG. 13(a) and consists of multiple layers L1, L2 etc typically formed by molecular beam epitaxy, of materials with relatively wide and narrow bandgap, $E_{g1}$, $E_{g2}$. The pseudoalloy exhibits an effective bandgap $E_g$ which is a function of $E_{g1}$ and $E_{g2}$, and also a conduction band average energy $<E_c>$ as shown in FIG. 13(a). For high-field transport, it has been shown [J. P. R. David, J. Allam, A. R. Adams, J. S. Roberts, R. Grey, G. Rees and P. N. Robson, Appl. Phys. Lett. 66, 2876 (1995)] that pseudo-alloy behaviour occurs instead when the layer thicknesses do not exceed the carrier mean-free path at high energies (typically $\approx$10 nm). Hence for intermediate dimensions (1–10 nm) the narrow-gap regions act as quantum wells for the absorption of light, whereas the breakdown characteristics are determined by $<E_c>$ which in turn is determined by the composition of the pseudoalloy. This is shown in FIG. 13(b). Because the absorption edge is determined primarily by the bandgap of the well (plus the confinement energy), and the breakdown characteristics by the pseudoalloy composition, a greater difference between $E_g$ and $<E_c>$ can be expected compared to a 'true' alloy. This concept is useful in cases where it is not desired to enhance the ionisation rates by means of the heterojunction discontinuities, and where sensitivity to long-wavelength light and high breakdown voltage are required. One example is for an optically-triggered IMPATT oscillator, for self-mixing optical heterodyne detection. Material systems for the fabrication of this structure include $In_{0.53}Ga_{0.47}As$/InP, etc. Thus, for a photodetector, a selection of the materials for the layers L1, L2, in a structure shown in FIG. 13(b) allows $E_g$ to be selected depending on the wavelength of the incoming light, and $<E_c>$ selected depending on the desired ionisation breakdown characteristics. Referring now to FIG. 13(c), if the thickness of the layers L1, L2 exceed that which allows change carriers to relax their energy and momentum ($\approx$50 nm), then the carriers follow the variation in $<E_c>$ and the structure behaves as a series of heterojunctions.

(f) Multiple Quantum Well:

So far, the scaling relation (9) discussed in the Analysis section hereinbefore, makes no statement regarding the relative size of the electron ($\alpha$) and hole ($\beta$) ionisation coefficients, since the effective threshold for electrons and holes are not distinguished. The small differences in $\alpha$ and $\beta$ which occur for most of ithe III–V materials are regarded as due to small differences in the electron and hole cross-sections for impact ionisation or phonon scattering. Nevertheless, it is possible to design quantum well structures in which either $\alpha$ or $\beta$ is selectively enhanced. In the structures previously considered, the conduction- and valence-band discontinuities at the zone centre ($\Delta E_c$ and $\Delta E_v$) were the parameters determining the behaviour, giving effective ionisation thresholds in the wells of $E_{th}^{(e)} - \Delta E_c$ and $E_{th}^{(h)} - \Delta E_v$, for electrons and holes respectively.

In structures in accordance with the invention, it is the discontinuity in $<E_c>$, together with $\Delta E_v$, which determines the ionisation probability. This will be explained with reference to FIG. 14. In FIG. 14, layers L1, L2 with relatively wide and narrow bandgaps between their conductive and valance bands are deposited to produce a series of quantum wells. Each well exhibits a discontinuity in the conduction and valance bands $\Delta E_v$; $\Delta E_c$. In accordance with the invention, the effective ionisation threshold in the wells becomes $<E_c> - \Delta <E_c> + E_v$ for electrons and $<E_c> - \Delta E_v$ for holes, where $<E_c>$ is the average conduction band energy in the well material, $\Delta <E_c>$ is the difference between $<E_c>$ for the well and barrier materials, and $\Delta E_v$ is the valence-band discontinuity at the zone centre. The heterojunction discontinuities can be estimated from the calculated energy bands using the dielectric mid-gap energy concept [M. Cardona and N. E. Christensen, Phys. Rev. B. 35, 6182 (1987)]. Two material systems have been identified as offering the largest selective enhancement of electrons over holes: CdTe/Hg$_x$Cd$_{1-x}$Te and AlAs$_{0.08}$Sb$_{0.92}$/GaSb. However, it has to be noted that these material systems are also the ones identified by Capasso [F. Capasso, in *Semiconductors and Semimetals* (ed. W. T. Tsang, Academic, New York) 22D (1986) 1], based on an optimisation of the parameters $E_{th}^{(e)} - \Delta E_c$ and $E_{th}^{(h)} - \Delta E_v$. Thus, in accordance with the invention, a quasi-independent control of $\Delta <E_c>$ and $\Delta E_c$ allows optimisation of the structure both for optical absorption and carrier transport, and for ionisation rate enhancement.

Examples of devices which make use of these design considerations will now be described.

(III) Detailed Examples of Device Structures

FETs

Figure 15:
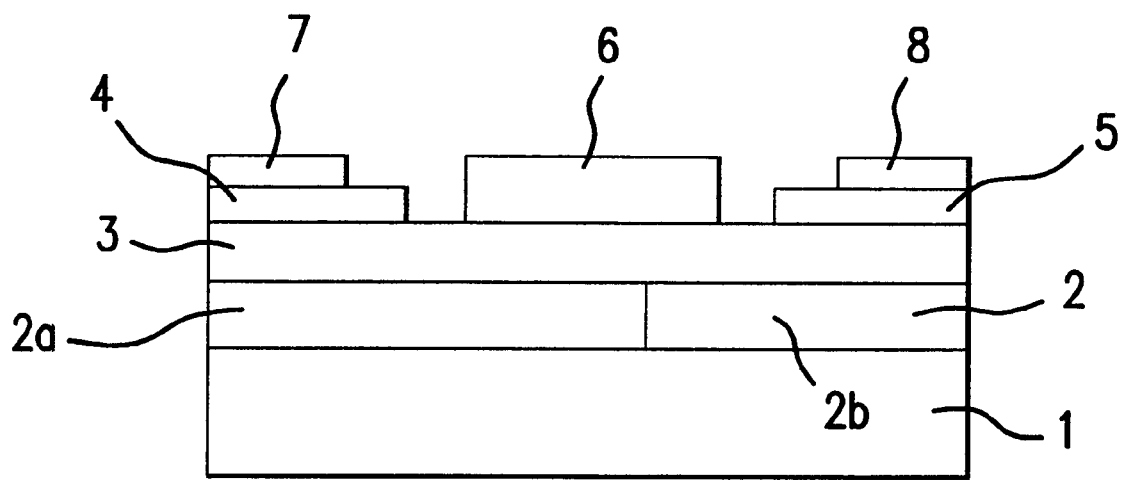
FIG. 15 is a cross-sectional diagram of a first embodiment of FET manufactured in accordance with the invention.

Referring to FIG. 15, a first embodiment of a HEMT, according to the present invention, comprises a substrate 1, a channel layer 2 on the substrate 1, a supply layer 3 on the channel layer 2, n+ source and drain contact regions 4, 5 and a gate 6 formed on the supply layer 3, and source and drain electrodes 7, 8 forming ohmic contacts to the source and drain contact regions 4, 5 respectively. In use, a non-uniform field is produced in the channel 2, which is relatively low underneath most of the gate 6, but relatively high at the drain end of the gate. In accordance with the invention, the composition of the channel 2 can be tailored to optimise the characteristics of both the high field and low field regions of the channel.

The channel layer 2 has a low electric field region 2a and a high electric field region 2b that are made of materials with different values of $<E_c>$. In the high field region 2b, the value of $<E_c>$ is selected e.g. from the values shown in Table II, to be relatively high to avoid the risk of avalanche breakdown under the effect of the field produced beneath the gate 6. The material for the low field region 2a is selected to have a low value of $E_g$, in order to maximise the effective carrier velocity under the gate.

In one implementation, the low electric field region 2a of the channel layer 2 comprises In$_{0.53}$Ga$_{0.47}$As and the high electric field region 2b comprises In$_{0.52}$Al$_{0.48}$As. The risk of impact ionisation in the high electric field region 2b is therefore greatly reduced by the relatively high $<E_c>$ value. However, the relatively low value of $E_g$ in the low electric field region 2a maximizes the effective carrier velocity under the gate as well as providing a low source access resistance. Also, the potential barrier between the electron supply layer 3 and the channel 2 is large, leading to high sheet carrier density and high modulation efficiency.

Figure 16:
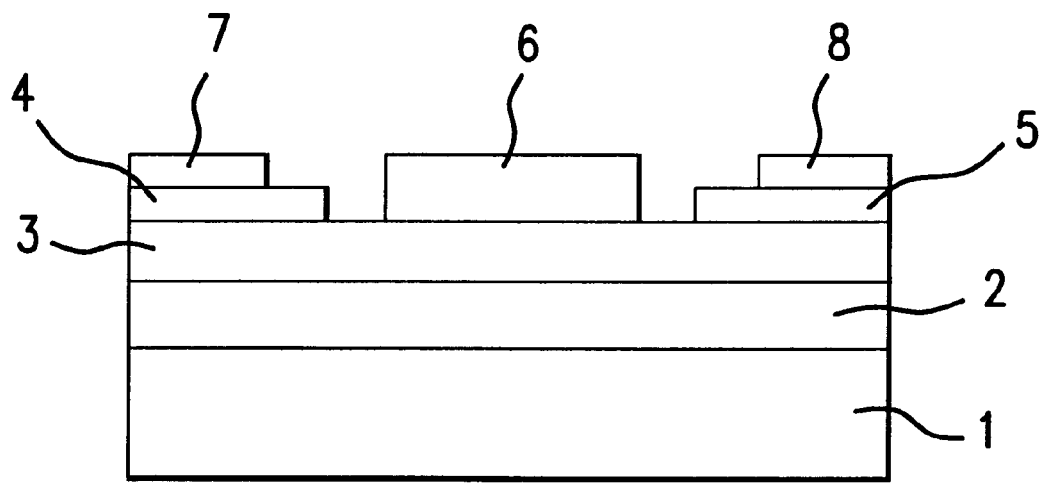
FIG. 16 corresponds to FIG. 13, for a second embodiment of FET manufactured in accordance with the invention.

Referring to FIG. 16, a second embodiment of a HEMT, according to the present invention, comprises a substrate 1, a channel layer 2 on the substrate 1, an n-type supply layer 3 on the channel layer 2, n+ source and drain contact regions 4, 5 and a gate 6 formed on the supply layer 3, and source and drain electrodes 7, 8 forming ohmic contacts to the source and drain contact regions 4, 5 respectively.

The composition of the channel layer 2 is graded from In$_{0.53}$Ga$_{0.47}$As under the source electrode 7 to In$_{0.52}$Al$_{0.48}$As under the drain electrode 8. The grading of the composition of the channel layer 2 is arranged such that the value of $<E_c>$ increases from the source electrode end to the drain electrode end. By grading the channel layer composition, rather than using discrete regions, the balance between carrier mobility and breakdown field strength can be optimised throughout the length of the channel layer 2, and any barrier that may occur at the junction between regions 2a, 2b in FIG. 15 is avoided.

In a modification, the supply layer 3 is also graded, to optimise the combination of high carrier concentration in the low field region and control of the real space transfer in the high field region. The graded layer may be lattice matched to the substrate (e.g. In$_{0.53}$Ga$_{0.47}$As graded to In$_{0.52}$Al$_{0.48}$As on InP substrate), or may be pseudomorphically strained with a constant strain parameter, or may be strained with a strain which varies along the channel due to the change in composition. Alternatively, the strain in the channel can be generated and controlled by means of a surface stressor layer, which has a different lattice constant to the substrate. The strain can be varied by appropriate control of the lattice constant of the stressor layer. The strain in the channel, however it is achieved, modifies the bandstructure and hence can be used to tailor materials for operation at low or high fields.

Non-alloyed source and drain contacts can be used, if the supply layer 3 is also suitably graded in terms of $<E_c>$. The grading of the supply layer 3 needs to be such that the heterojunction discontinuity between the supply and channel layers 2,3 is reduced beneath the source and drain electrodes 7,8. Reducing this discontinuity results in reduced contact resistance.

Figure 17:
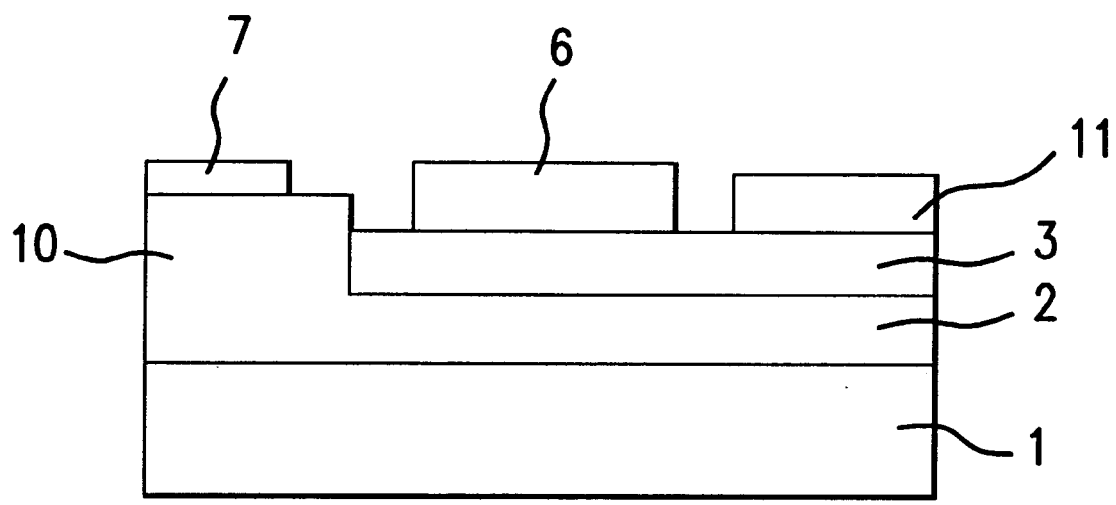
FIG. 17 is a corresponding cross-sectional view of a third embodiment of FET manufactured in accordance with the invention.

Referring to FIG. 17, a third embodiment of a HEMT, according to the present invention, comprises an InP substrate 1, a channel layer 2 on the substrate 1, an n-type supply layer 3 on the channel layer 2, a source contact region 10 extending up from the channel layer 2, a gate 6 formed on the supply layer 3, source electrode 7, forming an ohmic contact to the source contact region 10, and a drain electrode 11, forming an unannealed Schottky contact to the supply layer 3.

The channel layer 2 is formed from InAs, which has a small bandgap, under the source contact. The source contact region 10 is also formed from InAs and, consequently, the device of FIG. 17 has both a low source access resistance and a low source contact resistance. The channel layer 2 is graded in terms of <$E_c$> in a manner similar to that of the embodiment of FIG. 14.

Carriers in the high-field gate-drain region are not confined to the two-dimensional electron gas (2DEG). Therefore, a "spiking" ohmic contact is not required at the drain electrode 11, in order to extract carriers from the potential well. Instead, the present embodiment uses an unannealed Schottky contact, trading increased potential drop across the channel for reduced contact resistance.

Figure 18:
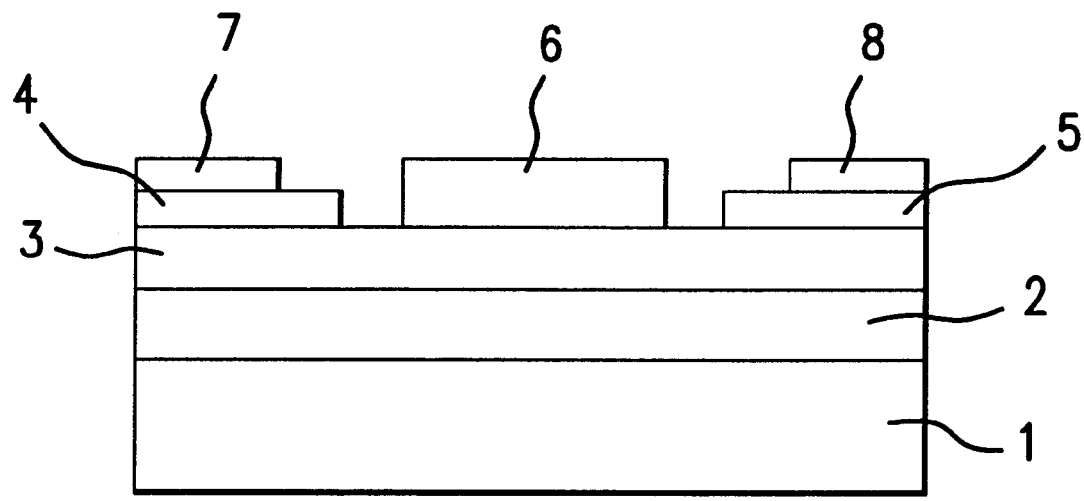
FIG. 18 illustrates a fourth embodiment of FET manufactured in accordance with the invention.

Referring to FIG. 18, a fourth embodiment of a HEMT, according to the present invention, comprises an InP substrate 1, a channel layer 2 on the substrate 1, an n-type supply layer 3 on the channel layer 2, n+ source and drain contact regions 4, 5 and a gate 6 formed on the supply layer 3, and source and drain electrodes 7, 8 forming ohmic contacts to the source and drain contact regions 4, 5 respectively.

The composition of the channel layer 2 is graded along its length to induce a varying strain in its lattice. This strain affects the value of <$E_c$>. Accordingly, the grading of the composition of the channel layer 2 can arranged such that <$E_c$> increases from the source electrode end to the drain electrode end, in order to optimise the voltage breakdown/carrier mobility relationship along the channel.

The required strain in the channel layer can also be externally applied.

Figure 19:
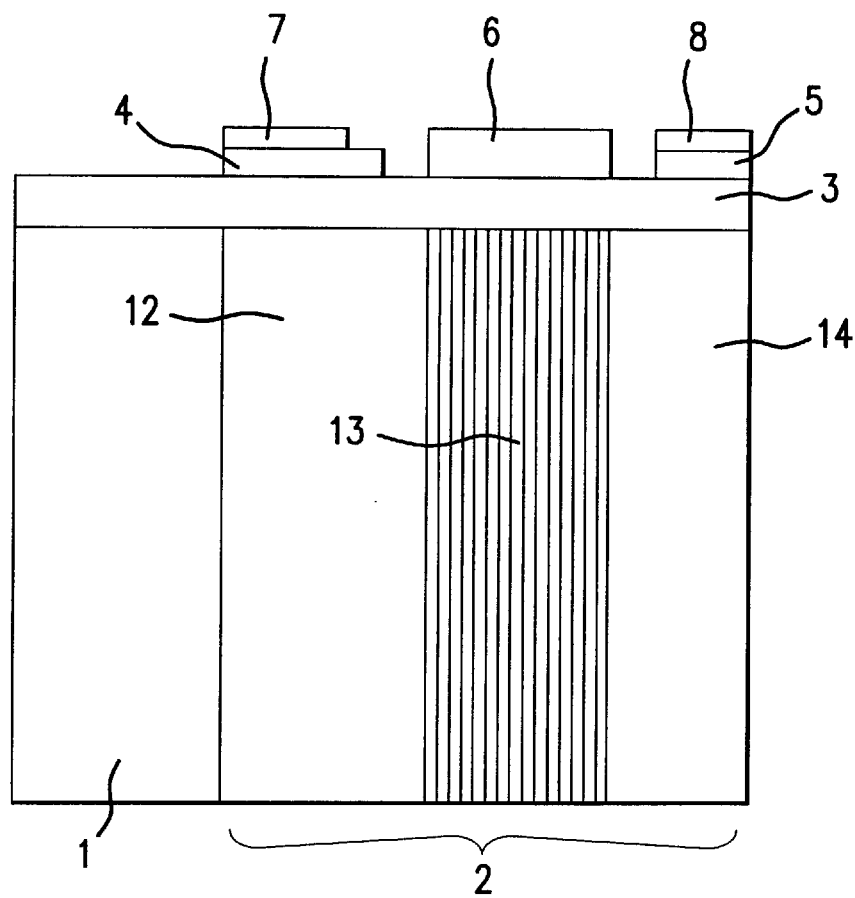
FIG. 19 illustrates a fifth embodiment of FET manufactured in accordance with the invention.

Referring to FIG. 19, the manufacture of a fifth embodiment of the present invention will now be described. A HEMT is produced by growing a first relatively thick layer 12 $In_{0.53}Ga_{0.47}As$ on an InP substrate 1. Thereafter, a plurality of layers 13, each a few atoms thick, are epitaxially grown over the first layer 12. The composition of the layers 13 varies and is carefully selected such that the value of <$E_c$> for each new layer is greater than that of the previously grown layer according to a predetermined design. Alternatively, a graded layer can be used. Finally, a second relatively thick layer 14 of $In_{0.52}Al_{0.48}As$ is epitaxially grown over the uppermost of the layers 13.

The multilayer or graded structure thus produced, is cleaved vertically into slivers, one of which is shown in FIG. 19. The ends of the layers 12, 13, 14 are exposed on the cleaved faces of the sliver and form a graded channel layer 2. An n-type supply layer 3 is then epitaxially grown on one of the cleaved faces of the sliver. Then, source and drain contact regions 4, 5 and a gate 6 are formed on the supply layer 3. Finally, source and drain electrodes 7, 8 are formed on the contact regions 4, 5.

A plurality of HEMTs may be formed side-by-side on one sliver which can then be cleaved to provide separate devices. The remnant of the substrate 1 may also be removed. After separation, the devices can be encapsulated in the normal way.

Figure 20:
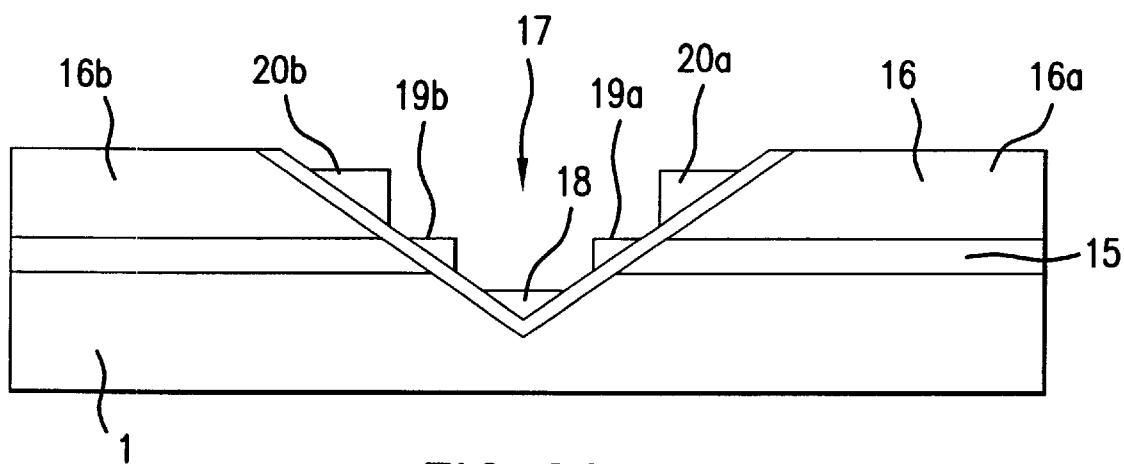
FIG. 20 illustrates a sixth embodiment of FET in accordance with the invention.

Another example of FET manufactured in accordance with the method of the invention is shown in FIG. 20. In this example, devices are formed in a V-groove in the substrate. Initially, a vertically graded layer 15 is grown on substrate 1, which is overlaid by a further layer 16 of the same conductivity type as the substrate. A V-groove 17 is formed in the device. First and second transistors are formed on opposite sides of the V-groove. A source region 18 is formed in the bottom of the groove and gate regions 19a, 19b are formed on the sides of the groove. Drains 20a, 20b for the respective transistors are formed in contact with regions 16a, 16b. The grading of the channel regions 16 is controlled to optimise breakdown voltage and bandgap in the manner previously described.

The FETs according to the invention have been described with reference to n-channel devices. However, it will be appreciated that it can equally be applied to p-channel devices.

Bipolar Transistors

Figure 21:
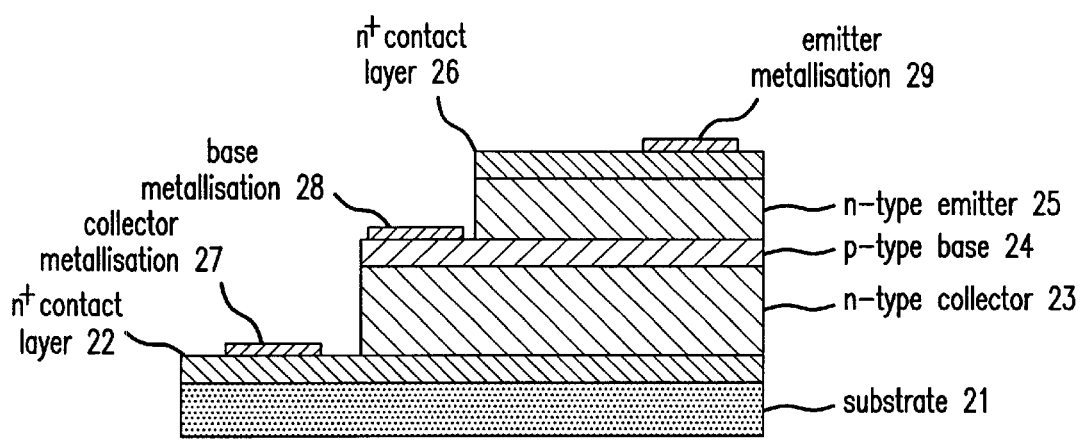
FIG. 21 is a schematic cross sectional view of a bipolar transistor.

FIG. 21 shows a general n-p-n polar transistor structure that consists of a substrate 21 overlaid by n⁺ contact layer 22, an n-type collector layer 23, a p-type base 24, an n-type emitter layer 25 and a n⁺ contact layer 26. Base, collector and emitter metallisation 27, 28 and 29 is provided on the base 24 and the contact layers 22, 26. This HBT structure, whilst shows as an n-p-n transistor could equally be a p-n-p device as will be readily apparent to those skilled in the art. The device may be a single heterojunction HBT e.g. with a heterojunction between the n-type emitter layer 25 and the base 24, or a double heterojunction HBT, with a heterojunction also between the base 24 and the collector 23.

Figure 22A:
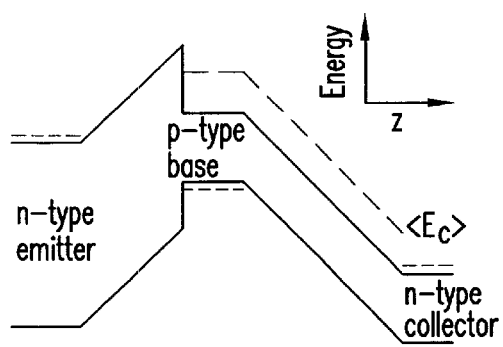
FIGS. 22(a) and (b) illustrate energy band diagrams for prior art single and double heterojunction bipolar transistors.
Figure 22B:
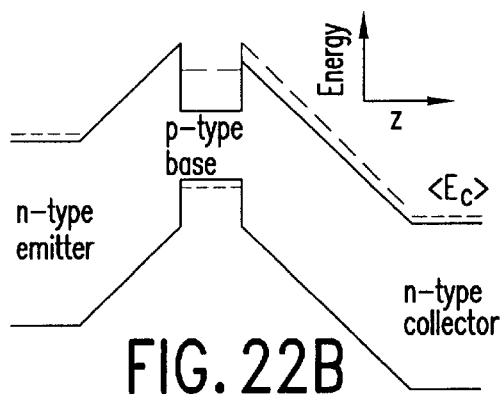
FIGS. 22(c) and (d) illustrate corresponding energy band diagrams for single and double heterojunction bipolar transistors in accordance with the invention.

The energy band diagrams for conventional single and double heterojunction HBTs are shown in FIG. 22(a) and (b) respectively.

Figure 22C:
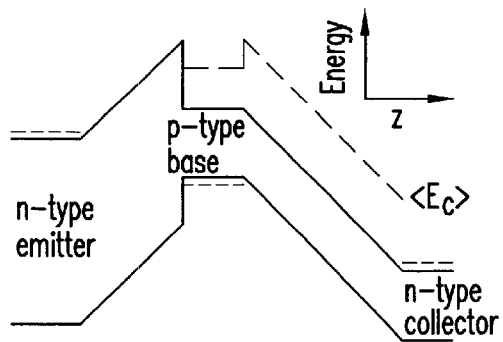
Figure 22D:
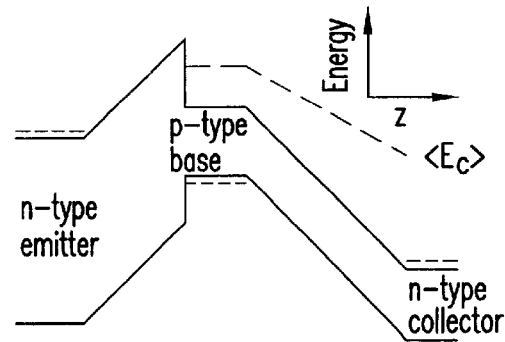

In accordance with the invention, the materials for the emitter, base and collector may be chosen according to the principles discussed hereinbefore, so that the breakdown characteristics of the device can be selected independently of the characteristics of the conduction band. In FIG. 22(c) the energy bands for a single heterojunction HBT in accordance with the invention is shown. FIG. 22(d) shows a corresponding energy band diagram for a HBT according to the invention with a graded collector.

FIG. 23(a)–(d) illustrate material systems that correspond to the energy band diagrams shown in FIGS. 22(a)–(d) respectively.

FIG. 23 shows GaAs-based structures, with $Al_xGa_{1-x}$ or $(Al_xGa_{1-x})_{0.52}In_{0.48}P$ collector and GaAs base. Conventionally, the collector may be (a) GaAs or for the double heterojunction (b) $Al_xGa_{1-x}As$ or $Ga_{0.52}In_{0.48}P$. FIG. 24 shows corresponding InP-based devices; the emitter is InP or $Al_{0.48}In_{0.52}As$, the base is $In_{0.53}Ga_{0.47}As$ and the collector is (a) $In_{0.53}Ga_{0.47}As$, or the double heterojunction structure is InP or (b) $Al_{0.48}In_{0.52}As$. Note that, in FIG. 24(b), the electron injection efficiency from the base to the collector is reduced by the large conduction-band discontinuity; as mentioned above.

The breakdown voltage may be increased by choosing a collector material with high <$E_c$>. For GaAs based structures, this may be $Al_{0.52}In_{0.48}P$, or $AlP_{0.70}Sb_{0.30}$. Furthermore, to avoid the problem of reduced injection efficiency, the base and collector materials may be chosen so that the conduction band discontinuity between them is zero. This occurs, for example, for the material combination $Al_{0.12}Ga_{0.88}As/Ga_{0.52}In_{0.48}P$ [Kim et al., Appl. Phys. Lett. 68, 3488 (1996)]—see structure in FIG. 23(c). For InP based structures, $AlP_{0.39}Sb_{0.61}$ offers a high <$E_c$> (FIG. 24(c)).

Figure 23A:
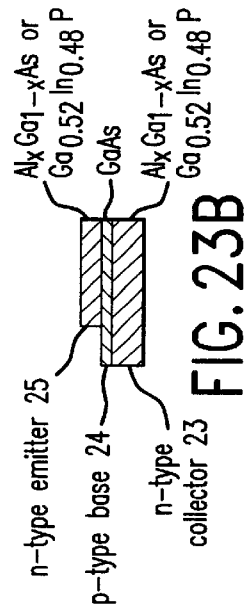
FIGS. 23(a) and (b) illustrate schematically in cross section a first example of materials used in prior art bipolar transistors with single and double heterojunctions respectively.
Figure 23B:
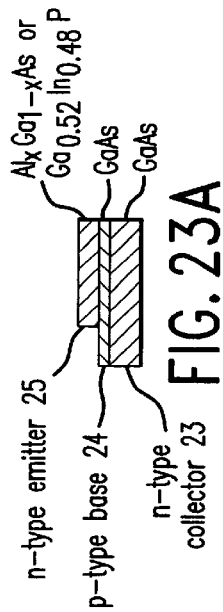
FIGS. 23(c) and (d) illustrate corresponding structures, with material systems selected in accordance with the invention.
Figure 23C:
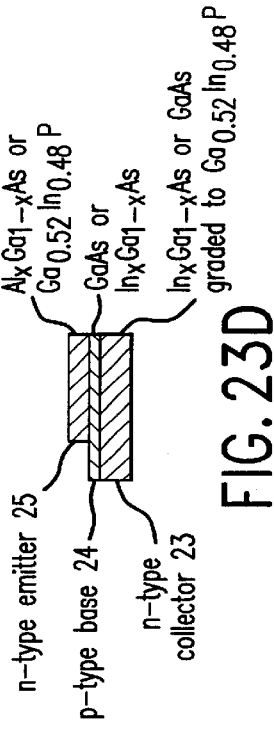
Figure 23D:
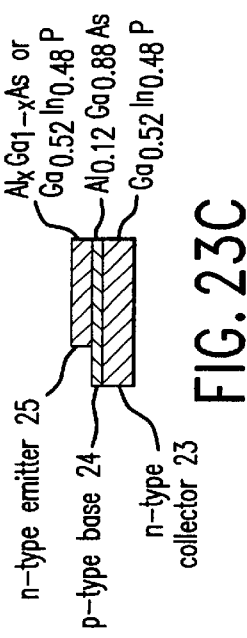

Structures in which the collector material is compositionally graded from the base material to a material with high <$E_c$> offer both high injection efficiency and low electron initiated ionisation probability. FIG. 23(d) shows a GaAs/$Ga_{0.52}In_{0.48}P$ graded layer, and FIG. m(d) shows an $In_{0.53}Ga_{0.47}As/InP$ or $In_{0.53}Ga_{0.47}As/Al_{0.48}In_{0.52}As$ structure. In all the GaAs base structures mentioned above, improved base resistance, base transit time and base hole confinement can be achieved using a strained pseudomorphic $In_xGa_{1-x}As$ base.

APDs

Figure 25:
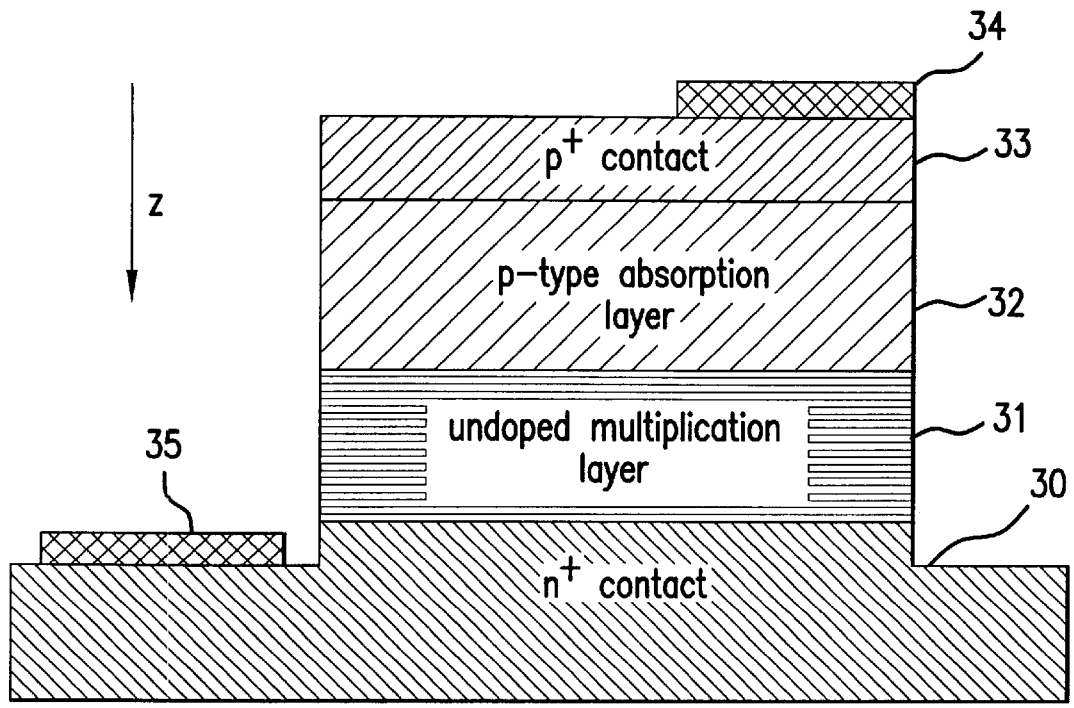
FIG. 25 is a schematic cross sectional view of a APD.
Figure 26:
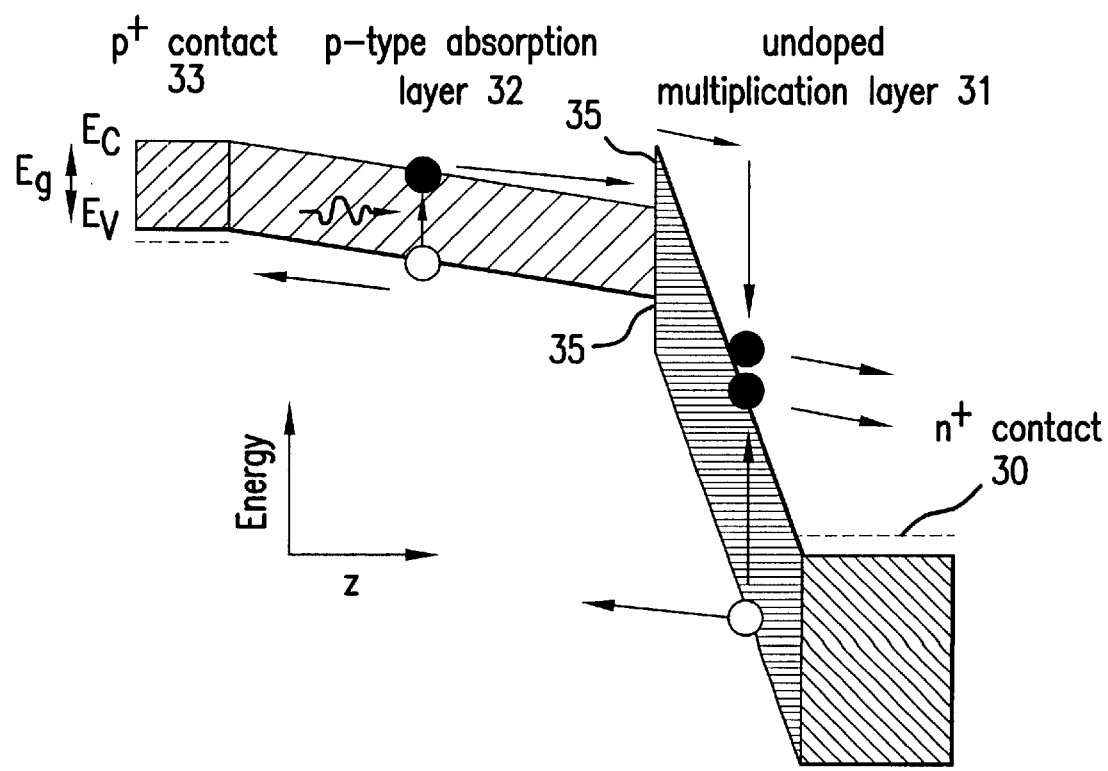
FIGS. 26 to 28 are energy band diagrams of APDs according to the prior art.

Referring to FIG. 25, an APD is shown in cross section and consists of an n⁺0 substrate 30 on which is formed an i-layer 31, which itself is overlaid by a p-type region consisting a p-type absorption layer 32 that absorbs incoming light, and a p⁺ contact region 33. Metallic contacts 34, 35 are formed on the p⁺ region 33 and the n⁺ region 30. The overall layer structure of the device is conventional and reference is directed to Capasso (ibid). The band structure for a conventional APD is shown in FIG. 26. The various semiconductor layers exhibit a valance band $E_v$ and a conduction band $E_c$, with a band gap $E_g$ between them. In order to achieve satisfactory low dark current in the layer 31, the bandgap $E_g$ of the layer needs to be relatively high. However, this renders the layer relatively insensitive to incoming light of long wavelength and so no significant photocurrent is produced in the layer 31. The wavelength dependence of the photocurrent generation is a function of the bandgap $E_g$ which needs to be made smaller in order to achieve satisfactory production of photogenerated charge carriers in a useful wavelength range, such as near-infrared. This leads to a problem in that there is a band discontinuity at the heterojunction between the p-type absorption layer 32 and the undoped multiplication layer 31. The band edge produces a barrier 35 which prevents charge carriers passing between the layers and so electrons produced in the p-type absorption layer 32 tend to pile up at the junction 35 before entering the multiplication layer 31.

Also, as previously explained, the undoped multiplication layer 31 tends to produce a relatively high multiplication noise due to the fact that the material exhibits substantially similar ionisation coefficients α, β for electrons and holes.

Graded-Gap APDs

Figure 27:
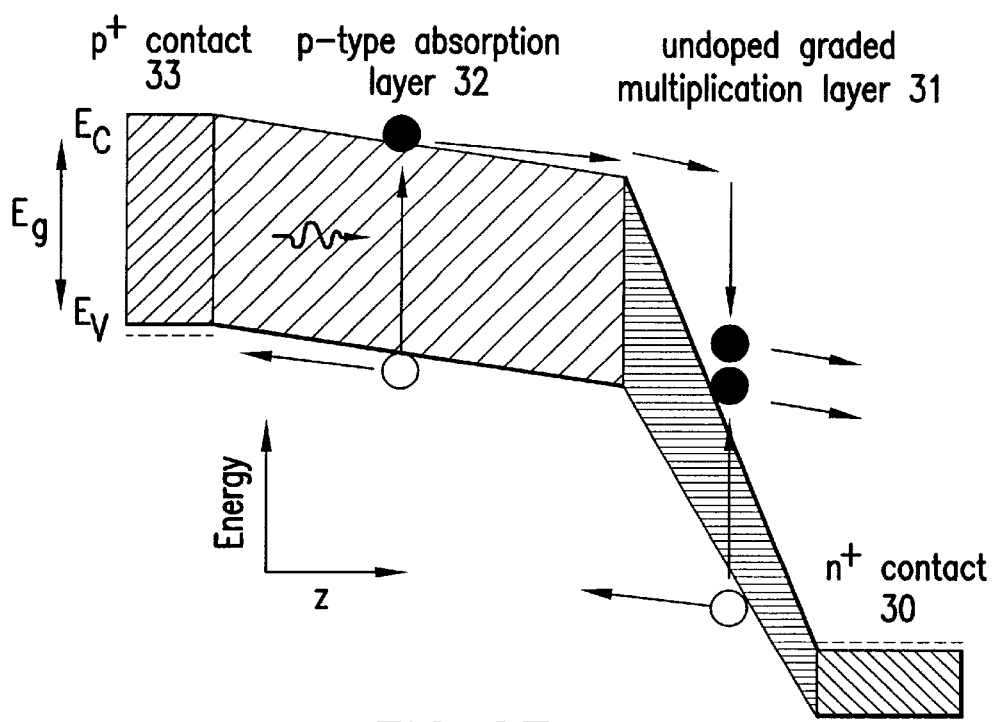

FIG. 27 is a band diagram of the device when the multiplication layer 31 is graded in the manner described in U.S. Pat. No. 4,383,269 discussed previously. The band edges $E_c$ and $E_v$ have unequal slopes in the multiplication region 31, resulting in preferential amplification of electrons, thereby reducing noise and producing a more stable gain. However, the wide gap absoprtion layer is no longer sensitive to a useful wavelength range, because the wavelength sensitivity is a function of the band gap Eg.

Figure 28:
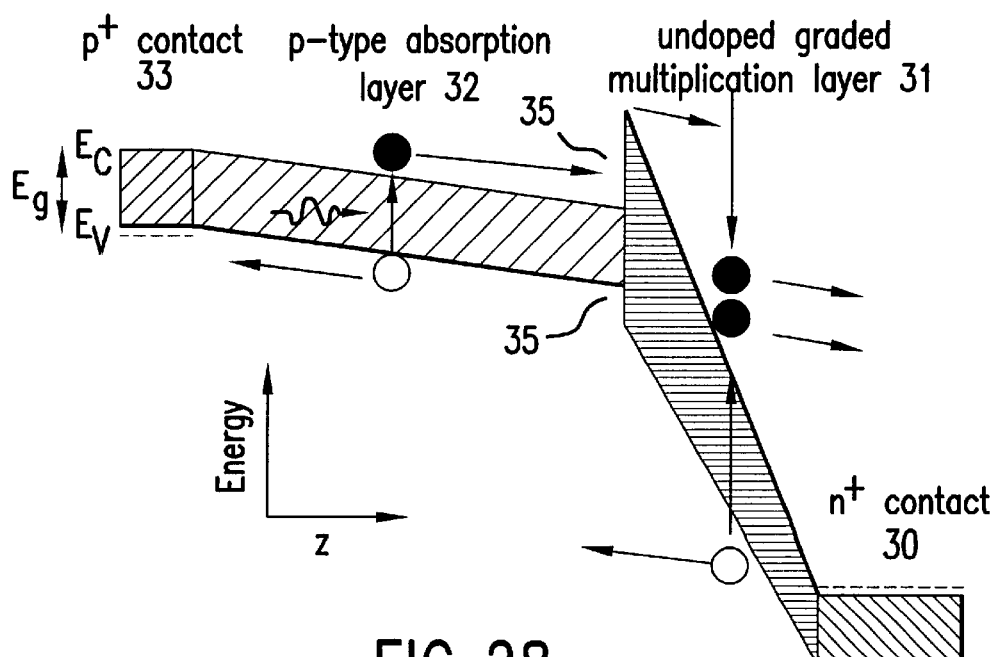

This can be overcome by the prior art arrangement shown in FIG. 28, by making the band gap of the absorption layer 32 narrower than that shown in FIG. 27, but with the disadvantage that the barrier 35 at the junction between the layers 31, 32 produces a build up of charge at the junction.

Figure 29:
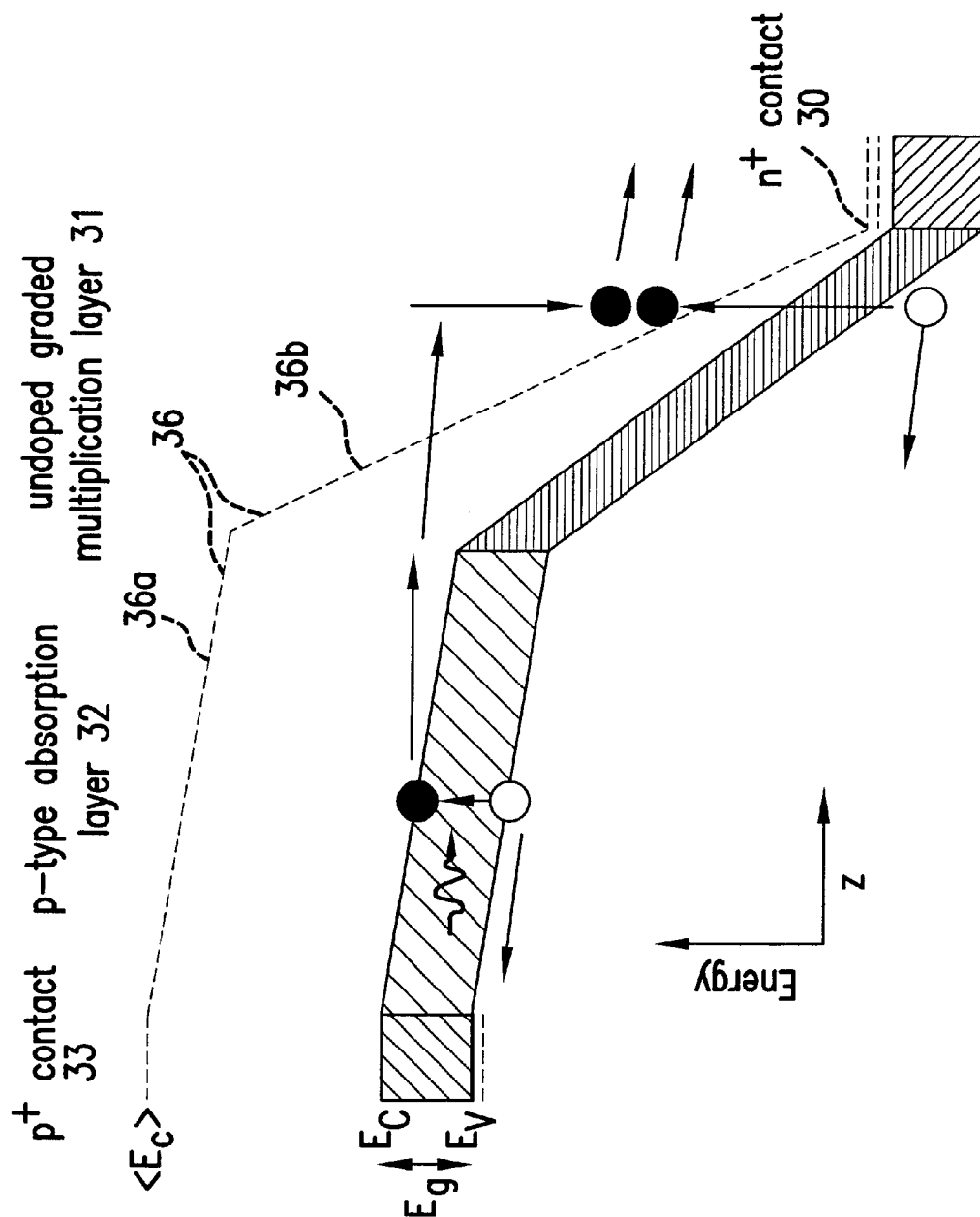
FIG. 29 is a corresponding energy band diagram for an APD in accordance with the invention.

These problems are overcome in accordance with the invention by providing a band structure in the APD as shown in FIG. 29. In accordance with the invention, the average conduction band energy $<E_c>$ is configured to control the ionisation characteristics of the device and the band gap for the light absorption layer 32 is configured separately. The materials used in the p-type absorption layer 32 and the undoped multiplication layer 31 are selected so that their values of $E_g$ produce minimal discontinuities in the conduction and valance bands $E_v$ and $E_c$ at the heterojunction between the layers. In this way, the barrier shown in FIGS. 26 and 27 is avoided. Furthermore, the bandgap $E_g$ for the p-type absorption layer 32 is chosen so that it is sufficiently small to be sensitive to a useful wavelength range for incoming light e.g. near-infrared.

Additionally, in accordance with the invention, the materials are chosen so that the value of the average energy $<E_c>$ has a characteristics shown by dotted line 36 in FIG. 29. The material chosen for the p-type absorption layer 32 is selected to have a relatively high value 36 of average conduction band energy $<E_c>$, relative to the valance band energy $E_v$. As a consequence, the risk of ionisation breakdown in the absorption layer is minimised. However, in the undoped multiplication layer 31, the material is configured so that the value 36 of $<E_c>$ is graded progressively through the thickness of the layer. As previously explained, the grading results in an increase ionisation α for electrons as compared with the corresponding coefficient β for holes, which reduces noise and improves amplification stability. Furthermore, the material chosen for the layer 31 is selected so that its band gap $E_g$ substantially matches the band gap $E_g$ of the layer 32, so that no potential barrier (such as barrier 35—FIG. 26) is produced at the heterojunction between the layers 31, 32. Thus, photo-produced charge carriers from the layer 32 can readily flow into the layer 31, for avalanche multiplication without a charge carrier build up at the heterojunction between the layers.

By making reference to the materials listed in Table II hereinbefore, those skilled in the art will readily be able to determine suitable materials for use in the APD.

Pseudoalloy Superlattice

Figure 30:
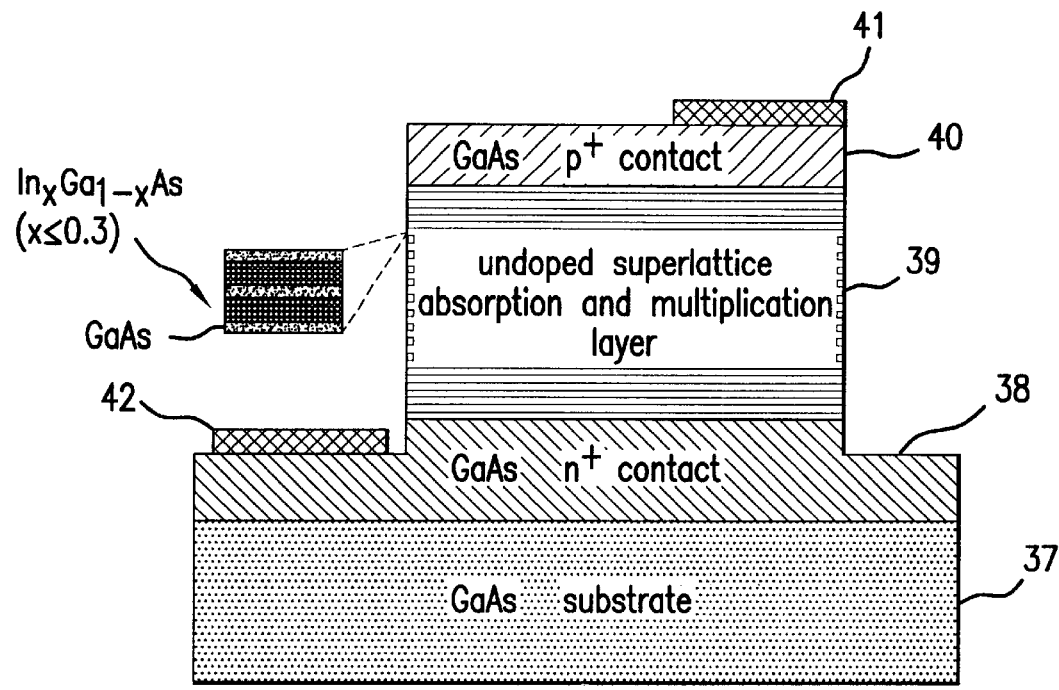
FIG. 30 is a schematic cross sectional view of a quantum well APD in accordance with the invention that utilises a strained superlattice.

FIG. 30 illustrates a cross-section of a quantum well APD that comprises a GaAs substrate 37 with an overlying n⁺ contact layer 38 itself overlaid by an undoped superlattice absorption and multiplication layer 39. The pseudoalloy s superlattice consists of a structure that comprises overlying layers of GaAs and $In_xGa_{1-x}As$ several monolayers thick, deposited by conventional techniques such as molecular beam epitaxy. As is known in the art, the resulting structure comprises a plurality of quantum wells. The well structure 39 is overlaid by a p⁺ contact layer of GaAs material 40. Metallic, ohmic contacts 41, 42 are provided on the layer 40 and the n⁺ contacts layer 38.

Figure 31:
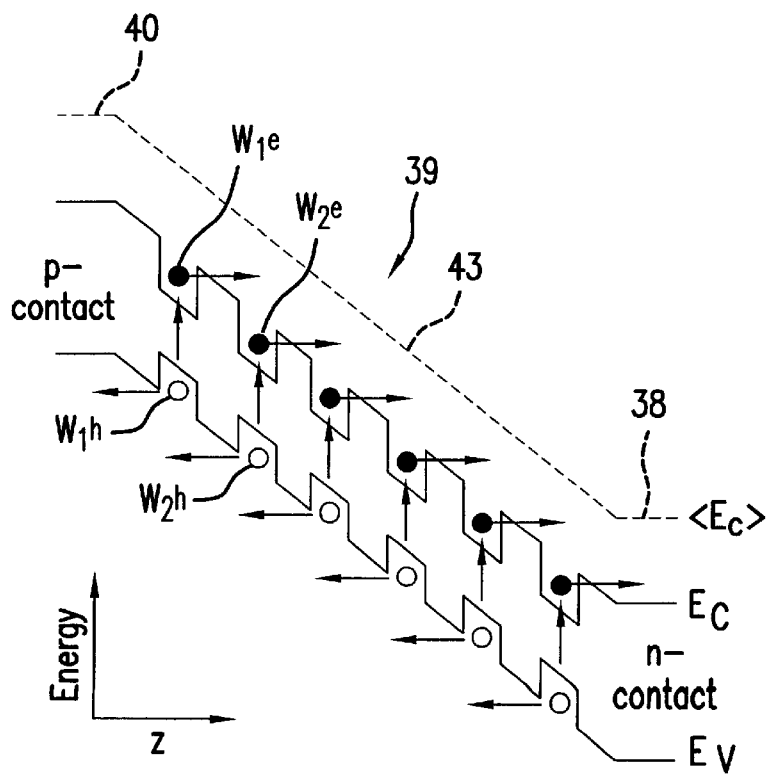
FIG. 31 is an energy band diagram for the device shown in FIG. 30.

The band structure of the device is shown in FIG. 31. The modulation doped structure 39 forms a series of quantum wells $W_{1e}$, $W_{2e}$; $W_{1h}$, $W_{2h}$ etc. In response to incident light, electron hole pairs are produced and the electrons and holes initially reside in the quantum wells. The voltage applied to the contacts 41, 42 results in the field across the layer 39 and as a result, the electrons and holes shift out of the wells and photo multiplication occurs as a result of ionisation in the material of the superlattice.

In accordance with the invention, the degree of ionisation is determined by the level of $<E_c>$, which is shown as a dotted line 43 in FIG. 31. By an appropriate selection of the materials used to form the superlattice, the value of $<E_c>$ can be suitably selected. This can be achieved quasi-independently of the parameters of the quantum wells. It will be understood that the dimensions of the quantum wells determine the wavelength sensitivity of the structure and so in accordance with the invention, the wells can be engineered to achieve a particular wavelength sensitivity and the value of $<E_c>$ can be suitably selected to provide desired ionisation characteristics. This contrasts with the prior art in which the relative values of $E_c$ and $E_v$ were controlled in order to determine both the band gap of the well and the ionisation characteristics.

The device shown in FIG. 30 can be used for detecting light at a wavelength of 1.3 μm. GaAs has the lowest bandgap of any lattice-matched bulk or alloy semiconductor of the same lattice constant, but is limited to detecting wavelengths of less than ≈0.85 μm. However this bandgap can be lowered by the provision of the pseudomorphic $In_xGa_{1-x}As$ layers in the region 39, increasing the detectable wavelength to 1.3 μm. Hence an $In_xGa_{1-x}As$/GaAs strained superlattice structure as shown in FIG. 30 can be selected to exhibit an increased breakdown voltage as a function of $<E_c>$, as well as an increased maximum detectable wavelength.

Figure 32:
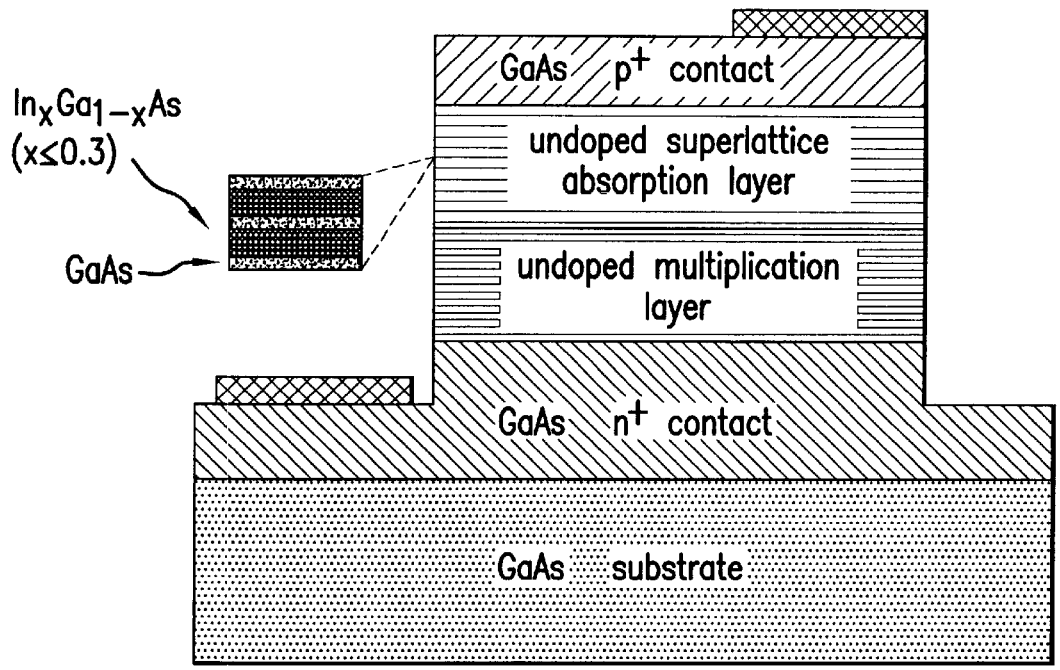
FIG. 32 is a schematic cross sectional view of a SAM-APD in accordance with the invention.

Referring now to FIG. 32, another embodiment of SAM-APD is shown, which is similar to the device for FIG. 30. The device of FIG. 32 additionally includes an undoped multiplication layer 44 under the absorption layer 39, so that the light absorption function is performed by strained layer superlattice 39 and avalanche charge carrier multiplication occurs in the layer 44. For GaAs, the ionisation coefficient α for electrons is greater than the corresponding coefficient β for holes so electrons are injected into the multiplication layer 44, and are multiplied by the avalanche effect.

Figure 33:
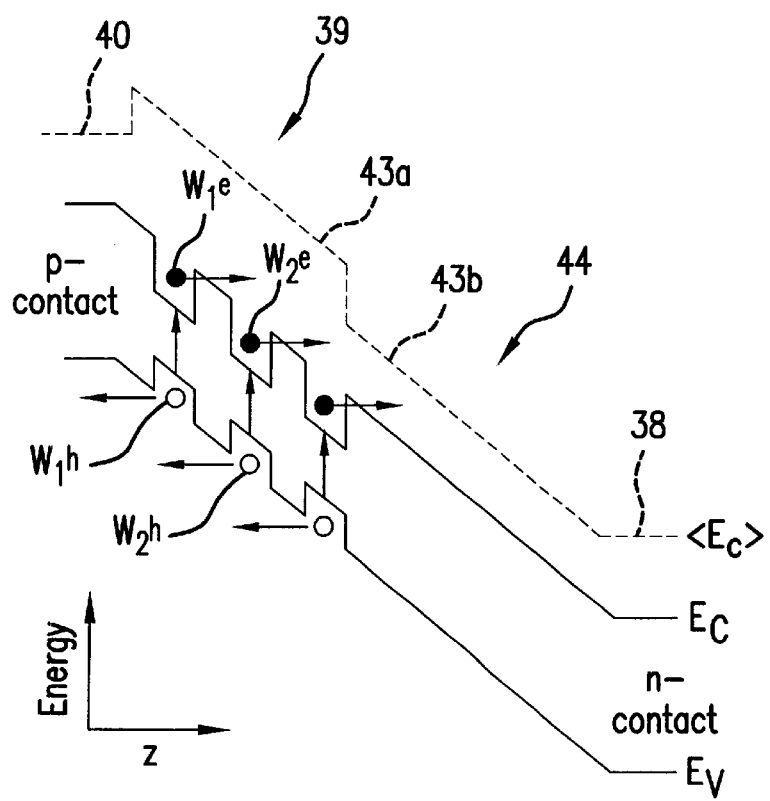
FIG. 33 is an energy band diagram of the SAM-APD shown in FIG. 32.
Figure 34C:
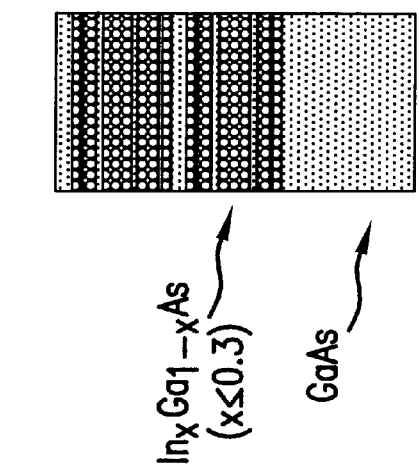
FIG. 34($a$) illustrates Zener tunneling in the quantum well structure shown in FIG. 32.
Figure 34C:
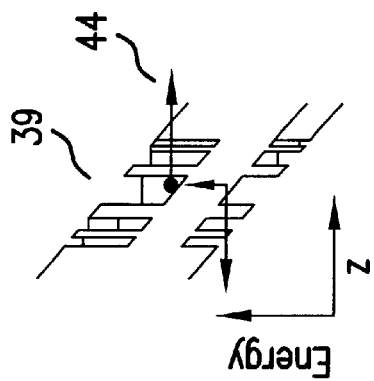
Figure 34B:
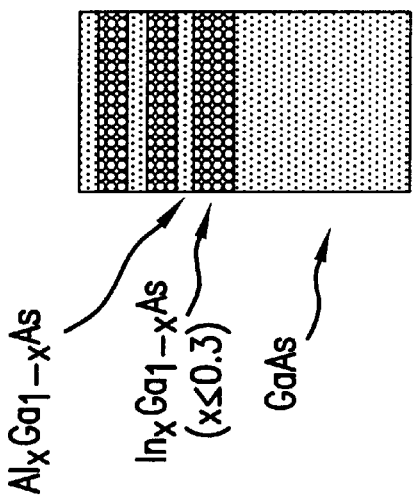
Figure 34B:
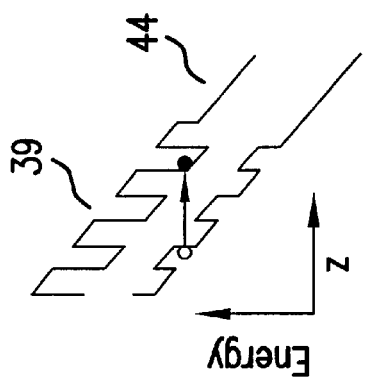
Figure 34A:
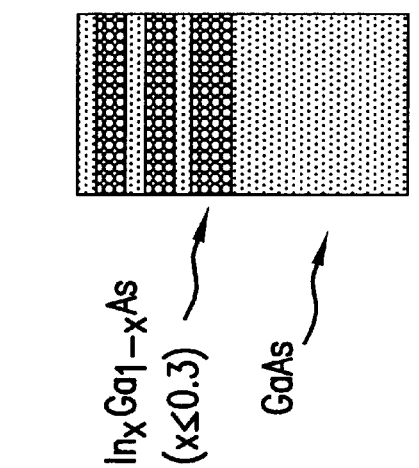
Figure 34A:
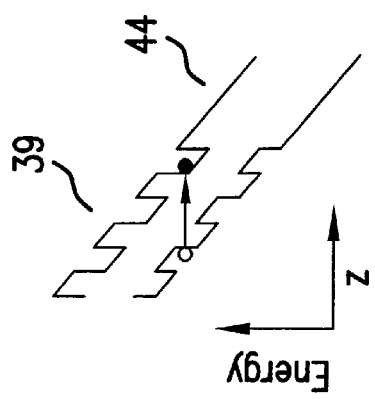

The band structure of the device of FIG. 32 is shown in FIG. 33. In the region of the strained superlattice 39, the value of $<E_c>$ is relatively high, whereas in the region of the multiplication layer 44, the average energy is of a lower value, so as to promote ionisation. In one example, the layer 44 comprises GaAs material and the superlattice region 39 comprises alternate layers of GaAs and $In_xGa_{1-x}As$ material where x<0.3.

Figure 24A:
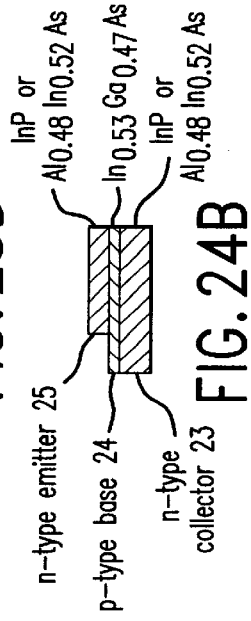
FIGS. 24(a) and (b) illustrate schematic cross sections of the base-emitter-collector of prior arts single and double heterojunctions bipolar transistors.
Figure 24B:
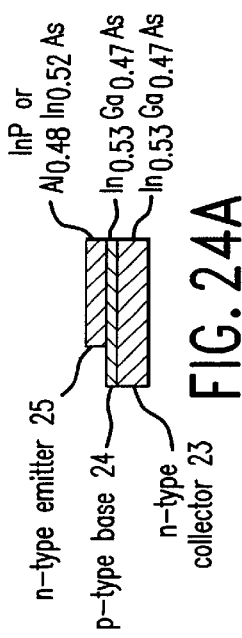
FIGS. 24(c) and (d) illustrate corresponding arrangements in which the materials have been selected in accordance with the method of the invention.
Figure 24C:
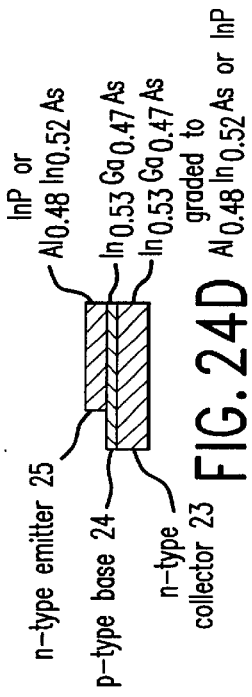
Figure 24D:
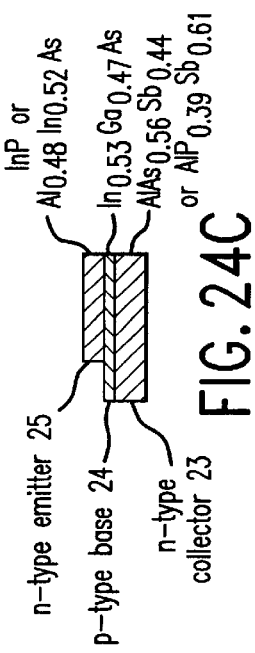

Referring to FIG. 34, there is a risk that a dark current will occur as a result of Zener tunnelling between quantum wells in the superlattice structure 39. This can be suppressed as shown in FIG. 24(b) by forming the superlattice 39 of alternate layers of $Al_xGa_{1-x}As$ and $In_xGa_{1-x}As$ material. Carrier trapping in the quantum wells may be avoided by using "chirped" superlattices in which either electrons or holes or both tunnel resonantly out of the wells by way of quantised energy levels in adjacent, narrow wells. This is shown in FIG. 34(c). It will be understood that the periodicity of the superlattice will be modulated spatially in order to achieve the desired chirped quantum well configuration.

Multiple Quantum Well APD

A multiple quantum well or superlattice avalanche photodiode is described in *Chin, Holonyak & Stillman, Electronics Letters, vol.* 16, p. 648 (1980). An improved device of this type may be formed by forming alternating layers of $In_{0.48}Ga_{0.52}P$ and $Al_xGa_{1-x}As$ where x is approximately 0.35. Such a device will have substantially constant $E_g$ throughout the alternating layers but $<E_c>$ will be modulated. The advantages of such a device is that secondary or photogenerated electrons are not trapped in the wells.

The impact ionisation of a multilayer heterojunction system, forming a superlattice or multiple quantum well, may be enhanced by means of energy gained at a heterojunction by electrons crossing from a region of high $<E_c>$ to a region of low $<E_c>$. Such a structure can be formed by alternating layers of GaAs and $(Al_xGa_{1-x})_{0.52}In_{0.48}P$. In this structure there is a significant discontinuity in $<E_c>$ between the two materials.

IMPATTs

Conventionally, in certain IMPATT structures such as Read diodes, Hi-lo diodes, and Lo-hi-lo diodes, the avalanche multiplication and drift occur in regions of different doping, such that a high field exists in the avalanche region and a relatively low field in the drift region. These structures are most amenable to optimisation by using a method in accordance with the invention. By suitable choice of materials for the two different layers, the output power is increased by maximising the avalanche breakdown voltage, while the operating frequency is increased by maximising the electron velocity. The former is according to the invention by selecting a material with a large value of $<E_c>$, and the latter is achieved by selecting a material which also exhibits low effective mass and high saturated drift velocity.

Figures 35A, 35B:
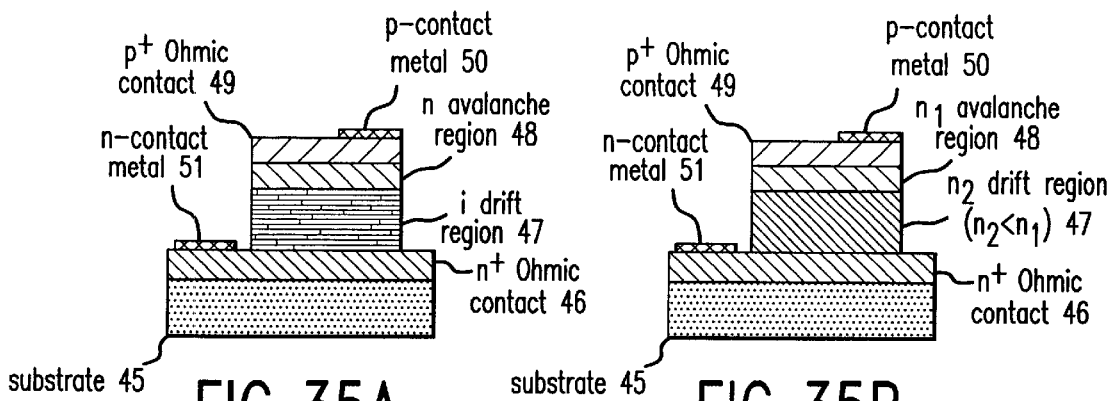
FIGS. 35($a$)–($c$) are schematic cross sectional views of different IMPATT devices fabricated according to the method of the invention.
Figure 35C:
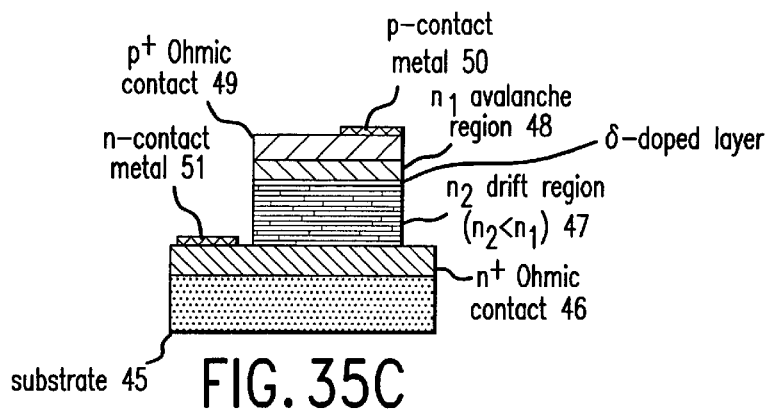
Figures 36A, 36B:
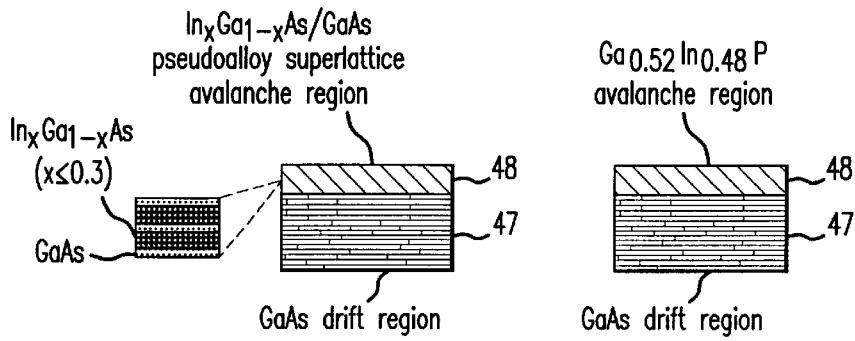
FIGS. 36($a$)–($d$) are corresponding more detailed views of the drift avalanche regions of the devices shown in FIGS. 35($a$)–($c$)
Figures 36C, 36D:
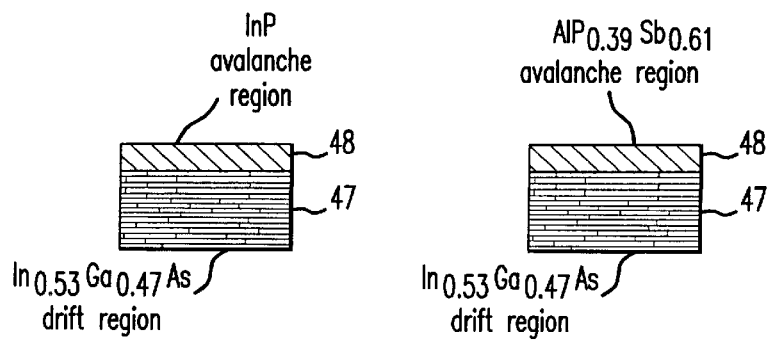

FIG. 35 shows IMPATT devices corresponding to Read (a), Hi-lo (b) and Lo-hi-lo (c) structures. FIG. 36 shows only the avalanche and drift region, omitting any surrounding or intermediate layers. Referring to FIGS. 35, 36 each structure consists of a substrate 45 with an n⁺ ohmic contact 46 overlaid by an undoped drift region 47 on a n-type avalanche region 48. A p-type contact region 49 contacts the region 48. Metallic contacts 50, 51 are provided on the layers 46, 50.

In structure (a), the multiplication layer is formed from an $In_xGa_{1-x}As/GaAs$ pseudoalloy strained layer superlattice, as described above, in order to increase the value of $<E_c>$ and hence $V_b$. In structure (b), the multiplication layer is $Ga_{0.52}In_{0.48}P$ or $Al_{0.52}In_{0.48}P$, which materials have been experimentally demonstrated to exhibit a high breakdown voltage. In structure (c) and (d), which is formed on an InP substrate 45, the drift region is $In_{0.53}Ga_{0.47}As$ which exhibits a high saturated carrier velocity. The multiplication layer is InP in case (c) or $AlP_{0.39}Sb_{0.61}$ in structure (d), for even higher breakdown voltage. These structures exhibit increased power-bandwidth product compared to known structures.

Other Specific Devices p-i-n Microwave Switch

Figure 37:
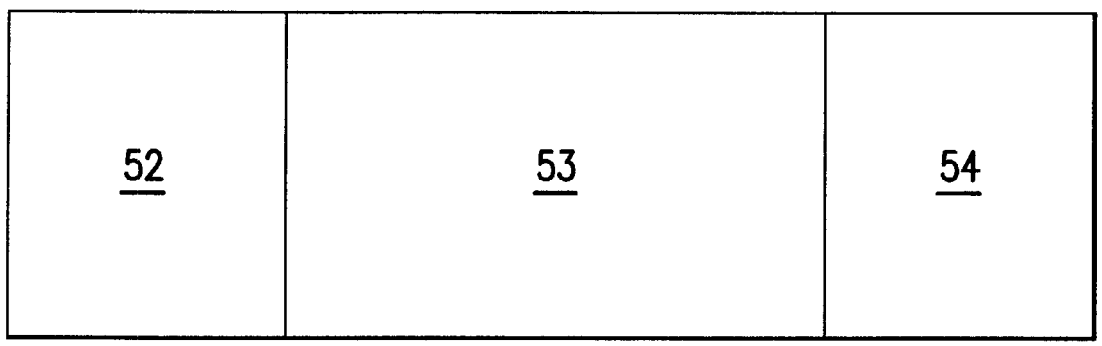
FIG. 37 illustrates another diode in accordance with the invention.

Referring to FIG. 37, a p-i-n diode comprises a p-type region 52, an intrinsic region 53 and an n-type region 54. Such diodes are used in microwave switching circuits. The switching speed is given approximately by $W/2v_s$, where $v_s$ is the saturation velocity across the intrinsic region 53 and W is the width of the intrinsic region 53. Thus, it can be seen that it is desirable for W to be as small as possible for fast switching. However, reducing W reduces also the reverse breakdown voltage of the diode. According to the present invention, the reverse breakdown voltage can be increased for a given value of W, thereby allowing an increase in switching speed without the penalty of reduced breakdown voltage.

For a p-i-n diode having an intrinsic region width W of 1 µm it has been found that the following relationship exists:

$$V_b = 45.8 <E_c> - 46.3 \text{ volts} \qquad (12)$$

Thus, the reverse breakdown voltage for the diode can be varied between 49.6 V in the case where the diode is formed of AlSb ($<E_c> = 2.09$ eV), to 64.4 V in the case where the diode is formed of AlAs ($<E_c> = 2.41$ eV), to 102.4 V in the case where the diode is formed of AlP ($<E_c> = 3.24$ eV), merely by selecting the material on the basis of $<E_c>$.

According to the prior art, where $V_b$ is determined on the basis of equation (3) the width of the intrinsic region W would be over-estimated resulting in a slower switching speed than was necessary. For instance, an AlP p-i-n diode with W=1 µm would have been expected to have a breakdown voltage of 68 V on the basis of a bandgap of 2.50 eV (Sze S. M. *Physics of Semiconductor Devices 2nd Edition* (Wiley, 1981)).

Voltage Reference

A simple example of a device, in which a predetermined breakdown voltage needs to be achieved, is an avalanche diode for use as a voltage reference. In the manufacture of such devices it is desirable to be able to control the fabrication process such that a diode having the desired characteristics is produced. According to the present invention, either doping concentration can be controlled on the basis of the $<E_c>$ for the material used to produce a device having a predetermined breakdown voltage or the material use can be selected on the basis of its $<E_c>$ to give a predetermined breakdown voltage for a given doping concentration.

It is emphasised that the present invention is applicable to the production of any type of device where the avalanche breakdown properties are important. In some devices, such as rectifying diodes, the highest possible breakdown voltage is desirable. In others, such as APDs diodes, a high impact ionisation coefficient is desirable. In still other devices, such a voltage reference diodes, a specific breakdown voltage is required. Thus, it can be seen that the present invention provides for improved devices of many disparate types, including diodes and all forms of transistor.

TABLE I

| Material | $E_\Gamma$ (eV) | $E_L$ (eV) | $E_X$ (eV) | $<E_c>$ (eV) | $V_b$ (V) |
|---|---|---|---|---|---|
| GaAs | 1.43 | 1.71 | 1.90 | 1.75 | 33.6 |
| $Ga_{.85}Al_{.15}As$ | 1.62 | 1.80 | 1.92 | 1.83 | 38.9 |
| $Ga_{.7}Al_{.3}As$ | 1.81 | 1.90 | 1.95 | 1.91 | 44.5 |
| $Ga_{.6}Al_{.4}As$ | 1.95 | 1.96 | 1.97 | 1.96 | 49.0 |
| $Ga_{.5}Al_{.5}As$ | 2.10 | 2.03 | 2.00 | 2.03 | 52.4 |
| $Ga_{.4}Al_{.6}As$ | 2.25 | 2.09 | 2.03 | 2.09 | 56.2 |
| $Ga_{.52}In_{.48}P$ | 1.90 | 2.10 | 2.20 | 2.11 | 61.7 |
| $(Al_{.24}Ga_{.76})_{.52}In_{.48}P$ | 2.05 | 2.18 | 2.22 | 2.17 | 65.3 |
| $(Al_{.50}Ga_{.50})_{.52}In_{.48}P$ | 2.21 | 2.27 | 2.25 | 2.25 | 69.2 |
| $(Al_{.70}Ga_{.30})_{.52}In_{.48}P$ | 2.33 | 2.34 | 2.26 | 2.30 | 72.3 |
| $Al_{.52}In_{.48}P$ | 2.51 | 2.44 | 2.29 | 2.38 | 76.0 |

TABLE II

| material | $a_0$ (Å) | $E_T$ (eV) th[a] | $E_T$ (eV) cor[b] | $E_T$ (eV) exp[c] | $E_L$ (eV) th[a] | $E_L$ (eV) cor[b] | $E_L$ (eV) exp[c] | $E_X$ (eV) th[a] | $E_X$ (eV) cor[b] | $E_X$ (eV) exp[c] | $E_g$ (eV) | $<E_c>$ (eV) |
|---|---|---|---|---|---|---|---|---|---|---|---|---|
| C | 3.57 | 7.60 | 7.33 | 7.30 | | | | | | | 5.48 | |
| Si | 5.43 | 3.43 | 3.40 | 3.40 | 2.36 | 2.26 | | 1.47 | 1.43 | 1.30 | 1.17 | 2.09 |
| Ge | 5.66 | 0.71 | 0.84 | 0.89 | 0.75 | 0.88 | 0.74 | 1.23 | 1.22 | 1.30 | 0.74 | 0.97 |
| BN | 3.62 | 11.40 | 10.91 | | 12.40 | 10.84 | | 6.30 | 5.81 | 6.20 | 5.81 | 8.96 |
| BP | 4.54 | 4.40 | 4.31 | 5.00 | 4.60 | 4.17 | | 2.00 | 1.91 | | 2.04 | 3.34 |
| BAs | 4.78 | 4.00 | 3.94 | | 3.30 | 3.06 | | 1.93 | 1.85 | | 1.55 | 2.72 |
| AlN | 4.35 | 6.00 | 5.82 | | 9.30 | 8.19 | | 4.90 | 4.54 | | 4.54 | 6.52 |
| GaN | 4.50 | 3.10 | 3.09 | 3.25 | 6.20 | 5.54 | | 4.70 | 4.36 | | 3.25 | 4.79 |
| AlP | 5.45 | 4.38 | 4.30 | 3.62 | 3.90 | 3.58 | | 2.59 | 2.45 | 2.50 | 2.50 | 3.24 |
| AlAs | 5.65 | 2.88 | 2.88 | 3.13 | 2.91 | 2.73 | 2.36 | 2.14 | 2.04 | 2.23 | 2.23 | 2.41 |
| AlSb | 6.14 | 2.23 | 2.27 | 2.32 | 1.84 | 1.82 | 2.33 | 1.64 | 1.59 | 1.68 | 1.68 | 2.09 |
| GaP | 5.45 | 2.85 | 2.85 | 2.89 | 2.67 | 2.52 | 2.64 | 2.55 | 2.41 | 2.39 | 2.39 | 2.58 |
| GaAs | 5.65 | 1.22 | 1.32 | 1.52 | 1.64 | 1.64 | 1.74 | 2.01 | 1.92 | 1.90 | 1.52 | 1.77 |
| GaSb | 6.10 | 0.62 | 0.75 | 0.82 | 0.79 | 0.92 | 0.92 | 1.15 | 1.15 | 1.15 | 0.80 | 0.99 |
| InP | 5.87 | 1.44 | 1.53 | 1.42 | 2.28 | 2.19 | 2.03 | 2.58 | 2.44 | 2.38 | 1.42 | 2.09 |
| InAs | 6.04 | 0.31 | 0.46 | 0.41 | 1.43 | 1.47 | 1.55 | 2.01 | 1.92 | | 0.41 | 1.51 |
| InSb | 6.47 | 0.08 | 0.24 | 0.23 | 0.76 | 0.89 | | 1.50 | 1.46 | 1.79 | 0.23 | 1.03 |
| Al$_{.5}$Ga$_{.5}$As | 5.65 | 2.06 | 2.11 | 2.09 | 2.25 | 2.17 | 2.03 | 2.05 | 1.96 | 1.97 | 2.09 | 2.01 |
| In$_{.53}$Ga$_{.47}$As | 5.87 | 0.80 | 0.92 | 0.81 | 1.63 | 1.64 | | 2.07 | 1.98 | | 0.81 | 1.68 |
| ZnS | 5.41 | 3.98 | 3.92 | 3.80 | 5.28 | 4.75 | | 5.14 | 4.76 | | 3.80 | 4.65 |
| ZnSe | 5.67 | 2.84 | 2.84 | 2.96 | 4.14 | 3.78 | | 4.41 | 4.10 | | 2.96 | 3.78 |
| ZnTe | 6.09 | 2.57 | 2.59 | 2.71 | 3.07 | 2.87 | | 3.47 | 3.24 | | 2.71 | 2.97 |
| CdS | 5.82 | 2.83 | 2.83 | 2.55 | 4.82 | 4.36 | | 5.08 | 4.70 | | 2.55 | 4.30 |
| CdSe | 6.05 | 2.01 | 2.06 | 1.90 | 3.87 | 3.55 | | 4.37 | 4.06 | | 1.90 | 3.56 |
| CdTe | 6.48 | 1.76 | 1.83 | 1.92 | 2.84 | 2.67 | | 3.46 | 3.24 | | 1.92 | 2.78 |
| HgTe[d] | 6.46 | −0.30 | −0.11 | | 1.28 | 1.34 | | 2.35 | 2.23 | | 0.00 | 1.49 |

[a]theoretical (ab-initio quasiparticle) energies of Louie and coworkers.
[b]theoretical energies corrected for systematic errors.
[c]experimental energies collated by Louie and coworkers.
[d]A. B. Chen and A. Sher, J. Vac. Sci. Technol. 21, 138 (1982)

TABLE III

| material | $a_0$ (Å) | $E_0$ (eV) th[a] | $E_0$ (eV) cor[b] | $E_0$ (eV) exp[c] | $E_1$ (eV) th[a] | $E_1$ (eV) cor[b] | $E_1$ (eV) exp[c] | $E_2$ (eV) th[a] | $E_2$ (eV) cor[b] | $E_2$ (eV) exp[c] | $<E_G>$ (eV) |
|---|---|---|---|---|---|---|---|---|---|---|---|
| C | 3.57 | 7.60 | 7.33 | 7.30 | 13.60 | 13.11 | 14.40 | 13.10 | 12.51 | 12.60 | 12.84 |
| Si | 5.43 | 3.43 | 3.40 | 3.40 | 3.64 | 3.67 | | 4.49 | 4.46 | 4.40 | 3.93 |
| Ge | 5.66 | 0.71 | 0.84 | 0.89 | 2.18 | 2.28 | | 4.45 | 4.42 | 4.63 | 2.90 |
| BN | 3.62 | 11.40 | 10.91 | | 14.60 | 14.06 | | 11.80 | 11.30 | | 12.63 |
| BP | 4.54 | 4.40 | 4.31 | 5.00 | 6.50 | 6.38 | 8.00 | 6.50 | 6.34 | 6.90 | 6.11 |
| BAs | 4.78 | 4.00 | 3.94 | | 5.30 | 5.24 | | 6.43 | 6.27 | | 5.46 |
| AlN | 4.35 | 6.00 | 5.82 | | 9.90 | 9.60 | | 7.00 | 6.81 | | 8.08 |
| GaN | 4.50 | 3.10 | 3.09 | 3.25 | 7.30 | 7.14 | | 7.70 | 7.46 | | 6.75 |
| AlP | 5.45 | 4.38 | 4.30 | 3.62 | 4.75 | 4.72 | | 4.90 | 4.84 | | 4.71 |
| AlAs | 5.65 | 2.88 | 2.88 | 3.13 | 3.90 | 3.91 | 3.92 | 4.58 | 4.54 | 4.64 | 4.09 |
| AlSb | 6.14 | 2.23 | 2.27 | 2.32 | 2.90 | 2.96 | 2.89 | 4.18 | 4.17 | | 3.33 |
| GaP | 5.45 | 2.85 | 2.85 | 2.89 | 3.83 | 3.85 | 3.91 | 5.33 | 5.24 | 5.39 | 4.34 |
| GaAs | 5.65 | 1.22 | 1.32 | 1.52 | 2.92 | 2.98 | 3.15 | 4.88 | 4.82 | 4.81 | 3.57 |
| GaSb | 6.10 | 0.62 | 0.75 | 0.82 | 1.93 | 2.05 | 2.02 | 3.88 | 3.89 | 4.01 | 2.62 |
| InP | 5.87 | 1.44 | 1.53 | 1.42 | 3.30 | 3.34 | 3.18 | 4.96 | 4.90 | 4.58 | 3.48 |
| InAs | 6.04 | 0.31 | 0.46 | 0.41 | 2.56 | 2.64 | 2.59 | 4.50 | 4.47 | | 3.05 |
| InSb | 6.47 | 0.08 | 0.24 | 0.23 | 1.72 | 1.85 | | 4.06 | 4.06 | 4.19 | 2.47 |
| Al$_{.5}$Ga$_{.5}$As | 5.65 | 2.06 | 2.11 | 2.09 | 3.41 | 3.45 | | 4.73 | 4.68 | | |
| In$_{.53}$Ga$_{.47}$As | 5.87 | 0.80 | 0.92 | 0.81 | 2.81 | 2.88 | | 4.71 | 4.66 | | |
| ZnS | 5.41 | 3.98 | 3.92 | 3.80 | 6.06 | 5.96 | 5.81 | 7.20 | 6.99 | 6.60 | 5.86 |
| ZnSe | 5.67 | 2.84 | 2.84 | 2.96 | 4.95 | 4.91 | 5.02 | 6.49 | 6.33 | 6.42 | 5.29 |
| ZnTe | 6.09 | 2.57 | 2.59 | 2.71 | 3.95 | 3.96 | | 5.63 | 5.52 | 5.41 | 4.38 |
| CdS | 5.82 | 2.83 | 2.83 | 2.55 | 5.50 | 5.43 | | 6.82 | 6.64 | | 5.56 |
| CdSe | 6.05 | 2.01 | 2.06 | 1.90 | 4.58 | 4.56 | | 6.15 | 6.01 | | 4.79 |
| CdTe | 6.48 | 1.76 | 1.83 | 1.92 | 3.57 | 3.60 | 3.72 | 5.24 | 5.16 | | 3.96 |
| HgTe[d] | 6.46 | −0.30 | −0.11 | | 1.96 | 2.07 | | 4.68 | 4.64 | | 2.76 |

[a]theoretical (ab-initio quasiparticle) energies of Louie and coworkers.
[b]theoretical energies corrected for systematic errors.
[c]experimental energies collated by Louie and coworkers.
[d]A. B. Chen and A. Sher, J. Vac. Sci. Technol. 21, 138 (1982).

TABLE IV

| Material | Bandstructure $E_g$ (eV) | $E_r$ (eV) | $<E_c>$ (eV) | $<E_G>$ (eV) | Breakdown $V_b$ (V) |
|---|---|---|---|---|---|
| Si | 1.17 | 3.40 | 1.85* | 3.98* | 34.3[a] |
| Ge | 0.74 | 0.89 | 0.97 | 2.90 | 19.7[b] |
| GaP | 2.39 | 2.85 | 2.58 | 4.34 | 61.4[c] |
| InP | 1.42 | 1.42 | 2.09 | 3.48 | 46.5[d] |
| GaAs | 1.52 | 1.52 | 1.77 | 3.57 | 33.6[e] |
| $Ga_{0.47}In_{0.53}As$ | 0.81 | 0.81 | 1.65 | 3.28 | 33.2[f] |
| $Al_{0.48}In_{0.52}As$ | 1.55 | 1.55 | 1.96 | 3.53 | 46.5[g] |
| $GaAs_{0.88}Sb_{0.12}$ | 1.44 | 1.44 | 1.68 | 3.46 | 26.5[h] |
| $Al_{0.06}Ga_{0.94}Sb$ | 0.87 | 0.87 | 1.06 | 2.66 | 22.0[i] |
| $Al_{0.28}Ga_{0.72}Sb$ | 1.06 | 1.06 | 1.30 | 2.81 | 25.2[j] |
| GaAs | 1.52 | 1.52 | 1.77 | 3.57 | 33.6[k] |
| $Al_{0.15}Ga_{0.85}As$ | 1.72 | 1.72 | 1.87 | 3.65 | 38.9[k] |
| $Al_{0.3}Ga_{0.7}As$ | 1.93 | 1.93 | 1.96 | 3.73 | 44.5[k] |
| $Al_{0.4}Ga_{0.6}As$ | 2.06 | 2.06 | 2.03 | 3.78 | 49.0[k] |
| $Al_{0.5}Ga_{0.5}As$ | 2.07 | 2.20 | 2.09 | 3.83 | 52.4[k] |
| $Al_{0.6}Ga_{0.4}As$ | 2.10 | 2.34 | 2.15 | 3.88 | 56.2[k] |
| $Ga_{0.52}In_{0.48}P$ | 2.18 | 2.18 | 2.34 | 3.93 | 61.7[k] |
| $(Al_{0.24}Ga_{0.76})_{0.52}In_{0.48}P$ | 2.37 | 2.37 | 2.43 | 3.99 | 65.3[k] |
| $(Al_{0.50}Ga_{0.50})_{0.52}In_{0.48}P$ | 2.41 | 2.55 | 2.52 | 4.04 | 69.2[k] |
| $(Al_{0.75}Ga_{0.25})_{0.52}In_{0.48}P$ | 2.43 | 2.74 | 2.61 | 4.10 | 72.3[k] |
| $Al_{0.52}In_{0.48}P$ | 2.44 | 2.92 | 2.70 | 4.15 | 76.0[k] |

*In the case of Si, the Γ valley is assumed not to play any role, hence $<E> \approx (1/7)(3E_x + 4E_L)$.
[a] C. A. Lee, R. A. Logan, R. L. Batdorf, J.J. Kleimack and W. Wiegmann, Phys. Rev. 134, A761 (1964)
[b] S. L. Miller, Phys. Rev. 99, 1234 (1965)
[c] R. A. Logan and White, J. Appl. Phys. 36, 3945 (1965)
[d] C. A. Armiento, S. H. Groves, and C. E. Hurwitz, Appl. Phys. Lett. 35, 333 (1979)
[e] G. E. Bulman et al., IEEE Electron Dev. Lett. 4, 181 (1983)
[f] average value of: T. P. Pearsall, Appl. Phys. Lett. 36, 218 (1980); F. Osaka, T. Mikawa and T. Kaneda, IEEE J. Quantum Electronics 21, 1326 (1985); J. Urquhart, D. J. Robbins, R. I. Taylor and A. J. Mosely, Semiconductor Science and Technol. 7, 789 (1990); J. Bude and K. Hess, J. Appl. Phys. 72 (1992) 3554; C. Canali, C. Forzan, A. Neviani, L. Vendrame, E. Zanoni, R. A. Hamm, R. J. Malik, F. Capasso and S. Chandrasekhar, Appl. Phys. Lett. 66, 1095 (1995).
[g] F. Capasso, K. Mohammed, K. Alavi, A. Y. Cho and P. W. Foy, Appl. Phys. Lett. 45, 968 (1984).
[h] T. P. Pearsall, R. E. Nahory and M. A. Pollack, Appl. Phys. Lett. 28, 403 (1976).
[i] H. Kuwatsuka, T. Mikawa, S. Miura, N. Yasuoka, T. Tanahashi, O. Wada, Appl. Phys. Lett. 57, 249 (1990).
[j] H. D. Law and C. A. Lee, Solid State Electron. 21, 331 (1978).
[k] J. P. R. David, M. Hopkinson and M. A. Pate, Electron. Lett. 30, 909 (1994).

TABLE V

| material | $E_g$ (eV) | $<E_c>$ (eV) | $V_b$ (V) |
|---|---|---|---|
| Si | 1.17 | 1.85 | 38.7 |
| BN | 5.81 | 8.96 | 364.2 |
| BP | 2.04 | 3.34 | 107.1 |
| B_As | 1.55 | 2.72 | 78.4 |
| AlN | 4.54 | 6.52 | 252.7 |
| GaN | 3.25 | 4.79 | 173.3 |
| AlP | 2.50 | 3.24 | 102.4 |
| AlAs | 2.23 | 2.41 | 64.3 |
| AlSb | 1.68 | 2.09 | 49.6 |
| GaP | 2.39 | 2.58 | 72.1 |
| GaAs | 1.52 | 1.77 | 35.0 |
| InP | 1.42 | 2.09 | 49.6 |
| InAs | 0.41 | 1.51 | (23.2) |
| $In_{0.53}Ga_{0.47}As$ | 0.81 | 1.68 | 30.6 |
| ZnS | 3.80 | 4.65 | 166.9 |
| ZnSe | 2.96 | 3.78 | 127.1 |
| ZnTe | 2.71 | 2.97 | 90.1 |
| CdS | 2.55 | 4.30 | 150.8 |
| CdSe | 1.90 | 3.56 | 116.7 |
| CdTe | 1.92 | 2.78 | 81.1 |
| HgTe | 0.00 | 1.49 | (22.2) |

TABLE VI

| substrate | $a_0$ (Å) | Material | $<E_c>$ (eV) | $V_b^*$ (V) |
|---|---|---|---|---|
| GaAs | 5.6532 | GaAs | 1.77 | 34.8 |
| | | $Ga_{0.52}In_{0.48}P$ | 2.34 | 60.9 |
| | | $Al_{0.52}In_{0.48}P$ | 2.70 | 77.4 |
| | | $GaP_{0.69}Sb_{0.31}$ | 2.09 | 49.5 |
| | | $AlP_{0.70}Sb_{0.30}$ | 2.90 | 86.6 |
| InP | 5.8688 | InP | 2.09 | 49.5 |
| | | $In_{0.53}Ga_{0.47}As$ | 1.65 | 29.3 |
| | | $Al_{0.48}In_{0.52}As$ | 1.96 | 43.5 |
| | | $GaAs_{0.51}Sb_{0.49}$ | (1.39) | (17.4) |
| | | $GaP_{0.36}Sb_{0.65}$ | 1.55 | 24.7 |
| | | $AlAs_{0.56}Sb_{0.44}$ | 2.27 | 57.7 |
| | | $AlP_{0.39}Sb_{0.61}$ | 2.54 | 70.1 |
| InAs | 6.0584 | InAs | (1.51) | (22.9) |
| | | $GaAs_{0.08}Sb_{0.92}$ | (1.05) | (1.8) |
| | | $GaP_{0.06}Sb_{0.94}$ | (1.09) | (3.7) |
| | | $InP_{0.69}Sb_{0.31}$ | 1.76 | 34.4 |
| | | $AlAs_{0.16}Sb_{0.84}$ | 2.14 | 51.8 |
| | | $AlP_{0.11}Sb_{0.89}$ | 2.22 | 55.4 |
| GASb | 6.0959 | GaSb | (0.99) | (—) |
| | | $InAs_{0.91}Sb_{0.09}$ | (1.47) | (21.1) |
| | | $InP_{0.63}Sb_{0.37}$ | 1.70 | 31.6 |
| | | $AlAs_{0.08}Sb_{0.92}$ | 2.12 | 50.4 |
| | | $AlP_{0.06}Sb_{0.94}$ | 2.16 | 52.7 |

*Breakdown voltage of 1 μm p-i-n diode, calculated from Equation (9)

What is claimed is:

1. A method of fabricating a semiconductor structure device with a predetermined architecture and functionality, comprising:

determining a relationship between the Brillouin-zone-averaged energy bandgap $<E_c>$ and the breakdown characteristic pertinent to devices with said architecture and functionality;

selecting a breakdown characteristic;

determining a value of Brillouin-zone-averaged energy bandgap ($<E_c>$) for the structure corresponding to the selected breakdown characteristic, by using said relationship;

selecting from predetermined data relating to different material compositions and configurations and their corresponding values of $<E_c>$, a material corresponding to said selected value of $<E_c>$; and fabricating said device using said selected material.

2. A method of fabricating a semiconductor structure device with a predetermined architecture and functionality, comprising:

selecting a predetermined breakdown characteristic for a functional part of the structure;

determining a value of Brillouin-zone-averaged energy bandgap ($<E_c>$) for the structure corresponding to selected breakdown characteristic according to the formula:

$$\langle E_c \rangle = \frac{(V_b + m)}{n}$$

where $V_b$ is the predetermined breakdown voltage, and m and n are constants;

selecting a material corresponding to said determined value of $\langle E_c \rangle$; and fabricating said portion of the structure from the selected material.

3. A method of fabricating a semiconductor structure device according to claim 2 wherein the device si selected from the group consisting essentially of field effect transistors, bipolar transistors, avalanche photodiodes and impact ionisation avalanche transit time diodes.

4. A method of fabricating a semiconductor structure device with a predetermined architecture and functionality, comprising:

selecting a breakdown characteristic;

determining a value of Brillouin-zone-averaged energy bandgap ($\langle E_c \rangle$) and selecting a material corresponding to said determined value of $\langle E_c \rangle$ from:

| Material | $\langle E_c \rangle$ (eV) | $V_b$ (V) |
|---|---|---|
| Si | 1.85 | 34.3 |
| Ge | 0.97 | 19.7 |
| GaP | 2.58 | 61.4 |
| InP | 2.09 | 46.5 |
| GaAs | 1.77 | 33.6 |
| $Ga_{0.47}In_{0.53}As$ | 1.65 | 33.2 |
| $Al_{0.48}In_{0.52}As$ | 1.96 | 46.5 |
| $GaAs_{0.88}Sb_{0.12}$ | 1.68 | 26.5 |
| $Al_{0.06}Ga_{0.94}Sb$ | 1.06 | 22.0 |
| $Al_{0.28}Ga_{0.72}Sb$ | 1.30 | 25.2 |
| GaAs | 1.77 | 33.6 |
| $Al_{0.15}Ga_{0.85}As$ | 1.87 | 38.9 |
| $Al_{0.3}Ga_{0.7}As$ | 1.96 | 44.5 |
| $Al_{0.4}Ga_{0.6}As$ | 2.03 | 49.0 |
| $Al_{0.5}Ga_{0.5}As$ | 2.09 | 52.4 |
| $Al_{0.6}Ga_{0.4}As$ | 2.15 | 56.2 |
| $Ga_{0.52}In_{0.48}P$ | 2.34 | 61.7 |
| $(Al_{0.24}Ga_{0.76})_{0.52}In_{0.48}P$ | 2.43 | 65.3 |
| $(Al_{0.50}Ga_{0.50})_{0.52}In_{0.48}P$ | 2.52 | 69.2 |
| $(Al_{0.75}Ga_{0.25})_{0.52}In_{0.48}P$ | 2.61 | 72.3 |
| $Al_{0.52}In_{0.48}P$ | 2.70 | 76.0 | and fabricating said device using said selected material.

5. A method of fabricating a semiconductor structure device according to claim 4 wherein the device is selected from the group consisting essentially of field effect transistors, bipolar transistors, avalanche photodiodes and impact ionisation avalanche transit time diodes.

6. A method of fabricating a semiconductor structure device with a predetermined architecture and functionality, comprising:

selecting a value of Brillouin-zone-averaged energy bandgap ($\langle E_c \rangle$);

selecting a material corresponding to said selected value of $\langle E_c \rangle$ from:

| Material | $\langle E_g \rangle$ (eV) | $\langle E_c \rangle$ (eV) |
|---|---|---|
| Si | 1.17 | 2.09 |
| Ge | 0.74 | 0.97 |
| BN | 5.81 | 8.96 |
| BP | 2.04 | 3.34 |
| BAs | 1.55 | 2.72 |
| AlN | 4.54 | 6.52 |
| GaN | 3.25 | 4.79 |
| AlP | 2.50 | 3.24 |
| AlAs | 2.23 | 2.41 |
| AlSb | 1.68 | 2.09 |
| GaP | 2.39 | 2.58 |
| GaAs | 1.52 | 1.77 |
| GaSb | 0.80 | 0.99 |
| InP | 1.42 | 2.09 |
| InAs | 0.41 | 1.51 |
| InSb | 0.23 | 1.03 |
| $Al_{.5}Ga_{.5}As$ | 2.09 | 2.01 |
| $In_{.53}Ga_{.47}As$ | 0.81 | 1.68 |
| ZnS | 3.80 | 4.65 |
| ZnSe | 2.96 | 3.78 |
| ZnTe | 2.71 | 2.97 |
| CdS | 2.55 | 4.30 |
| CdSe | 1.90 | 3.56 |
| CdTe | 1.92 | 2.78 |
| HgTe | 0.00 | 1.49 | and fabricating said device using said selected material.

7. A method of fabricating a semiconductor structure device according to claim 6 wherein the device is selected from the group consisting essentially of field effect transistors, bipolar transistors, avalanche photodiodes and impact ionisation avalanche transit time diodes.

8. A method of fabricating a semiconductor structure device with a predetermined architecture and functionality, comprising:

selecting a value of Brillouin-zone-averaged energy bandgap ($\langle E_c \rangle$);

selecting a material from:

| Material | $\langle E_g \rangle$ (eV) | $\langle E_c \rangle$ (eV) |
|---|---|---|
| Si | 1.17 | 2.09 |
| Ge | 0.74 | 0.97 |
| BN | 5.81 | 8.96 |
| BP | 2.04 | 3.34 |
| BAs | 1.55 | 2.72 |
| AlN | 4.54 | 6.52 |
| GaN | 3.25 | 4.79 |
| AlP | 2.50 | 3.24 |
| AlAs | 2.23 | 2.41 |
| AlSb | 1.68 | 2.09 |
| GaP | 2.39 | 2.58 |
| GaAs | 1.52 | 1.77 |
| GaSb | 0.80 | 0.99 |
| InP | 1.42 | 2.09 |
| InAs | 0.41 | 1.51 |
| InSb | 0.23 | 1.03 |
| $Al_{.5}Ga_{.5}As$ | 2.09 | 2.01 |
| $In_{.53}Ga_{.47}As$ | 0.81 | 1.68 |
| ZnS | 3.80 | 4.65 |
| ZnSe | 2.96 | 3.78 |
| ZnTe | 2.71 | 2.97 |
| CdS | 2.55 | 4.30 |
| CdSe | 1.90 | 3.56 |

-continued

| Material | $\langle E_g \rangle$ (eV) | $\langle E_c \rangle$ (eV) |
|---|---|---|
| CdTe | 1.92 | 2.78 |
| HgTe | 0.00 | 1.49 | and fabricating said device using said selected material under strain such that the strain causes the material to have a value $\langle E_c \rangle$ equal to the selected value of $\langle E_c \rangle$.

9. A method of fabricating a semiconductor structure device according to claim 8 wherein the device is selected from the group consisting essentially of field effect transistors, bipolar transistors, avalanche photodiodes and impact ionisation avalanche transit time diodes.

10. A method of fabricating a semiconductor structure device with a predetermined architecture and functionality, comprising determining whether a material has a high enough avalanche breakdown voltage, including determining the value of the breakdown voltage of a material $V_b$, comprising:

plotting points on a graph of $V_b$ against $\langle E_c \rangle$ using data selected from the following:

| Material | $\langle E_c \rangle$ (eV) | $V_b$ (V) |
|---|---|---|
| Si | 1.85 | 34.3 |
| Ge | 0.97 | 19.7 |
| GaP | 2.58 | 61.4 |
| InP | 2.09 | 46.5 |
| GaAs | 1.77 | 33.6 |
| $Ga_{0.47}In_{0.53}As$ | 1.65 | 33.2 |
| $Al_{0.48}In_{0.52}As$ | 1.96 | 46.5 |
| $GaAs_{0.88}Sb_{0.12}$ | 1.68 | 26.5 |
| $Al_{0.06}Ga_{0.94}Sb$ | 1.06 | 22.0 |
| $Al_{0.28}Ga_{0.72}Sb$ | 1.30 | 25.2 |
| GaAs | 1.77 | 33.6 |
| $Al_{0.15}Ga_{0.85}As$ | 1.87 | 38.9 |
| $Al_{0.3}Ga_{0.7}As$ | 1.96 | 44.5 |
| $Al_{0.4}Ga_{0.6}As$ | 2.03 | 49.0 |
| $Al_{0.5}Ga_{0.5}As$ | 2.09 | 52.4 |
| $Al_{0.6}Ga_{0.4}As$ | 2.15 | 56.2 |
| $Ga_{0.52}In_{0.48}P$ | 2.34 | 61.7 |
| $(Al_{0.24}Ga_{0.76})_{0.52}In_{0.48}P$ | 2.43 | 65.3 |
| $(Al_{0.50}Ga_{0.50})_{0.52}In_{0.48}P$ | 2.52 | 69.2 |
| $(Al_{0.75}Ga_{0.25})_{0.52}In_{0.48}P$ | 2.61 | 72.3 |
| $Al_{0.52}In_{0.48}P$ | 2.70 | 76.0 | fitting a line to the points on the graph in the region about the value of $\langle E_c \rangle$ for the material with the equation $$\langle E_c \rangle = \frac{(V_b + m)}{n}$$

determining the values of m and n from the fitted line and determining the value $V_b$ using $\langle E_c \rangle$, m and n in said equation; and in dependence upon the value of $V_b$ fabricating said device using said material.

11. A method fabricating a semiconductor structure device according to claim 10 wherein the device is selected from the group consisting essentially of field effect transistors, bipolar transistors, avalanche photodiodes and impact ionisation avalanche transit time diodes.

12. A method of fabricating a FET comprising a source region, a drain region, a conductive channel extending between the source and drain regions and a gate for controlling conduction in the channel, comprising:

determining a relationship between the Brillouin-zone-averaged energy bandgap ($\langle E_c \rangle$) and the breakdown characteristic for the channel;

selecting a breakdown characteristic for the channel;

determining a value of Brillouin-zone-averaged energy bandgap ($\langle E_c \rangle$) for the channel corresponding to the selected breakdown characteristic, by using a relationship between $\langle E_c \rangle$ and the breakdown characteristic for the FET;

selecting from predetermined data relating to different material compositions and configurations and their corresponding values of $\langle E_c \rangle$, a material corresponding to said selected value of $\langle E_c \rangle$; and fabricating the channel from the selected material.

13. A method of fabricating a FET according to claim 12 wherein the selecting of said breakdown characteristic comprises dividing the channel into two or more parts and for each part of the channel, determining a value of $\langle E_c \rangle$, selecting a corresponding material and fabricating the channel.

14. A method of fabricating a FET according to claim 12 wherein the fabricating of the channel comprises arranging $In_xGa_{1-x}As$ and $In_yGa_{1-y}As$ adjacently on a substrate, where $x \neq y$.

15. A method of fabricating a FET according to claim 12 wherein the selecting of the material comprises choosing spatially compositionally graded material and wherein the fabricating of the channel includes spatially compositionally grading the material.

16. A method of fabricating a PET according to claim 12 wherein the fabricating of the channel comprises arranging $In_xGa_{1-x}As$ on a substrate with a graded indium content, x.

17. A method of fabricating a FET according to claim 12 wherein the fabricating of the channel includes inducing strain in the channel region.

18. A method of fabricating a FET according to claim 12 wherein the fabricating of the channel comprises growing a plurality of layer with successively larger values of $\langle E_c \rangle$ and arranging the gate on a surface perpendicular to the growth interface.

19. A method of fabricating a bipolar transistor comprising an emitter region of extrinsic semiconductor material of a first charge type, a collector region of extrinsic semiconductor material of the first charge type and base region of semiconductor material of a second charge type disposed between the emitter and collector regions, the method comprising:

determining a relationship between the Brillouin-zone-averaged energy bandgap ($\langle E_c \rangle$) and the breakdown characteristics for the emitter, base and collector regions;

selecting breakdown characteristics for the emitter, base and collector regions;

determining a value of Brillouin-zone-averaged energy bandgap ($\langle E_c \rangle$) for each of the emitter, base and collector regions corresponding to selected breakdown characteristics, by using a relationship between $\langle E_c \rangle$ and breakdown characteristics for the emitter, base and collector regions;

selecting from predetermined data relating to different material compositions and configurations and their corresponding values of $\langle E_c \rangle$, materials corresponding to said selected values of $\langle E_c \rangle$; and fabricating the emitter, base and collector regions from the selected materials.

20. A method of fabricating a bipolar transistor according to claim 19 wherein the fabricating of the emitter region comprises depositing n-type AlGaAs.

21. A method of fabricating a bipolar transistor according to claim 19 wherein the fabricating of the emitter region comprises depositing n-type GaInP.

22. A method of fabricating a bipolar transistor according to claim 19 wherein the fabricating of the base region comprises depositing p-type GaAs.

23. A method of fabricating a bipolar transistor according to claim 19 wherein the fabricating of the base region comprises depositing p-type AlGaAs.

24. A method of fabricating a bipolar transistor according to claim 19 wherein the fabricating of the base region comprises depositing p-type InGaAs.

25. A method of fabricating a bipolar transistor according to claim 19 wherein the fabricating of the collector region comprises depositing n-type GaInP.

26. A method of fabricating a bipolar transistor according to claim 19 wherein the fabricating of the collector region comprises depositing n-type InGas.

27. A method of fabricating a bipolar transistor according to claim 19 wherein the fabricating of the emitter region comprises depositing n-type InP.

28. A method of fabricating a bipolar transistor according to claim 19 wherein the fabricating of the emitter region comprises depositing n-type AlInAs.

29. A method of fabricating a bipolar transistor according to claim 19 wherein the fabricating of the base region comprises depositing p-type InGaAs.

30. A method of fabricating a bipolar transistor according to claim 19 wherein the fabricating of the collector region comprises depositing n-type InGaAs.

31. A method of fabricating a bipolar transistor according to claim 19 wherein the fabricating of the collector region comprises depositing n-type InP.

32. A method of fabricating a bipolar transistor according to claim 19 wherein the fabricating of the collector region comprises depositing n-type AlInAs.

33. A method of fabricating a bipolar transistor according to claim 19 wherein the fabricating of the collector region comprises depositing n-type AlInAs.

34. A method of fabricating a bipolar transistor according to claim 19 wherein the fabricating of the collector region comprises depositing n-type AlPsb.

35. A method of fabricating a bipolar transistor according to claim 19 wherein the fabricating of the collector region comprises depositing n-type InGaAs graded to Al InAs or InP.

36. A method of fabricating an avalanche photodiode comprising an absorption region of a semiconductor material of a p-type disposed adjacently to a multiplication region of undoped semiconductor material, the method comprising:
  determining a relationship between the Brillouin-zone-averaged energy bandgap ($<E_c>$) and the breakdown characteristics for the absorption and multiplication regions;
  selecting breakdown characteristics for the absorption and multiplication regions;
  determining a value of Brillouin-zone-averaged energy bandgap ($<E_c>$) for each of the absorption and multiplication regions corresponding to selected breakdown characteristics, by using a relationship between $<E_c>$ and breakdown characteristics for the absorption and multiplication regions;
  selecting from predetermined data relating to different material compositions and configurations and their corresponding values of $<E_c>$, materials corresponding to said selected values of $<E_c>$; and
  fabricating the absorption and multiplication regions from the selected materials.

37. A method of fabricating a multiple quantum well avalanche photodiode comprising a plurality of absorption regions interleaved with multiplication regions, the method comprising:
  determining a relationship between the Brillouin-zone-averaged energy bandgap ($<E_c>$) and the breakdown characteristics for the absorption and multiplication regions;
  selecting breakdown characteristics for the absorption and multiplication regions;
  determining a value of Brillouin-zone-averaged energy bandgap ($<E_c>$) for each of the absorption and multiplication regions corresponding to selected breakdown characteristics, by using a relationship between $<E_c>$ and breakdown characteristics for the absorption and multiplication regions;
  selecting from predetermined data relating to different material compositions and configurations and their corresponding values of $<E_c>$, material corresponding to said selected values of $<E_c>$; and
  fabricating the absorption and multiplication regions from the selected materials.

38. A method of fabricating a multiple quantum well avalanche photodiode according to claim 37 wherein the fabricating of the absorption and multiplication region comprises depositing alternate layers of $In_xGa_{1-x}As$ and GaAs.

39. A method of fabricating a multiple quantum well avalanche photodiode comprising a superlattice absorption region disposed adjacently to a multiplication region of undoped semiconductor material, the method comprising:
  determining a relationship between the Brillouin-zone-averaged energy bandgap ($<E_c>$) and the breakdown characteristics for the superlattice absorption region and multiplication region;
  selecting breakdown characteristics for the absorption and multiplication regions;
  determining a value of Brillouin-zone-averaged energy bandgap ($<E_c>$) for each of the absorption and multiplication regions corresponding to selected breakdown characteristics, by using a relationship between $<E_c>$ and breakdown characteristics for the absorber and multiplication regions;
  selecting from predetermined data relating to different material compositions and configurations and their corresponding values of $<E_c>$, materials corresponding to said selected values of $<E_c>$; and
  fabricating the absorption and multiplication regions from the selected materials.

40. A method of fabricating a multiple quantum well avalanche photodiode according to claim 39 wherein the fabricating of the absorption region comprises depositing alternate layers of $In_xGa_{1-x}As$ and GaAs and wherein the fabricating of the multiplication region comprises depositing GaAs.

41. A method of fabricating a multiple quantum well avalanche photodiode according to claim 39 wherein the fabricating of the absorption region comprises depositing alternate layers of $In_xGa_{1-x}As$ and GaAs and wherein the fabricating of the multiplication region comprises depositing GaAs.

42. A method of fabricating a multiple quantum well avalanche photodiode according to claim 39 wherein the fabricating of the absorption region comprises depositing alternate layers of $In_xGa_{1-x}As$ and AlGaAs and wherein the fabricating of the multiplication region comprises depositing GaAs.

43. A method of fabricating an impact ionisation avalanche transit-time (IMPATT) diode comprising an avalanche region and a drift region, the method comprising:

determining a relationship between the Brillouin-zone-averaged energy bandgap ($<E_c>$) and the breakdown characteristics for the avalanche and drift regions;

selecting breakdown characteristics for the avalanche and drift regions;

determining a value of Brillouin-zone-averaged energy bandgap ($<E_c>$) for each of the absorption and multiplication regions corresponding to selected breakdown characteristics, by using a relationship between $<E_c>$ and breakdown characteristics for the avalanche and drift regions;

selecting from predetermined data relating to different material compositions and configurations and their corresponding values of $<E_c>$, materials corresponding to said selected values of $<E_c>$; and fabricating the avalanche and drift regions from the selected materials.

44. A method of fabricating an IMPATT diode according to claim 43 wherein the fabricating of the avalanche region comprises depositing alternate layers of $In_xGa_{1-x}As$ and GaAs and wherein the fabricating of the drift region comprises depositing GaAs.

45. A method of fabricating an IMPATT diode according to claim 43 wherein the fabricating of the avalanche region comprises depositing $Ga_yIn_{1-y}P$ wherein the fabricating of the drift region comprises depositing GaAs.

46. A method of fabricating an IMPATT diode according to claim 43 wherein the fabricating of the avalanche region comprises depositing InP and wherein the fabricating of the drift region comprises depositing $In_xGa_{1-x}As$.

47. A method of fabricating an IMPATT diode according to claim 43 wherein the fabricating of the avalanche region comprises depositing $Al_zSb_{1-z}$ and wherein the fabricating of the drift region comprises depositing $In_xGa_{1-x}As$.

48. A method of improving an operational characteristic of a semiconductor charge transfer device, comprising:

identifying one or more regions of the device in which the charge transfer characteristic, dependent on impact ionisation or avalanche breakdown, is degraded;

replacing each of said one or more regions with a semiconductor region in which values of Eg and $<E_c>$ are selected so as to improve the charge characteristic.

* * * * *